United States Patent
Tanaka et al.

(10) Patent No.: US 10,825,991 B2
(45) Date of Patent: Nov. 3, 2020

(54) COMPOSITION AND LIGHT EMITTING DEVICE USING THE SAME

(71) Applicant: Sumitomo Chemical Company, Limited, Tokyo (JP)

(72) Inventors: Shin-Ya Tanaka, Tsukuba (JP); Ryuji Matsumoto, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 140 days.

(21) Appl. No.: 15/305,051

(22) PCT Filed: Apr. 10, 2015

(86) PCT No.: PCT/JP2015/061769
§ 371 (c)(1),
(2) Date: Oct. 18, 2016

(87) PCT Pub. No.: WO2015/163241
PCT Pub. Date: Oct. 29, 2015

(65) Prior Publication Data
US 2017/0186959 A1 Jun. 29, 2017

(30) Foreign Application Priority Data
Apr. 23, 2014 (JP) .................. 2014-088855

(51) Int. Cl.
*H01L 51/50* (2006.01)
*H01L 51/00* (2006.01)
(Continued)

(52) U.S. Cl.
CPC .......... *H01L 51/0039* (2013.01); *C08G 61/02* (2013.01); *C08G 61/12* (2013.01);
(Continued)

(58) Field of Classification Search
CPC ............. H01L 51/0039; H01L 51/0043; H01L 51/0084; H01L 51/0085; H01L 51/0086;
(Continued)

(56) References Cited

U.S. PATENT DOCUMENTS 5,747,206 A 5/1998 Agata et al.
6,169,163 B1 1/2001 Woo et al.
(Continued)

FOREIGN PATENT DOCUMENTS

| CN | 102838442 A | 12/2012 |
|---|---|---|
| CN | 102959758 A | 3/2013 |

(Continued)

OTHER PUBLICATIONS

Suzuki et al., "High-Efficiency White Phosphorescent Polymer Light-Emitting Devices", IEEE Journal of Selected Topics in Quantum Electronics, vol. 10 (2004) pp. 115-119. (Year: 2004).*
(Continued)

*Primary Examiner* — Dylan C Kershner
(74) *Attorney, Agent, or Firm* — Panitch Schwarze Belisario & Nadel LLP

(57) ABSTRACT

A composition is provided containing a phosphorescent compound and a polymer compound having a constitutional unit represented by the formula (Y):

$$+Ar^{Y1}+ \quad (Y)$$

wherein $Ar^{Y1}$ represents an arylene group, a divalent heterocyclic group or the like; and at least one constitutional unit selected from the constitutional units represented by the formulas (Ia) to (Id):

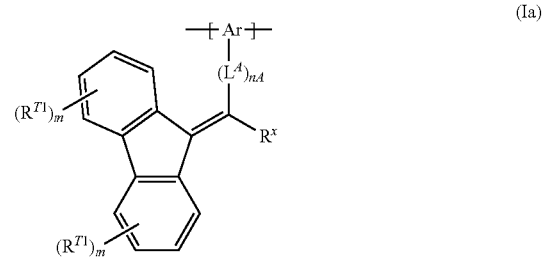

(Ia)

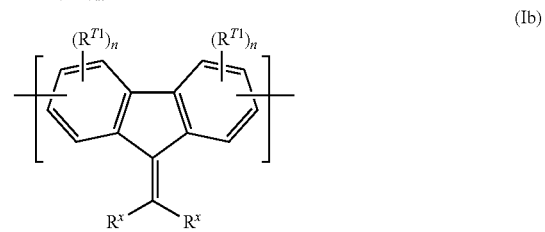

(Ib)

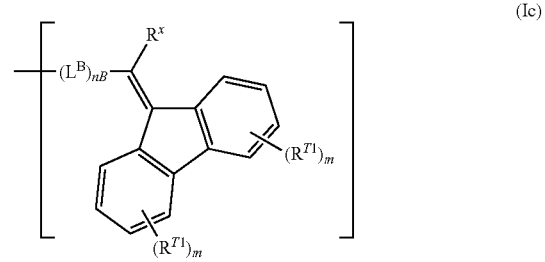

(Ic)

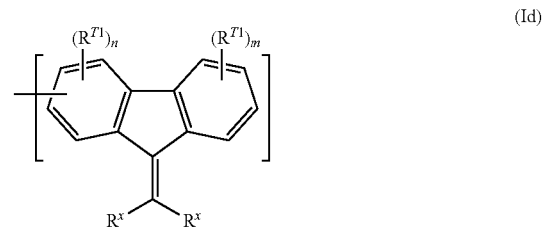

(Id)

wherein m represents an integer of 0 to 4, n represents an integer of 0 to 3, $R^{T1}$ represents an alkyl group, an alkoxy
(Continued)

group, an aryl group, a monovalent heterocyclic group or the like, $R^x$ represents a hydrogen atom, an alkyl group, an alkoxy group, an aryl group, a monovalent heterocyclic group or the like, Ar represents an aromatic hydrocarbon group or a heterocyclic group, nA and nB represent an integer of 0 to 3, and $L^A$ and $L^B$ represent an alkylene group, a cycloalkylene group, an arylene group or a divalent heterocyclic group.

10 Claims, No Drawings

(51) Int. Cl.

| | | |
|---|---|---|
| C09K 11/06 | (2006.01) | |
| C08K 5/56 | (2006.01) | |
| C08L 65/00 | (2006.01) | |
| C08G 61/12 | (2006.01) | |
| C08G 61/02 | (2006.01) | |

(52) U.S. Cl.
CPC ............. C08G 61/122 (2013.01); C08K 5/56 (2013.01); C08L 65/00 (2013.01); C09K 11/06 (2013.01); H01L 51/0003 (2013.01); H01L 51/0035 (2013.01); H01L 51/0043 (2013.01); H01L 51/0085 (2013.01); H01L 51/0086 (2013.01); H01L 51/50 (2013.01); C08G 2261/12 (2013.01); C08G 2261/148 (2013.01); C08G 2261/1412 (2013.01); C08G 2261/312 (2013.01); C08G 2261/3142 (2013.01); C08G 2261/3162 (2013.01); C08G 2261/3221 (2013.01); C08G 2261/411 (2013.01); C08G 2261/5242 (2013.01); C08G 2261/95 (2013.01); C09K 2211/1416 (2013.01); C09K 2211/1433 (2013.01); C09K 2211/1466 (2013.01); C09K 2211/185 (2013.01); H01L 51/5016 (2013.01)

(58) Field of Classification Search
CPC ..... H01L 51/50; H01L 51/0035; C09K 11/06; C09K 2211/1416; C09K 2211/1433; C09K 2211/1466; C09K 2211/185; C08G 61/02; C08G 61/12; C08G 61/122; C08K 5/56; C08L 65/00
USPC .................... 428/690, 691, 917; 427/58, 66; 313/500–512; 257/40, 88–104; 257/E51.001–E51.052; 252/301.16–301.35
See application file for complete search history.

(56) References Cited

U.S. PATENT DOCUMENTS

| | | | | |
|---|---|---|---|---|
| 2002/0182441 A1* | 12/2002 | Lamansky | .......... | C07F 15/0033 |
| | | | | 428/690 |
| 2003/0067267 A1 | 4/2003 | Heeney et al. | | |
| 2003/0091862 A1* | 5/2003 | Tokito | ................ | C08G 61/02 |
| | | | | 428/690 |
| 2004/0176560 A1 | 9/2004 | Heeney et al. | | |
| 2006/0280964 A1* | 12/2006 | Liu | ..................... | C09K 11/06 |
| | | | | 428/690 |
| 2007/0145886 A1* | 6/2007 | Aziz | ............... | H01L 51/5012 |
| | | | | 313/504 |
| 2007/0213503 A1 | 9/2007 | Sasaki et al. | | |
| 2014/0039148 A1* | 2/2014 | Pillow | ................. | C08G 61/02 |
| | | | | 528/205 |

FOREIGN PATENT DOCUMENTS

| | | | |
|---|---|---|---|
| JP | H09114120 | A | 5/1997 |
| JP | H11510535 | A | 9/1999 |
| JP | 2004339193 | A | 12/2004 |
| JP | 2007224026 | A | 9/2007 |
| JP | 2007270123 | A | 10/2007 |
| JP | 2008227417 | A | 9/2008 |
| JP | 2009256594 | A | 11/2009 |
| JP | 2010235610 | A | 10/2010 |
| JP | 2012036388 | A | 2/2012 |
| JP | 2013133359 | A | 7/2013 |
| JP | 2014001349 | A | 1/2014 |
| JP | 2014003247 | A | 1/2014 |
| JP | 2014506609 | A | 3/2014 |
| TW | 201211203 | A | 3/2012 |
| WO | 9705184 | A1 | 2/1997 |
| WO | 2011161417 | A1 | 12/2011 |
| WO | WO-2011161417 | A1 * | 12/2011 ........... C07C 13/567 |
| WO | 2012104579 | A1 | 8/2012 |
| WO | WO-2013108894 | A1 * | 7/2013 ............. C07C 13/28 |

OTHER PUBLICATIONS

Goya et al., machine translation of WO 2013/108894 A1, 2013, pp. 1-46. (Year: 2013).*
Tokito et al., "Improvement of emission efficiency in polymer light-emitting devicesbased on phosphorescent polymers", Thin Solid Films, vol. 445 (2003) pp. 353-357. (Year: 2003).*
Int'l Search Report dated Jul. 21, 2015 in Int'l Application No. PCT/JP2015/061769.
Int'l Preliminary Report on Patentability dated Oct. 25, 2016 in Int'l Application No. PCT/JP2015/061769.
Yu et al, "Synthesis and Light Emitting Properties of Poly[9-(4'-Tert-Butyl-Phenylenemethene)-Fluoroene-Co-9,9-Dioctylfluorene]," Journal of Materials Science, vol. 42, pp. 1325-1329 (2007).
Yu et al, "Synthesis, Characterization, and Optoelectronic Properties of Two New Polyfluorenes/Poly(p-Phenylenevinylene)s Copolymers," Journal of Applied Polymer Science, vol. 102, pp. 3955-3962 (2006).
Office Action dated Nov. 29, 2017 in CN Application No. 201580020802.1.
Office Action dated Aug. 1, 2018 in CN Application No. 201580020802.1.
Office Action dated Aug. 23, 2018 in TW Application No. 104112670.
Office Action dated Mar. 26, 2019 in JP Application No. 2016-514894.

* cited by examiner

COMPOSITION AND LIGHT EMITTING DEVICE USING THE SAME

CROSS-REFERENCE TO RELATED APPLICATION

This application is a Section 371 of International Application No. PCT/JP2015/061769, filed Apr. 10, 2015, which was published in the Japanese language on Oct. 29, 2015, under International Publication No. WO 2015/163241 A1, and the disclosure of which is incorporated herein by reference.

TECHNICAL FIELD

The present invention relates to a composition and a light emitting device using the same.

BACKGROUND ART

Light emitting devices such as an organic electroluminescent device (organic EL device) can be suitably used for applications such as displays and the like because of properties such as high light emission efficiency and low voltage driving, and are recently attracting attention. This light emitting device has organic layers such as a light emitting layer and a charge transporting layer. Polymer compounds used for production of a light emitting device are investigated because by use of a polymer compound, an organic layer can be formed by application methods typified by an inkjet printing method.

As the material used in a light emitting layer of a light emitting device, fox example, a composition comprising a polymer compound comprising a fluorene constitutional unit and a constitutional unit having a triazine structure and a phosphorescent compound is proposed (Patent document 1). This polymer compound is a polymer compound not comprising constitutional units represented by the formulae (Ia) to (Id) described below.

PRIOR ART DOCUMENT

Patent Document

Patent document 1: JP-A No. 2012-036388

SUMMARY OF THE INVENTION

Problems to be Solved by the Invention

A light emitting device produced by using the above-described composition, however, did not have necessarily sufficient luminance life.

Then, the present invention has an object of providing a composition and a polymer compound which are useful for production of a light emitting device excellent in luminance life. Further, the present invention has an object of providing a light emitting device produced by using the composition or the polymer compound.

Means for Solving the Problems

In a first aspect, the present invention provides a composition comprising a polymer compound comprising a constitutional unit represented by the following formula (Y) and at least one constitutional unit selected from the group consisting of a constitutional unit represented by the following formula (Ia), a constitutional unit represented by the following formula (Ib), a constitutional unit represented by the following formula (Ic) and a constitutional unit represented by the following formula (Id), and a phosphorescent compound:

(Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.]

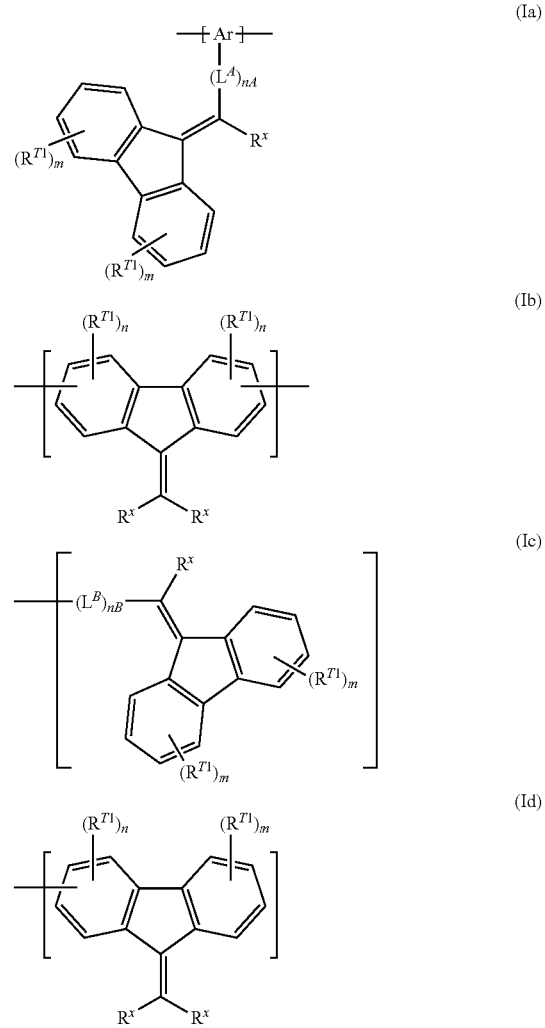

[wherein, m represents an integer of 0 to 4. The plurality of m may be the same or different.

n represents an integer of 0 to 3. The plurality of n may be the same or different.

$R^{T1}$ represents an alkyl group, a cycloalkyl group, an alkoxy group, a cycloalkoxy group, an aryl group or a monovalent heterocyclic group, and these groups each optionally have a substituent. When a plurality of $R^{T1}$ are present, they may be the same or different.

$R^x$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^X$ may be the same or different and may be combined together to form a ring together with the carbon atoms to which they are attached.

Ar represents an aromatic hydrocarbon group or a heterocyclic group, and these groups each optionally have a substituent.

nA represents an integer of 0 to 3.

$L^A$ represents an alkylene group, a cycloalkylene group, an arylene group or a divalent heterocyclic group, and these groups each optionally have a substituent. When a plurality of $L^A$ are present, they may be the same or different.

nB represents an integer of 0 to 3.

$L^B$ represents an alkylene group, a cycloalkylene group, an arylene group or a divalent heterocyclic group, and these groups each optionally have a substituent. When a plurality of $L^A$ are present, they may be the same or different.].

In a second aspect, the present invention provides a polymer compound comprising a constitutional unit represented by the above-described formula (Y), at least one constitutional unit selected from the group consisting of a constitutional unit represented by the above-described formula (Ia), a constitutional unit represented by the above-described formula (Ib), a constitutional unit represented by the above-described formula (Ic) and a constitutional unit represented by the above-described formula (Id), and a phosphorescent constitutional unit having a group obtained by removing one or more hydrogen atoms bonding directly to carbon atoms or hetero atoms constituting a phosphorescent compound represented by the following formula (1):

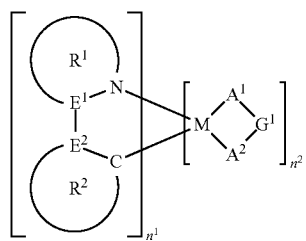

(1)

[wherein,

M represents a ruthenium atom, a rhodium atom, a palladium atom, an iridium atom or a platinum atom.

$n^1$ represents an integer of 1 or more, $n^2$ represents an integer of 0 or more, and $n^1+n^2$ is 2 or 3. $n^1+n^2$ is 3 when M is a ruthenium atom, a rhodium atom or an iridium atom, while $n^1+n^2$ is 2 when M is a palladium atom or a platinum atom.

$E^1$ and $E^2$ each independently represent a carbon atom or a nitrogen atom. At least one of $E^1$ and $E^2$ is a carbon atom.

The ring $R^1$ represents a 5-membered or 6-membered aromatic heterocyclic ring, and these rings each optionally have a substituent. When a plurality of the substituents are present, they may be the same or different and may be combined together to form a ring together with the atoms to which they are attached. When a plurality of the rings $R^1$ are present, they may be the same or different. $E^1$ is a carbon atom when the ring $R^1$ is a 6-membered aromatic heterocyclic ring.

The ring $R^2$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a zing together with the atoms to which they are attached. When a plurality of the rings $R^2$ are present, they may be the same or different. $E^2$ is a carbon atom when the ring $R^2$ is a 6-membered aromatic heterocyclic ring.

$A^1$-$G^1$-$A^2$ represents an anionic bidentate ligand, $A^1$ and $A^2$ each independently represent a carbon atom, an oxygen atom or a nitrogen atom, and these atoms may be an atom constituting the ring. $G^1$ represents a single bond or an atomic group constituting the bidentate ligand together with $A^1$ and $A^2$. When a plurality of $A^1$-$G^1$-$A^2$ are present, they may be the same or different.].

In a third aspect, the present invention provides a light emitting device produced by using the above-described composition or the above-described polymer compound.

Effect of the Invention

The present invention can provide a composition and a polymer compound which are useful for production of a light emitting device excellent in luminance life. Further, the present invention can provide a light emitting device produced by using the composition or the polymer compound.

MODES FOR CARRYING OUT THE INVENTION

Suitable embodiments of the present invention will be illustrated in detail below.

Explanation of Common Term

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1\times10^3$ to $1\times10^8$.

A polymer compound may be any of a block copolymer, a random copolymer, an alternating copolymer and a graft copolymer, and may also be another embodiment.

An end group of a polymer compound is preferably a stable group because if a polymerization active group remains intact at the end, when the polymer compound is used for fabrication of a light emitting device, the light emitting property or luminance life possibly becomes lower. This end group is preferably a group having a conjugated bond to the main chain, and includes, for example, groups bonding to an aryl group or a monovalent heterocyclic group via a carbon-carbon bond.

"Low molecular weight compound" denotes a compound having no molecular weight distribution and having a molecular weight of $1\times10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-n-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolyl group, an isoquinolyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexenyl group, a 5-hexenyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

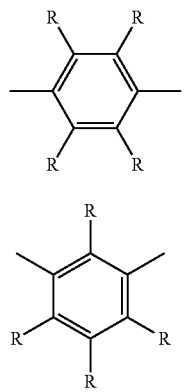

(A-1)

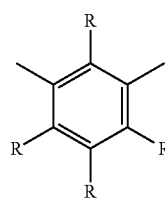

(A-2)

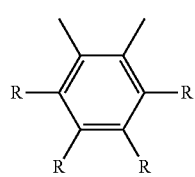

(A-3)

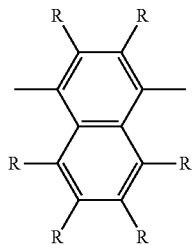

(A-4)

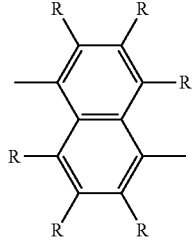

(A-5)

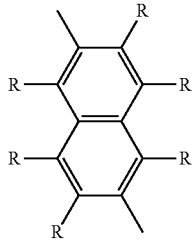

(A-6)

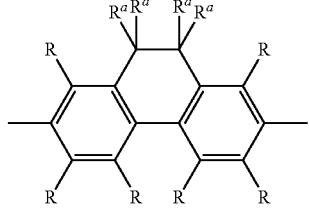

(A-7)

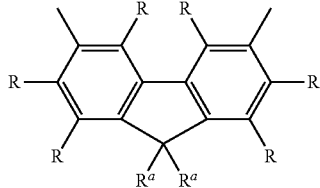

(A-8)

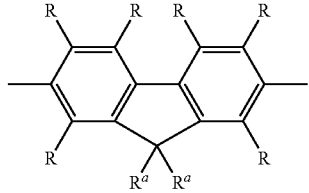

(A-9)

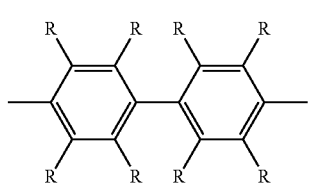

(A-10)

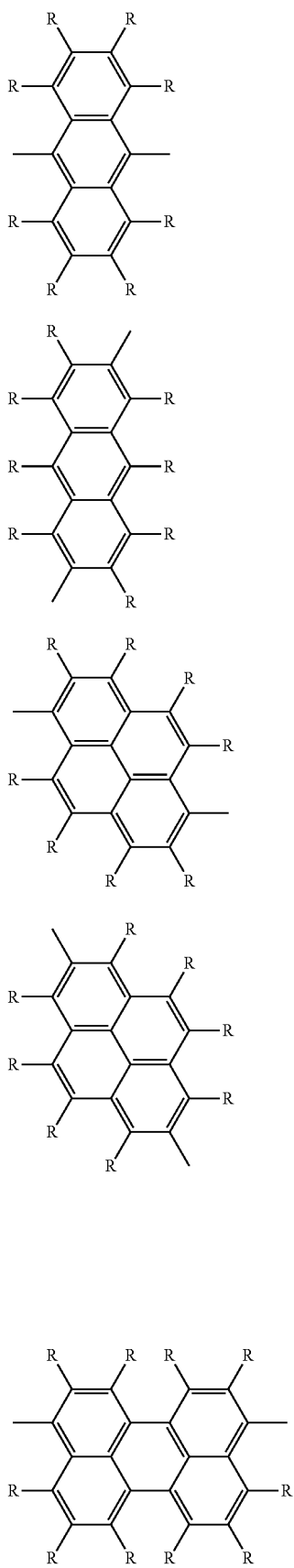
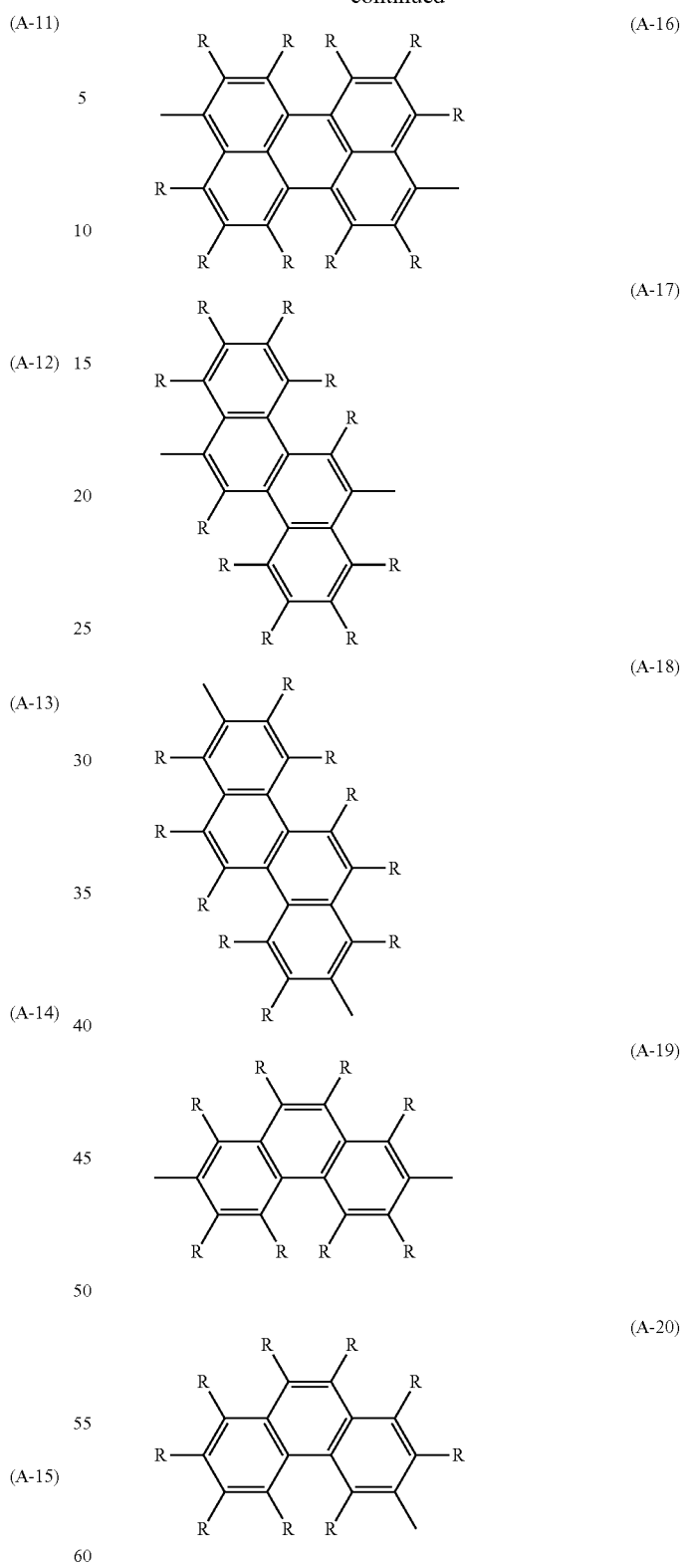
[wherein, R and $R^a$ each independently represent a hydrogen atom, an alkyl group, a cycloalkyl group, an aryl group or a monovalent heterocyclic group. The plurality of R and $R^a$ each may be the same or different, and groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

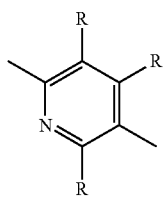
(AA-1)

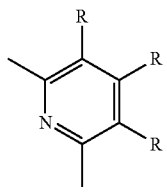
(AA-2)

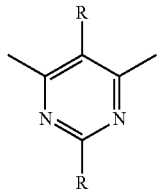
(AA-3)

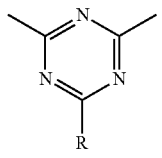
(AA-4)

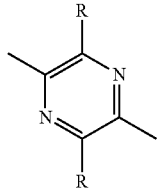
(AA-5)

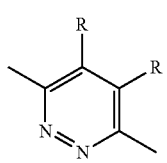
(AA-6)

-continued

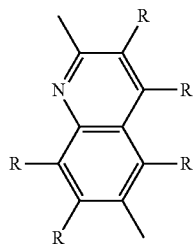
(AA-7)

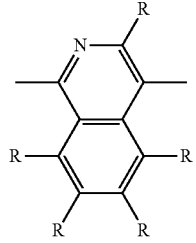
(AA-8)

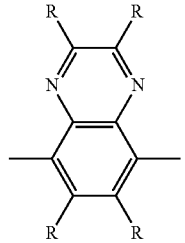
(AA-9)

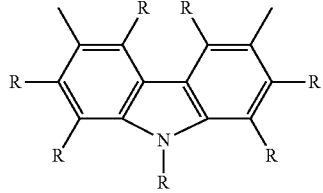
(AA-10)

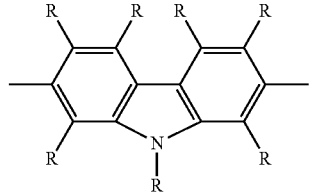
(AA-11)

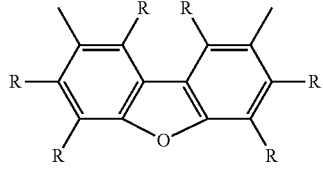
(AA-12)

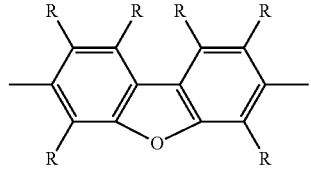
(AA-13)

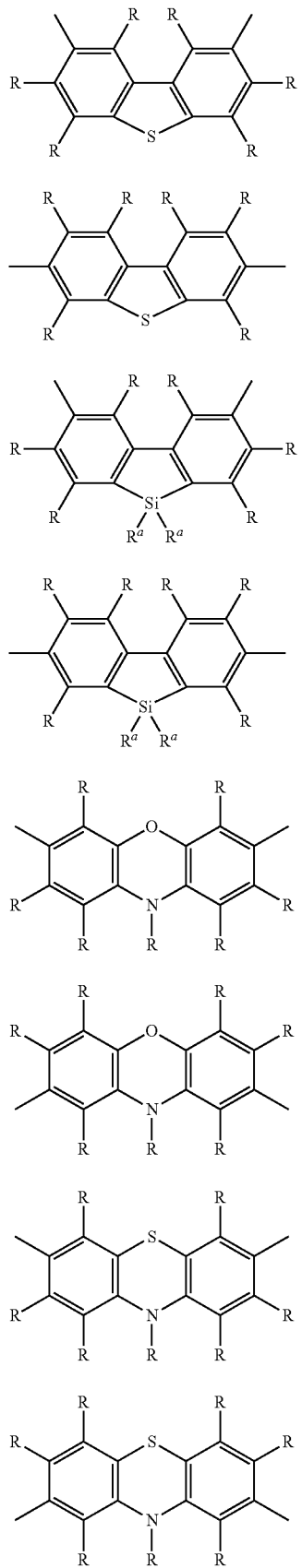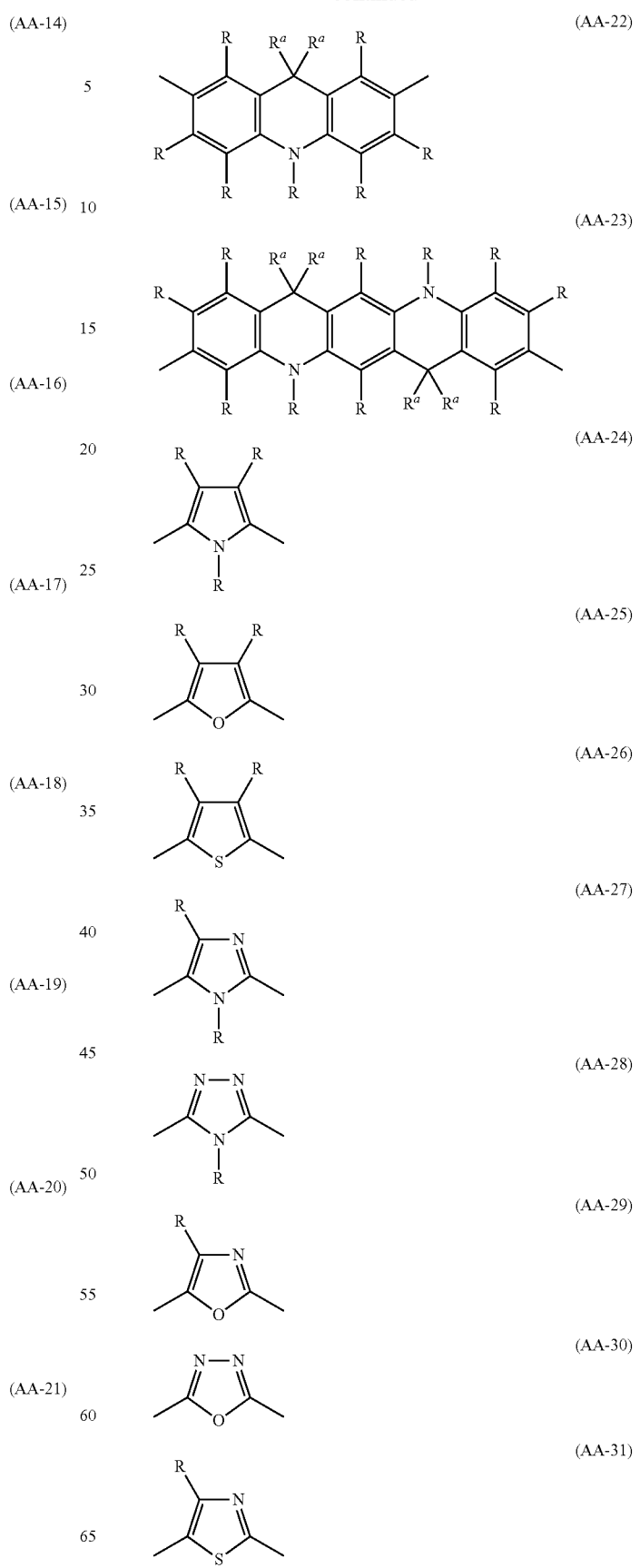

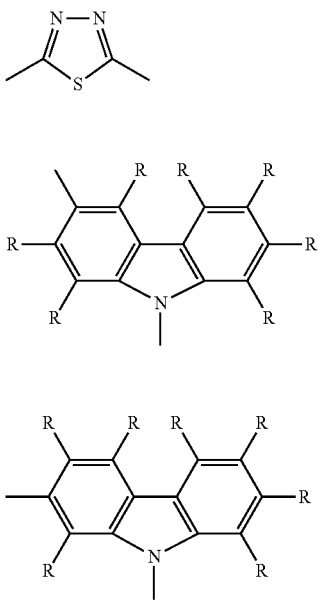

[wherein, R and $R^a$ represent the same meaning as described above.]

"Crosslinkable group" is a group capable of forming a new bond by being subjected to a heating treatment, an ultraviolet irradiation treatment, a radical reaction and the like, and is preferably a group represented by any one of the formulae (B-1) to (B-17). These groups each optionally have a substituent.

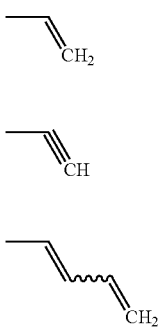

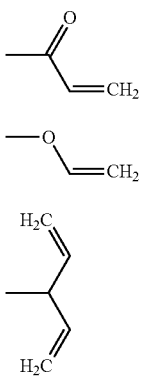

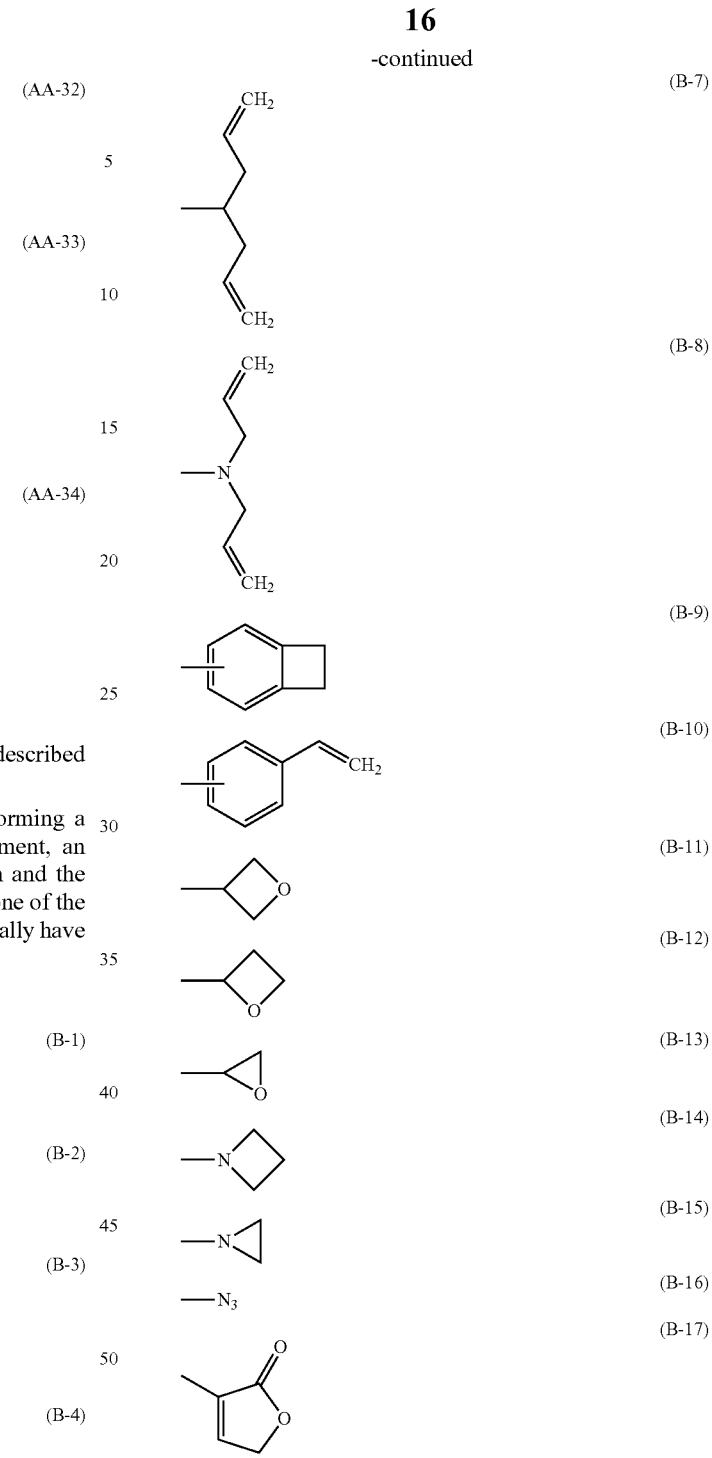

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

"Dendron" is a group having a regular dendritic branched structure having a branching point at an atom or ring (In other word, a dendrimer structure). A compound having a dendron (hereinafter, referred to as "dendrimer".) includes, for example, structures described in International Publication WO 02/067343, JP-A No. 2003-231692, International Publication WO 2003/079736, and International Publication WO 2006/097717.

The dendron is preferably a group represented by the formula (D-A) or (D-B).

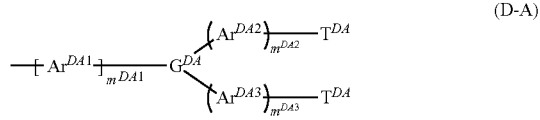
(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and these groups each optionally have a substituent. The plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups each optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$, $m^{DA3}$, $m^{DA4}$, $m^{DA5}$, $m^{DA6}$ and $m^{DA7}$ are usually an integer of 10 or less, preferably an integer of 5 or less, more preferably 0 or 1. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formula (GDA-11) to (GDA-15), and these groups each optionally have a substituent.

(GDA-11)

(GDA-12)

(GDA-13)

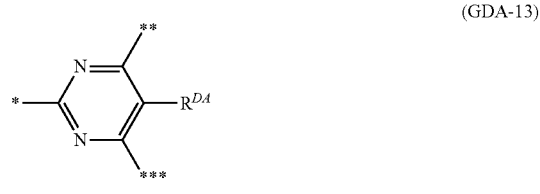
(GDA-14)

(GDA-15)

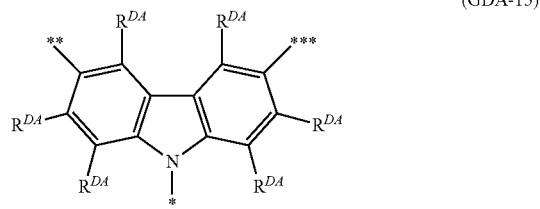

[wherein,

* represents a linkage to $Ar^{DA1}$ in the formula (D-A), $Ar^{DA1}$ in the formula (D-B), $Ar^{DA2}$ in the formula (D-B) or $Ar^{DA3}$ in the formula (D-B).

** represents a linkage to $Ar^{DA2}$ in the formula (D-A), $Ar^{DA2}$ in the formula (D-B), $Ar^{DA4}$ in the formula (D-B) or $Ar^{DA6}$ in the formula (D-B).

*** represents a linkage to $Ar^{DA3}$ in the formula (D-A), $Ar^{DA3}$ in the formula (D-B), $Ar^{DA5}$ in the formula (D-B) or $Ar^{DA7}$ in the formula (D-B).

$R^{DA}$ represents a hydrogen atom, an alkyl group, a cycloalkyl group, an alkoxy group, a cycloalkoxy group, an aryl group or a monovalent heterocyclic group, and these groups each optionally have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

It is preferable that $Ar^{DA1}$, $Ar^{DA2}$, $Ar^{DA3}$, $Ar^{DA4}$, $Ar^{DA5}$, $Ar^{DA6}$ and $Ar^{DA7}$ are groups represented by the formulae (ArDA-1) to (ArDA-3).

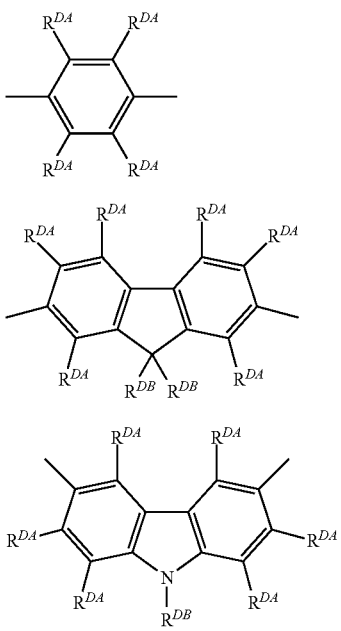

(ArDA-1)

(ArDA-2)

(ArDA-3)

[wherein, $R^{DA}$ represents the same meaning as described above.

$R^{DB}$ represents a hydrogen atom, an alkyl group, a cycloalkyl group, an aryl group or a monovalent heterocyclic group, and these groups each optionally have a substituent. When a plurality of $R^{DB}$ are present, they may be the same or different at each occurrence.]

$R^{DB}$ is preferably an alkyl group, a cycloalkyl group, an aryl group or a monovalent heterocyclic group, more preferably an aryl group or a monovalent heterocyclic group, further preferably an aryl group.

$T^{DA}$ is preferably groups represented by the formulae (TDA-1) to (TDA-3).

(TDA-1)

(TDA-2)

(TDA-3)

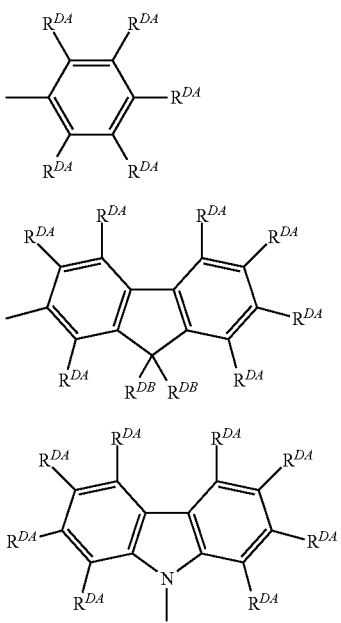

[wherein, $R^{DA}$ and $R^{DB}$ represent the same meaning described above.]

The group represented by the formula (D-A) is preferably a group represented by the formula (D-A1) to (D-A3).

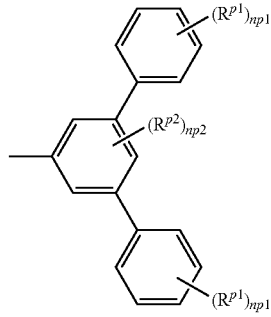

(D-A1)

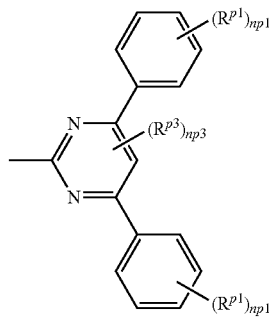

(D-A2)

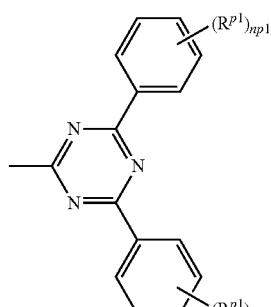

(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.]

The group represented by the formula (D-B) is preferably a group represented by the formula (D-B1) to (D-B3).

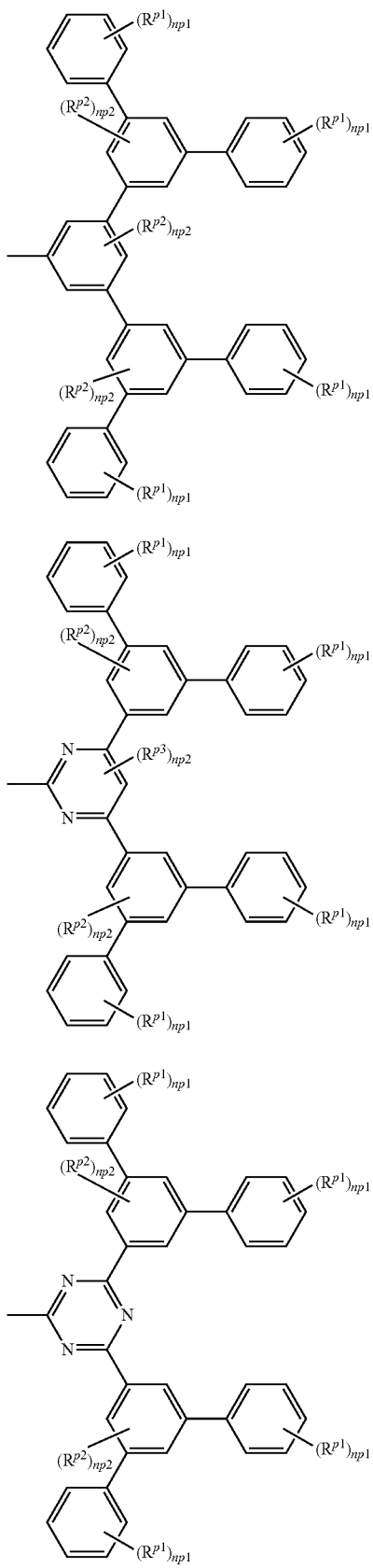

(D-B1)

(D-B2)

(D-B3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. When a plurality of np1 and np2 are present, they may be the same or different at each occurrence.]

np1 is preferably 0 or 1, more preferably 1. np2 is preferably 0 or 1, more preferably 0. np3 is preferably 0.

$R^{p1}$, $R^{p2}$ and $R^{p3}$ are preferably an alkyl group or a cycloalkyl group.

<Polymer Compound>

The polymer compound contained in the composition of the present invention will be illustrated.

The polymer compound contained in the composition of the present invention is a polymer compound comprising a constitutional unit represented by the formula (Y), and at least one constitutional unit selected from the group consisting of a constitutional unit represented by the formula (Ia), a constitutional unit represented by the formula (Ib), a constitutional unit represented by the formula (Ic) and a constitutional unit represented by the formula (Id) (hereinafter, referred to also as "the first polymer compound".).

[Constitutional unit represented by the formula (Y)]

$$\text{\textemdash}Ar^{Y1}\text{\textemdash} \tag{Y}$$

The arylene group represented by $Ar^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by $Ar^{Y1}$ is more preferably a group represented by the formula (AA-1) to (AA-4), the formula (AA-10) to (AA-15), the formula (AA-18) to (AA-21), the formula (AA-33) or the formula (AA-34), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

"The divalent group in which at least one arylene group and at least one divalent heterocyclic group are bonded directly to each other" includes, for example, groups represented by the following formulae, and each of them optionally has a substituent.

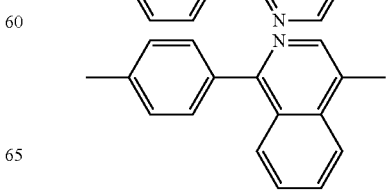

-continued

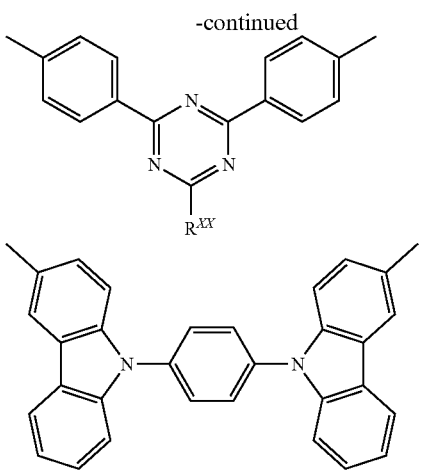

[wherein, $R^{XX}$ represents a hydrogen atom, an alkyl group, a cycloalkyl group, an aryl group or a monovalent heterocyclic group and these groups each optionally have a substituent.]

$R^{XX}$ is preferably an alkyl group, a cycloalkyl group or an aryl group, and these groups each optionally have a substituent.

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of light emission efficiency of a light emitting device produced by using the composition of the present invention preferable are constitutional units represented by the formulae (Y-1) to (Y-3), from the standpoint of electron transportability of a light emitting device produced by using the composition of the present invention preferable are constitutional units represented by the formulae (Y-4) to (Y-7), and from the standpoint of hole transportability of a light emitting device produced by using the composition of the present invention preferable are constitutional units represented by the formulae (Y-8) to (Y-10), and from the standpoint of luminance life of a light emitting device produced by using the composition of the present invention preferable are constitutional units represented by the formulae (Y-1) to (Y-4).

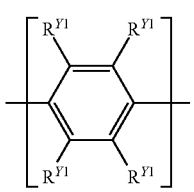
(Y-1)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent groups $R^{Y1}$ may be combined together to form a ring together with the carbon atoms to which they are attached.]

$R^{Y1}$ is preferably a hydrogen atom, an alkyl group, a cycloalkyl group or an aryl group, and these groups each optionally have a substituent.

The constitutional unit represented by the formula (Y-1) is preferably a constitutional unit represented by the formula (Y-1′).

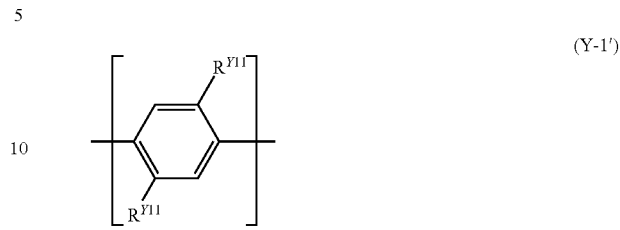
(Y-1′)

[wherein, $R^{Y11}$ represents an alkyl group, a cycloalkyl group, an alkoxy group, a cycloalkoxy group, an aryl group or a monovalent heterocyclic group, and these groups each optionally have a substituent. The plurality of $R^{Y11}$ may be the same or different.]

$R^{Y11}$ is preferably an alkyl group, a cycloalkyl group or an aryl group, more preferably an alkyl group or a cycloalkyl group, and these groups each optionally have a substituent.

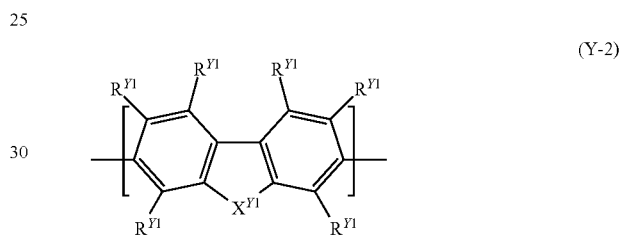
(Y-2)

[wherein, $R^{Y1}$ represents the same meaning as described above.

$X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y2}$ may be the same or different, and groups $R^{Y2}$ may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by —C($R^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), and these groups each optionally have a substituent.

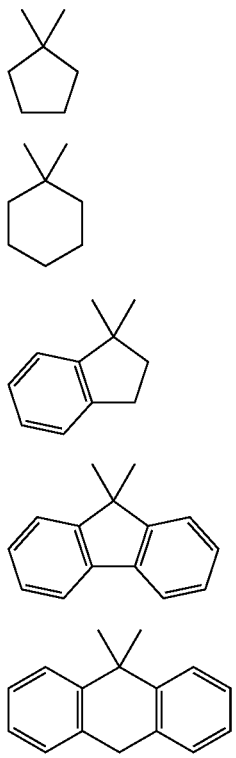

(Y-A1)
(Y-A2)
(Y-A3)
(Y-A4)
(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

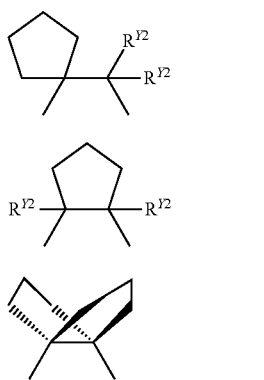

(Y-B1)
(Y-B2)
(Y-B3)

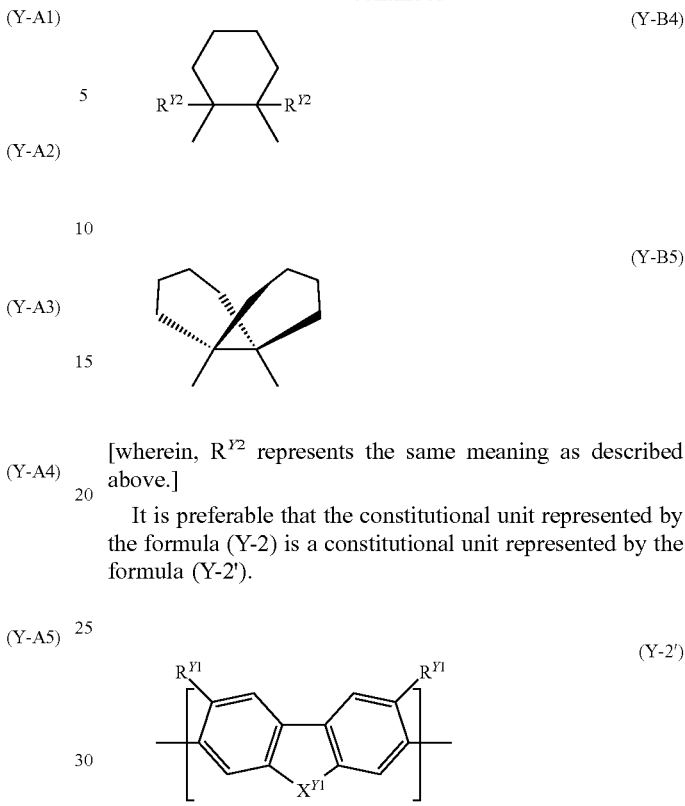

(Y-B4)
(Y-B5)

[wherein, $R^{Y2}$ represents the same meaning as described above.]

It is preferable that the constitutional unit represented by the formula (Y-2) is a constitutional unit represented by the formula (Y-2').

(Y-2')

[wherein, $R^{Y1}$ and $X^{Y1}$ represent the same meaning as described above.]

(Y-3)

[wherein, $R^{Y1}$ and $X^{Y1}$ represent the same meaning as described above.]

It is preferable that the constitutional unit represented by the formula (Y-3) is a constitutional unit represented by the formula (Y-3').

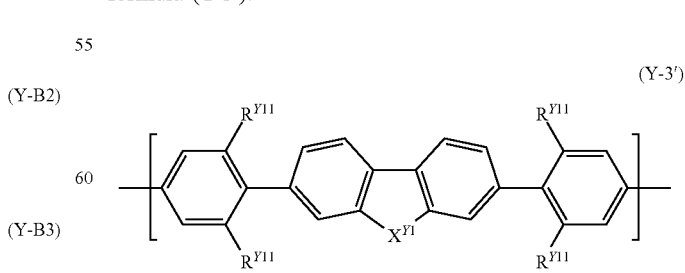

(Y-3')

[wherein, $R^{Y11}$ and $X^{Y1}$ represent the same meaning as described above.]

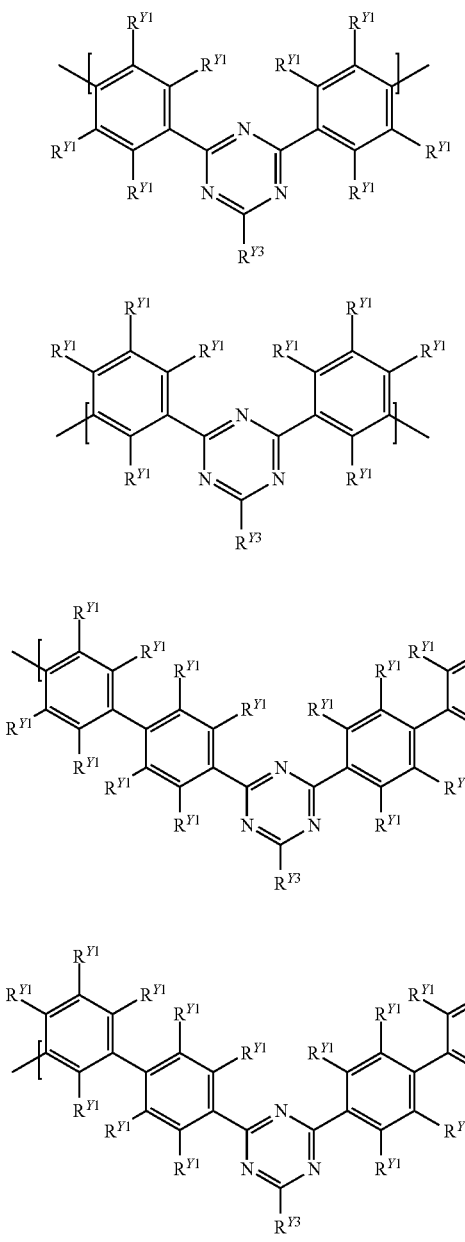

(Y-4)
(Y-5)
(Y-6)
(Y-7)

[wherein, $R^{Y1}$ represents the same meaning as described above.

$R^{Y3}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

It is preferable that the constitutional unit represented by the formula (Y-4) is a constitutional unit represented by the formula (Y-4'), and it is preferable that the constitutional unit represented by the formula (Y-6) is a constitutional unit represented by the formula (Y-6').

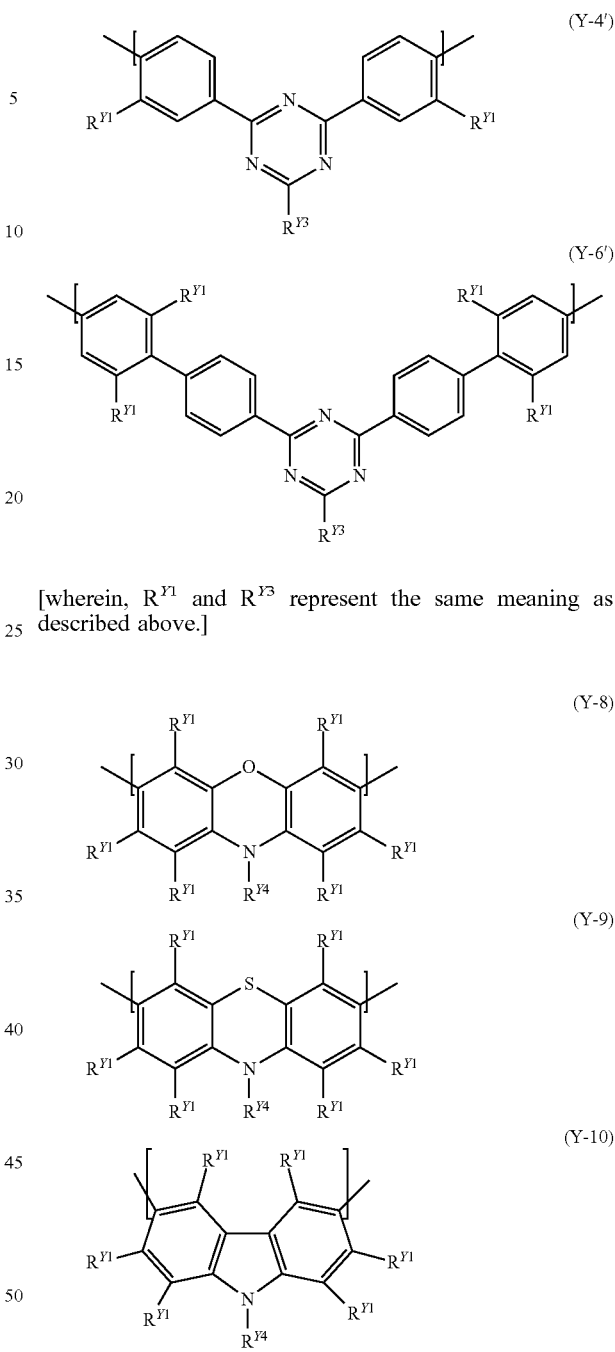

(Y-4')
(Y-6')
(Y-8)
(Y-9)
(Y-10)

[wherein, $R^{Y1}$ and $R^{Y3}$ represent the same meaning as described above.]

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to (Y-121), a constitutional unit composed of a divalent heterocyclic group represented by the formula (Y-201) to (Y-206), and a constitutional unit composed of a divalent group in which at least one arylene group and at least one divalent heterocyclic group are bonded directly to each other represented by the formula (Y-301) to (Y-304).
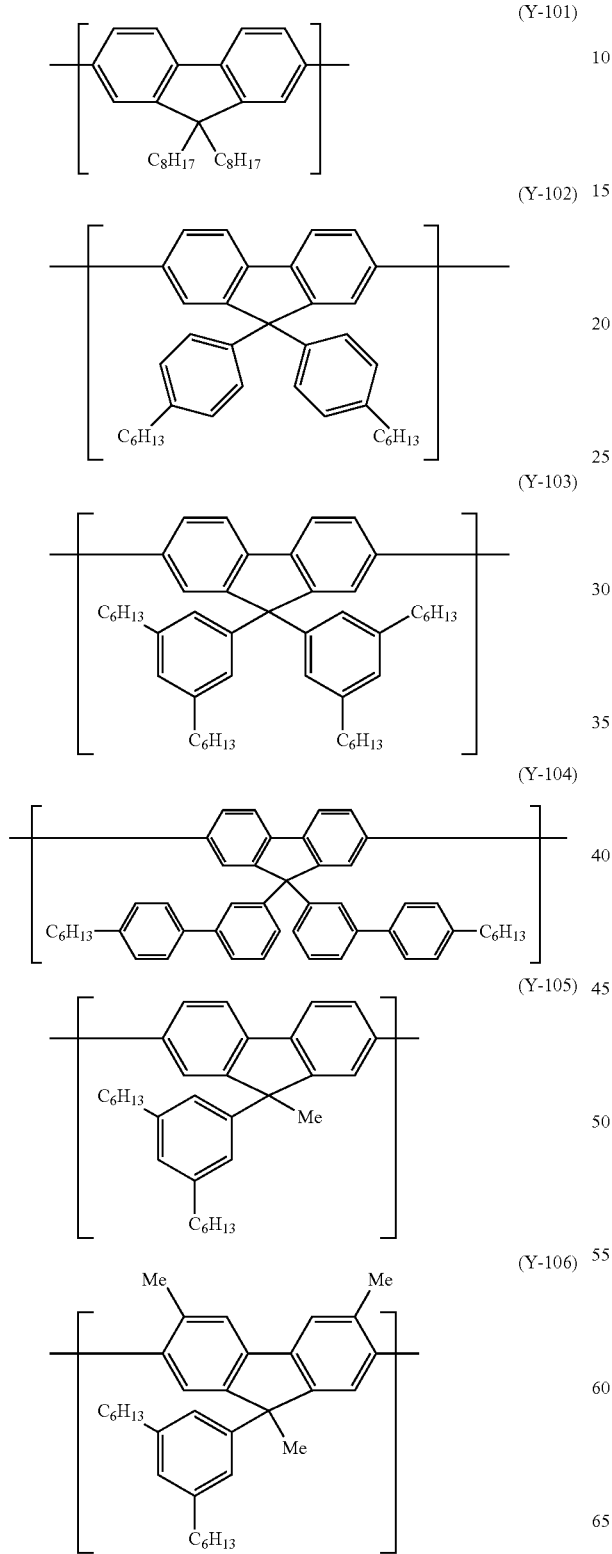
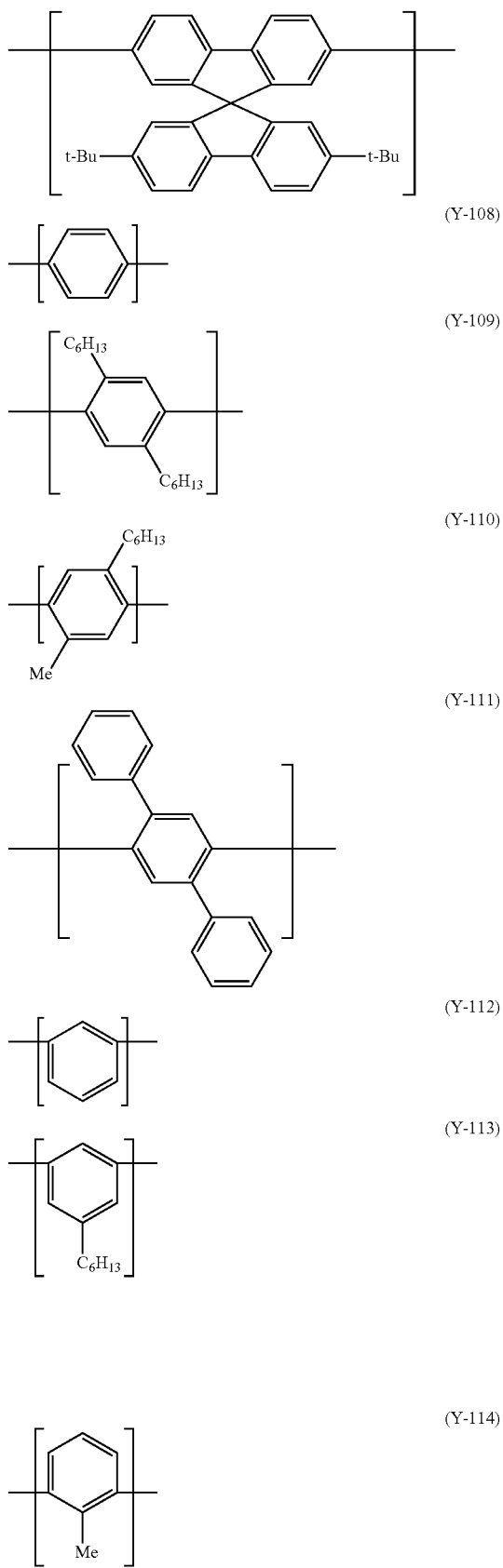

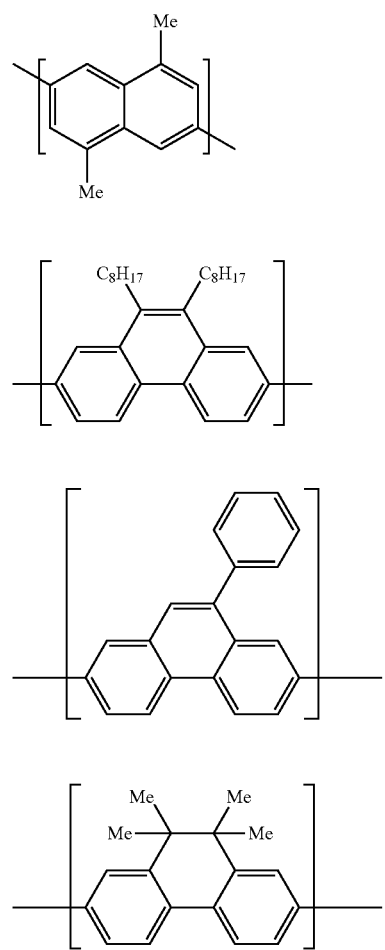
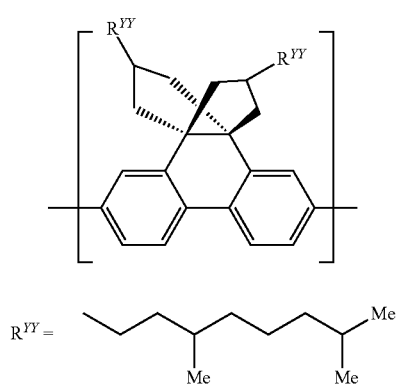
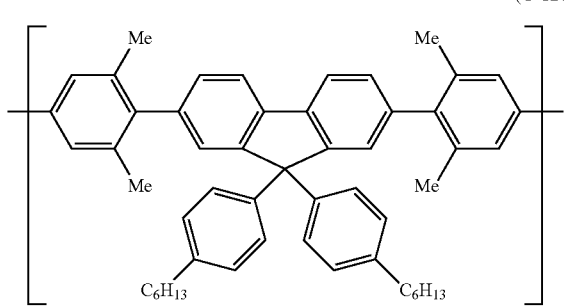
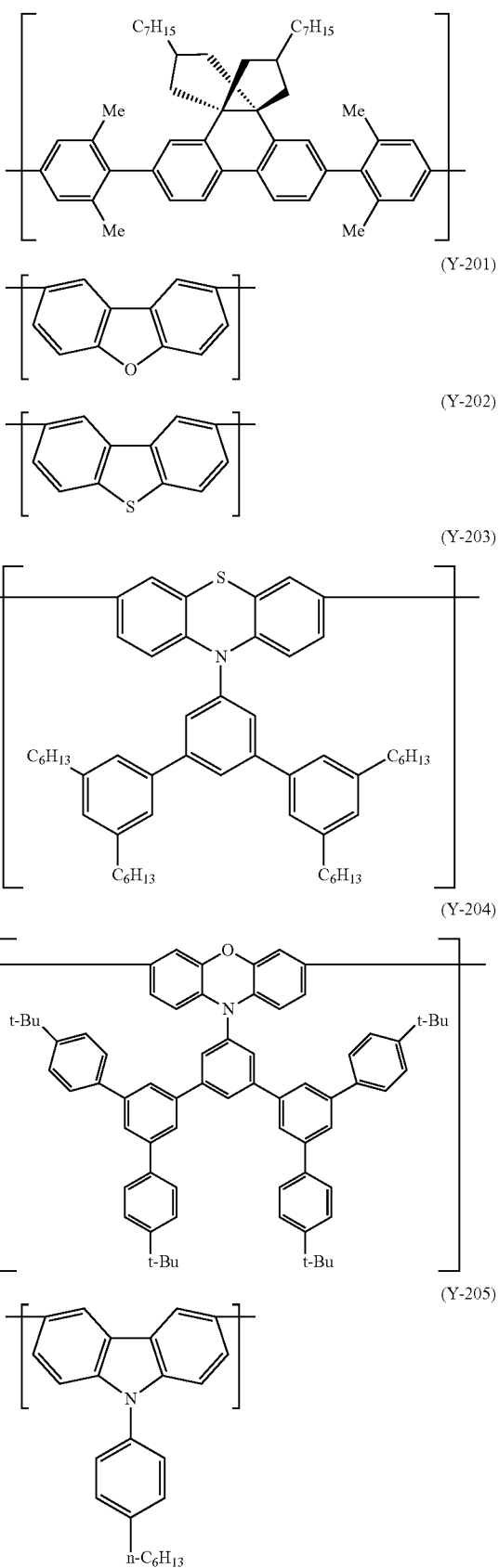

-continued (Y-206)
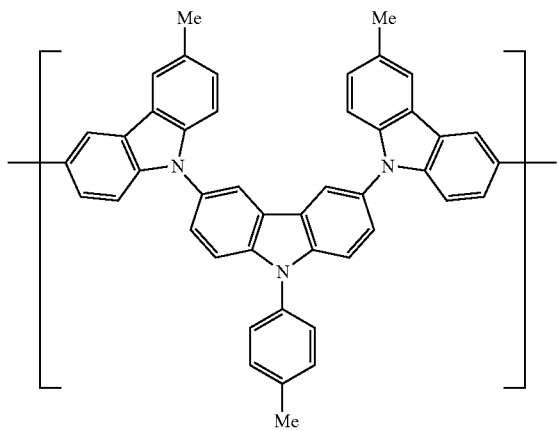

(Y-301)
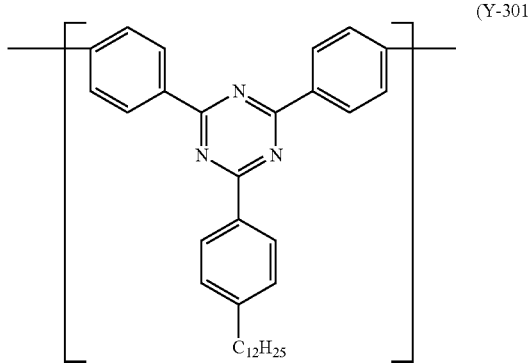

(Y-302)
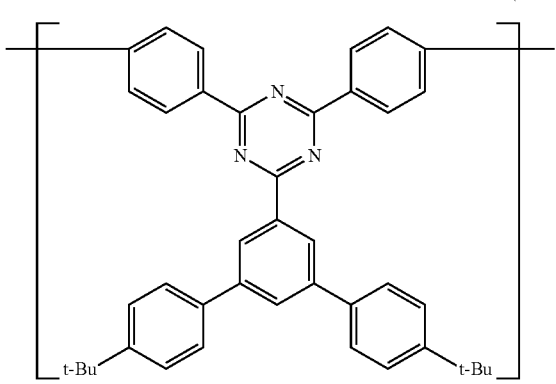

(Y-303)
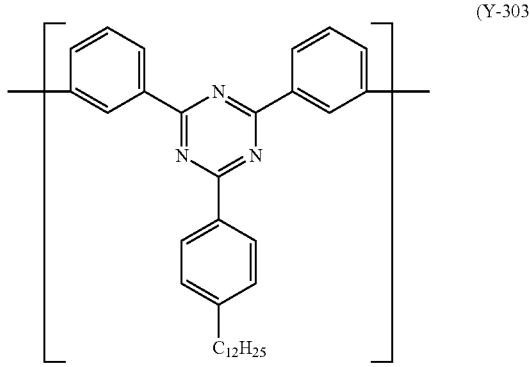

-continued (Y-304)
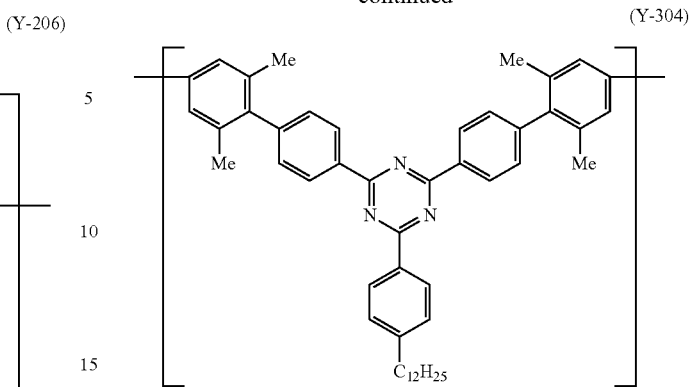

The amount of the constitutional unit represented by the formula (Y) in which $Ar^{Y1}$ is an arylene group is preferably 0.5 to 90 mol %, more preferably 30 to 80 mol % with respect to the total amount of constitutional units contained in the first polymer compound, because light emission efficiency of a light emitting device produced by using the composition of the present invention is excellent.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol % with respect to the total amount of constitutional units contained in the first polymer compound, because charge transportability of a light emitting device produced by using the composition of the present invention is excellent.

The constitutional unit represented by the formula (Y) may be contained only singly or two or more units thereof may be contained in the first polymer compound.

[Constitutional Unit Represented by the Formula (X)]

It is preferable that the first polymer compound further comprises a constitutional unit represented by the following formula (X), because hole transportability of a light emitting device produced by using the composition of the present invention is excellent.

(X)
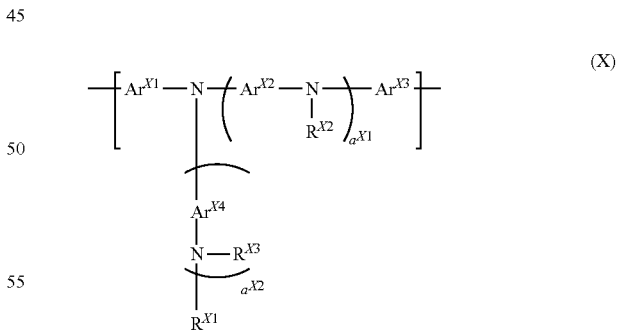

[wherein,
$a^{X1}$ and $a^{X2}$ each independently represent an integer of 0 or more.

$Ar^{X1}$ and $Ar^{X3}$ each independently represent an arylene group or a divalent heterocyclic group, and these groups each optionally have a substituent.

$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent.

$R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent.]

$a^{X1}$ is preferably 2 or less, more preferably 1, because light emission efficiency of a light emitting device produced by using the composition of the present invention is excellent.

$a^{X2}$ is preferably 2 or less, more preferably 0, because light emission efficiency of a light emitting device produced by using the composition of the present invention is excellent.

$R^{X1}$, $R^{X2}$ and $R^{X3}$ are preferably an alkyl group, a cycloalkyl group, an aryl group or a monovalent heterocyclic group, more preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (AA-1), the formula (AA-2) or the formula (AA-7) to (AA-26), and these groups each optionally have a substituent.

$Ar^{X1}$ and $Ar^{X3}$ are preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one arylene group and at least one divalent heterocyclic group are bonded directly to each other represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly to each other represented by $Ar^{X2}$ and $Ar^{X4}$ includes the same groups as the divalent group in which at least one arylene group and at least one divalent heterocyclic group are bonded directly to each other represented by $Ar^{X1}$ in the formula (Y).

$Ar^{X2}$ and $Ar^{X4}$ are preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

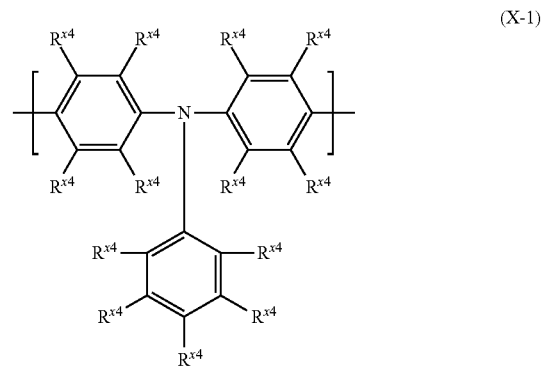

(X-1)

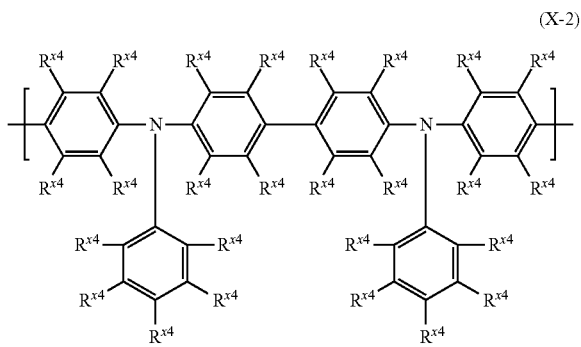

(X-2)

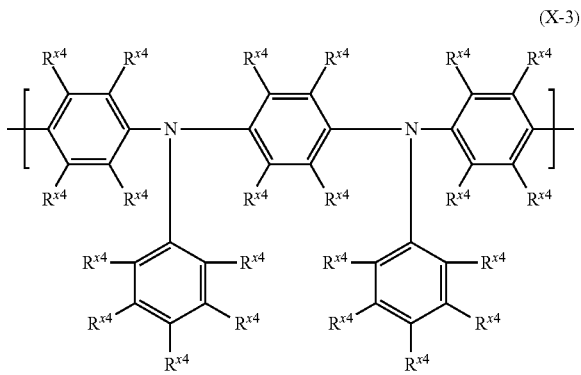

(X-3)

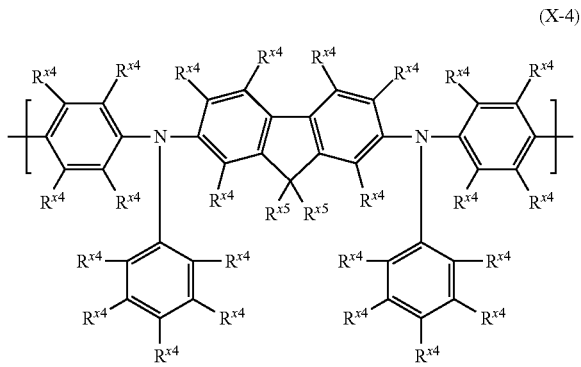

(X-4)

-continued

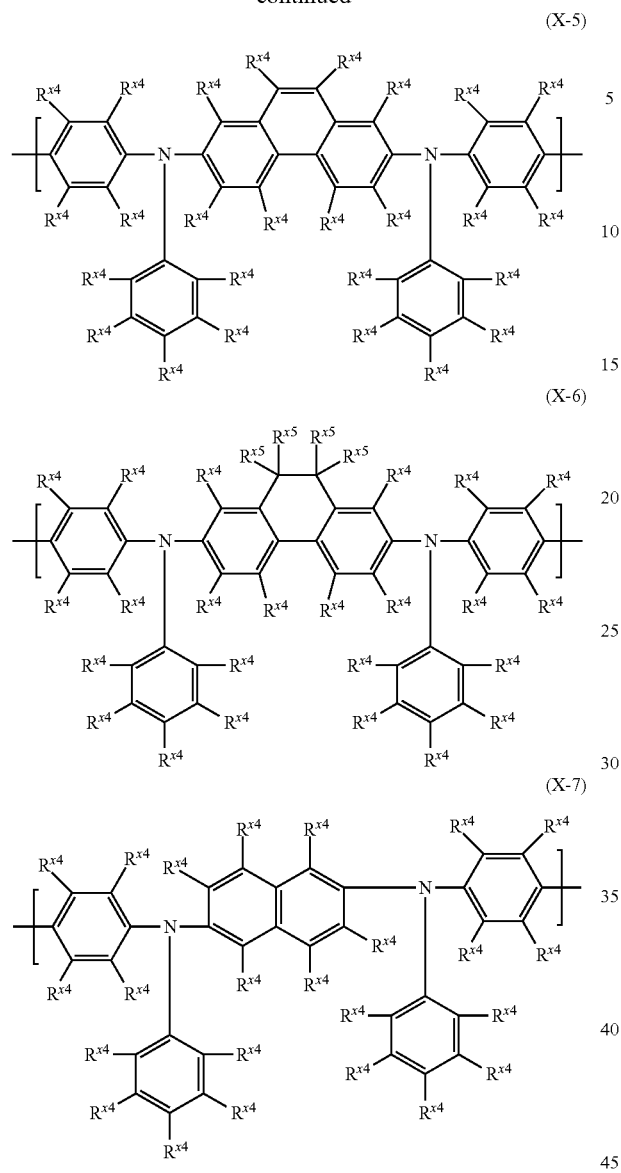

(X-5)

(X-6)

(X-7)

(wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The amount of the constitutional unit represented by the formula (X) is preferably 0.1 to 50 mol %, more preferably 1 to 40 mol %, further preferably 5 to 30 mol % with respect to the total amount of constitutional units contained in the first polymer compound, because hole transportability of a light emitting device produced by using the composition of the present invention is excellent.

The constitutional unit represented by the formula (X) includes, for example, constitutional units represented by the formulae (X1-1) to (X1-1), preferably constitutional units represented by the formulae (X1-3) to (X1-10).

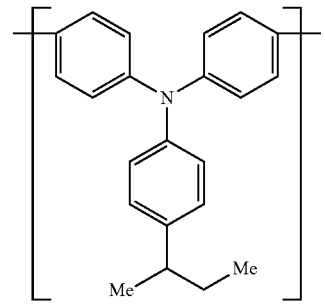

(X1-1)

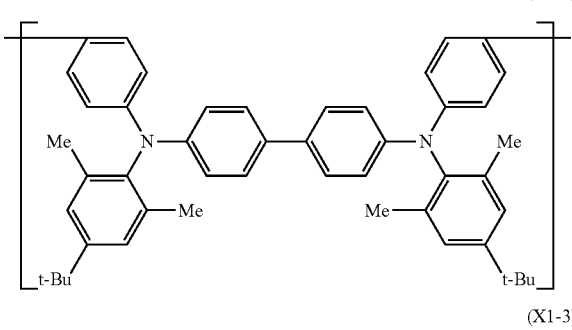

(X1-2)

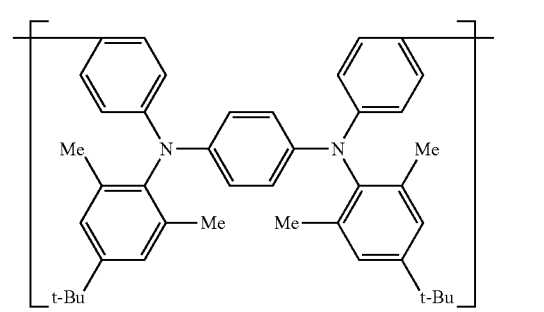

(X1-3)

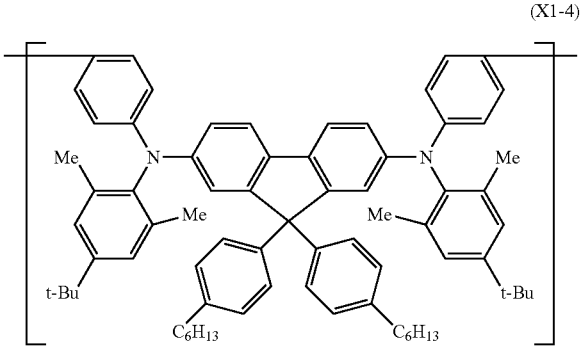

(X1-4)

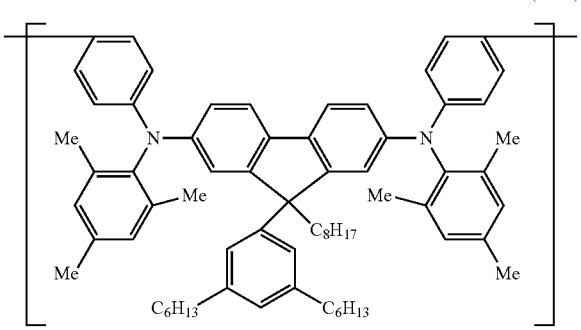

(X1-5)

(X1-6)
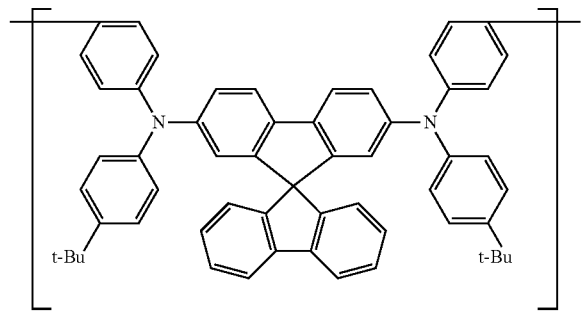
(X1-7)
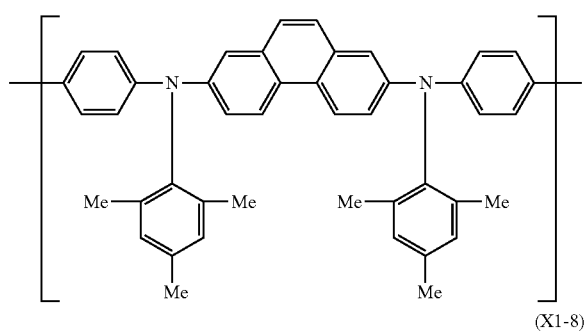
(X1-8)
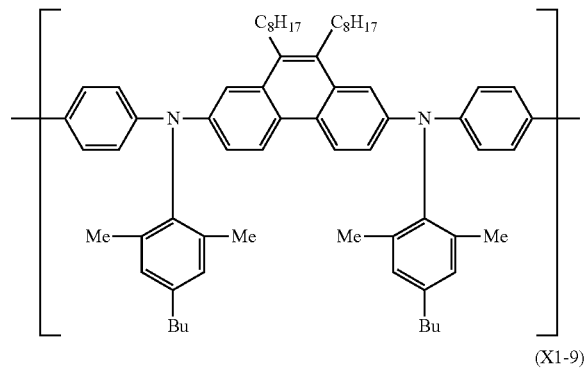
(X1-9)
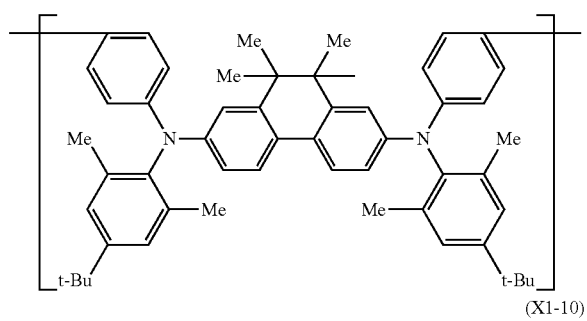
(X1-10)
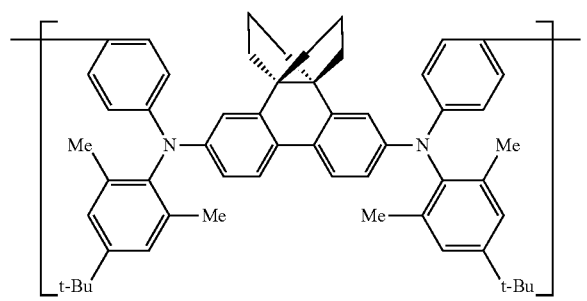
(X1-11)
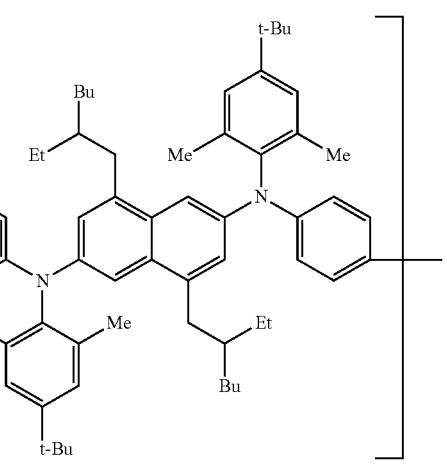
The constitutional unit represented by the formula (X) may be contained only singly or two or more units thereof may be contained in the first polymer compound.
[Constitutional Units Represented by the Formula (Ia) to the Formula (Id)]
(Ia)
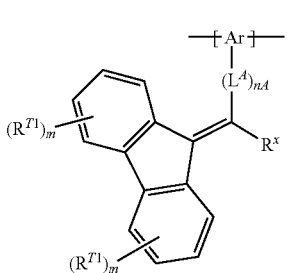
(Ib)
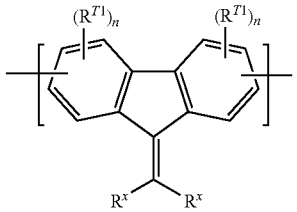
(Ic)
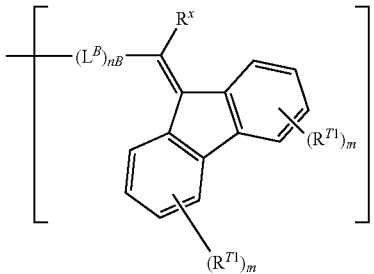

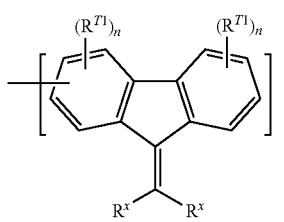

(Id)

m is preferably an integer of 0 to 2, more preferably 0, because a light emitting device produced by using the composition of the present invention is excellent in electron transportability.

n is preferably an integer of 0 to 2, more preferably 0, because a light emitting device produced by using the composition of the present invention is excellent in electron transportability.

$R^{T1}$ is preferably an alkyl group or a cycloalkyl group, more preferably an alkyl group, because a light emitting device produced by using the composition of the present invention is excellent in electron transportability.

$R^x$ is preferably a hydrogen atom, an alkyl group, a cycloalkyl group or an aryl group, more preferably a hydrogen atom or an aryl group, because a light emitting device produced by using the composition of the present invention is excellent in electron transportability.

Ar is preferably an aromatic hydrocarbon group, because a light emitting device produced by using the composition of the present invention is excellent in light emission efficiency.

The number of carbon atoms of the aromatic hydrocarbon group represented by Ar, not including the number of carbon atoms of a substituent, is usually 6 to 60, preferably 6 to 30, more preferably 6 to 18.

The arylene group portion obtained by removing a group represented by the formula (Ia') from the aromatic hydrocarbon group represented by Ar is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19).

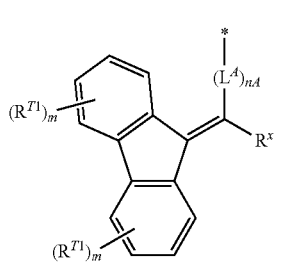

(Ia')

[wherein, m, $R^{T1}$, $R^x$, nA and $L^A$ represent the same meaning as described above. * represents a site binding to Ar.]

The number of carbon atoms of the heterocyclic group represented by Ar, not including the number of carbon atoms of a substituent, is usually 6 to 60, preferably 6 to 30, more preferably 6 to 18.

The divalent heterocyclic group portion obtained by removing a group represented by the formula (Ia') from the heterocyclic group represented by Ar is preferably a group represented by the formula (AA-1) to the formula (AA-34).

nA is preferably 1 or 2, more preferably 1, because a light emitting device produced by using the composition of the present invention is excellent in electron transportability.

$L^A$ is preferably an arylene group or a divalent heterocyclic group, more preferably an arylene group, because a light emitting device produced by using the composition of the present invention is excellent in electron transportability.

nB is preferably 1 or 2, more preferably 1, because a light emitting device produced by using the composition of the present invention is excellent in electron transportability.

$L^B$ is preferably an arylene group or a divalent heterocyclic group, more preferably an arylene group, because a light emitting device produced by using the composition of the present invention is excellent in electron transportability.

The first polymer compound is a polymer compound comprising at least one constitutional unit selected from the group consisting of a constitutional unit represented by the formula (Ia), a constitutional unit represented by the formula (Ib), a constitutional unit represented by the formula (Ic) and a constitutional unit represented by the formula (Id), and is preferably a polymer compound comprising a constitutional unit represented by the formula (Ia) or a constitutional unit represented by the formula (Ib), more preferably a polymer compound comprising a constitutional unit represented by the formula (Ia), because a light emitting device produced by using the composition of the present invention is excellent in electron transportability.

When the first polymer compound is a polymer compound comprising a constitutional unit represented by the formula (Ic), the constitutional unit represented by the formula (Ic) is an end constitutional unit. When the first polymer compound is a polymer compound comprising a constitutional unit represented by the formula (Id), the constitutional unit represented by the formula (Id) is an end constitutional unit.

"End constitutional unit" denotes a constitutional unit at an end of a polymer compound, and the end constitutional unit is preferably a constitutional unit derived from an end-capping agent in production of a polymer compound.

The constitutional unit represented by the formula (Ia) is preferably a constitutional unit represented by the formula (Ie), because a light emitting device produced by using the composition of the present invention is excellent in electron transportability.

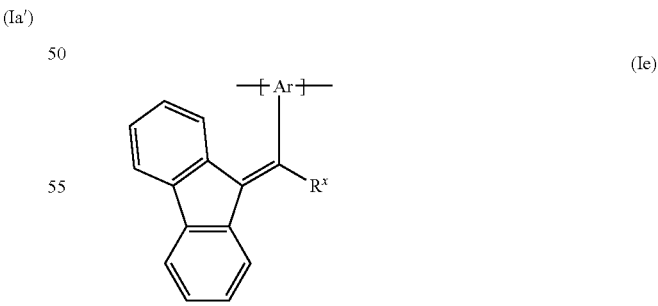

(Ie)

[wherein, Ar and $R^x$ represent the same meaning as described above.]

The constitutional unit represented by the formula (Ie) includes, for example, constitutional units represented by the formulae (Ie-1) to (Ie-5), preferably constitutional units represented by the formula (Ie-1) or (Ie-2).

(Ie-1)
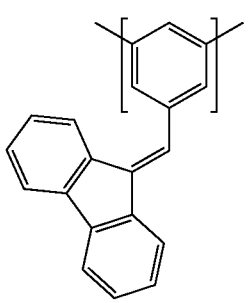

(Ie-2)
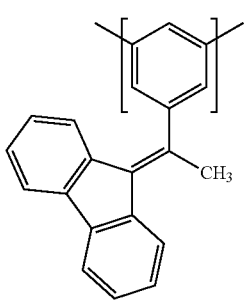

(Ie-3)
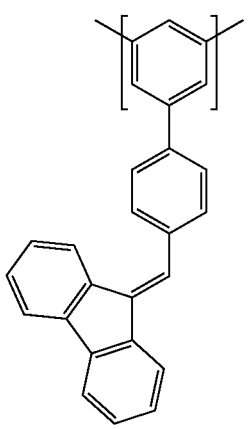

(Ie-4)
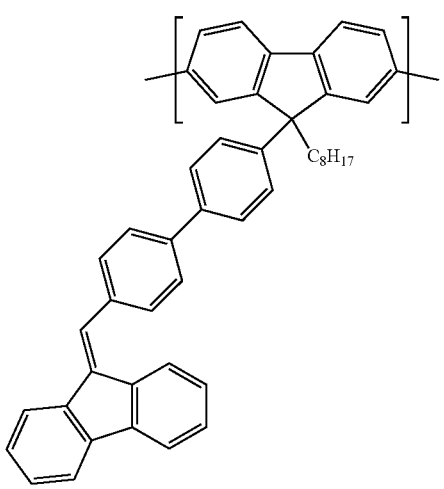

(Ie-5)
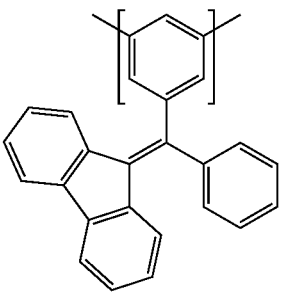

The constitutional unit represented by the formula (Ib) is preferably a constitutional unit represented by the formula (If), because a light emitting device produced by using the composition of the present invention is excellent in electron transportability.

(If)
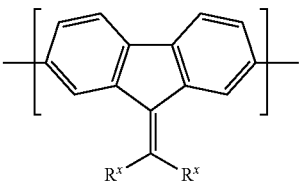

The constitutional unit represented by the formula (If) includes, for example, constitutional units represented by the formulae (If-1) to (If-8), preferably constitutional units represented by the formula (If-1), (If-2), (If-4) or (If-6).

(If-1)
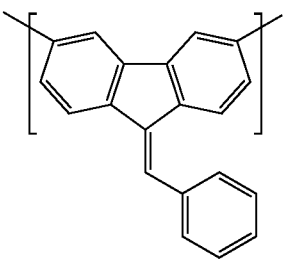

(If-2)
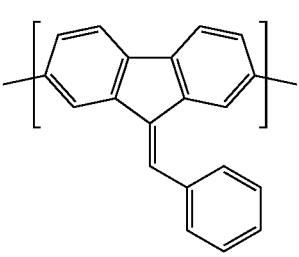

(If-3)
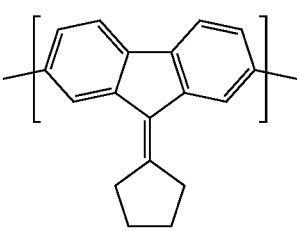

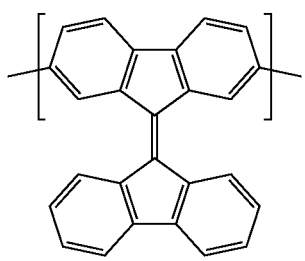 (If-4)
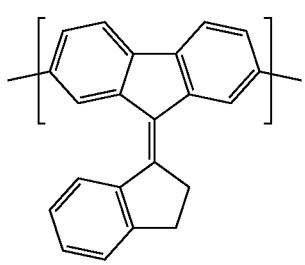 (If-5)
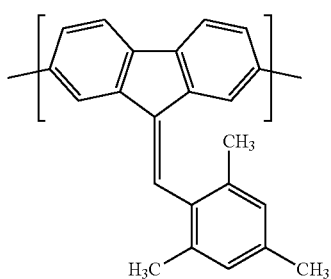 (If-6)
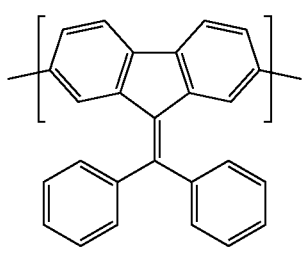 (If-7)
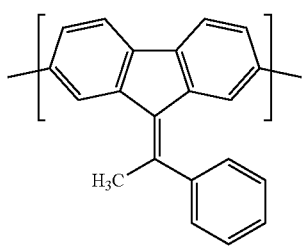 (If-8)
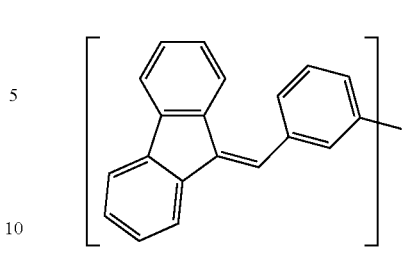 (Ic-1)
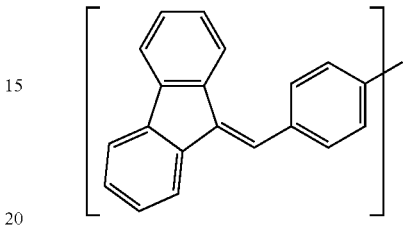 (Ic-2)
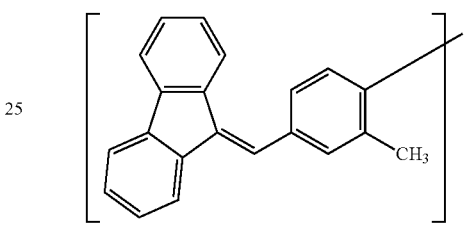 (Ic-3)
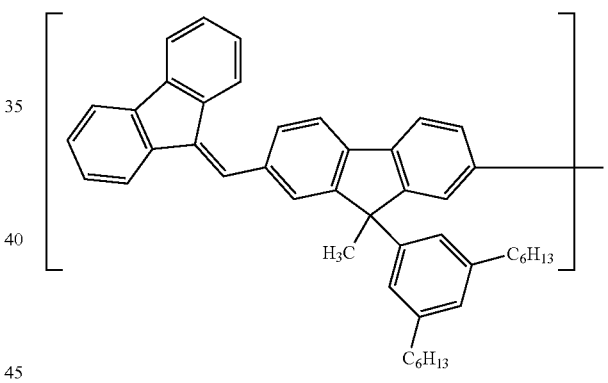 (Ic-4)
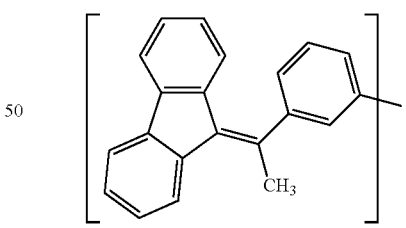 (Ic-5)
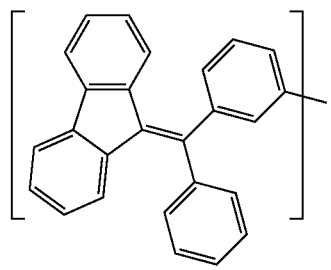 (Ic-6)
The constitutional unit represented by the formula (Ic) includes, for example, constitutional units represented by the formulae (Ic-1) to (Ic-6).

The constitutional unit represented by the formula (Id) preferably includes, for example, constitutional units represented by the following formulae (Id-1) to (Id-6).

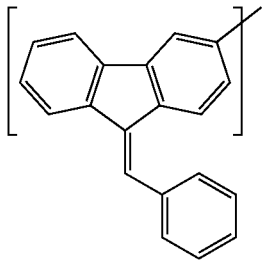
(Id-1)

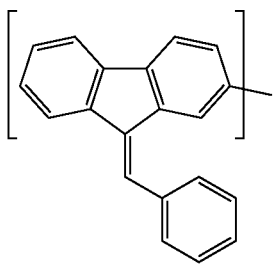
(Id-2)

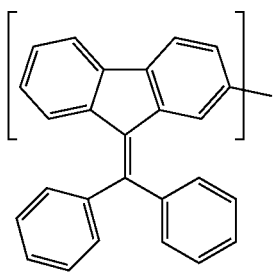
(Id-3)

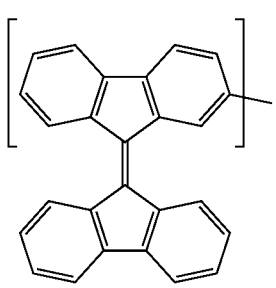
(Id-4)

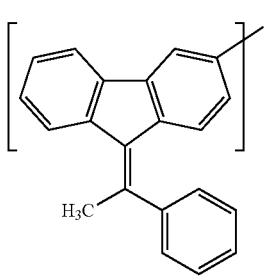
(Id-5)

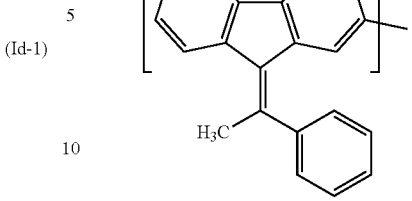
(Id-6)

The amount of the constitutional unit represented by the formula (Ia), the constitutional unit represented by the formula (Ib), the constitutional unit represented by the formula (Ic) and the constitutional unit represented by the formula (Id) is preferably 0.1 to 10 mol %, more preferably 0.1 to 5 mol %, further preferably 0.1 to 3 mol %, with respect to the total amount of constitutional units contained in the first polymer compound, because a light emitting device produced by using the composition of the present invention is excellent in electron transportability.

The constitutional unit represented by the formula (Ia), the constitutional unit represented by the formula (Ib), the constitutional unit represented by the formula (Ic) and the constitutional unit represented by the formula (Id) each may be contained singly or two or more of each of the constitutional units may be contained in the first polymer compound.

The first polymer compound has a polystyrene-equivalent weight-average molecular weight of preferably $1 \times 10^4$ to $5 \times 10^5$ and a polystyrene-equivalent number-average molecular weight of preferably $2 \times 10^3$ to $4 \times 10^5$.

The first polymer compound includes, for example, polymer compounds (P-1) to (P-7) shown in Table 1.

TABLE 1

| | constitutional unit and mole fraction thereof | | | | | |
| --- | --- | --- | --- | --- | --- | --- |
| | formula (Y) | | | formula (X) | formula | |
| polymer compound | formulae (Y-1) to (Y-3) p | formulae (Y-4) to (Y-7) q | formulae (Y-8) to (Y-10) r | formulae (X-1) to (X-7) s | formulae (Ia) to (Id) t | others u |
| (P-1) | 0.1 to 99.8 | 0.1 to 99.8 | 0 | 0 | 0.1 to 10.0 | 0 to 30 |
| (P-2) | 0.1 to 99.8 | 0 | 0.1 to 99.8 | 0 | 0.1 to 10.0 | 0 to 30 |
| (P-3) | 0.1 to 99.8 | 0 | 0 | 0.1 to 99.8 | 0.1 to 10.0 | 0 to 30 |
| (P-4) | 0.1 to 99.7 | 0.1 to 99.7 | 0.1 to 99.7 | 0 | 0.1 to 10.0 | 0 to 30 |
| (P-5) | 0.1 to 99.7 | 0.1 to 99.7 | 0 | 0.1 to 99.7 | 0.1 to 10.0 | 0 to 30 |
| (P-6) | 0.1 to 99.7 | 0 | 0.1 to 99.7 | 0.1 to 99.7 | 0.1 to 10.0 | 0 to 30 |
| (P-7) | 0.1 to 99.6 | 0.1 to 99.6 | 0.1 to 99.6 | 0.1 to 99.6 | 0.1 to 10.0 | 0 to 30 |

[in the table, p, q, r, s, t and u represent the mole fraction of each constitutional unit. p+q+r+s+t+u=100 and 100≥p+q+r+s+t≥70. The other constitutional unit denotes a constitutional unit other than the constitutional unit represented by the formula (Y), the constitutional unit represented by the formula (X) and the constitutional units represented by the formula (Ia) to the formula (Id).]

<Phosphorescent Compound>

The phosphorescent compound contained the composition of the present invention will be illustrated.

The phosphorescent compound contained the composition of the present invention is preferably a phosphorescent compound represented by the formula (1).

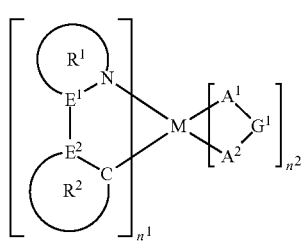
(1)

The phosphorescent compound represented by the formula (1) is constituted of M as a central metal, a ligand of which number is prescribed by a subscript $n^1$ and a ligand of which number is prescribed by a subscript $n^2$.

M is preferably an iridium atom or a platinum atom, more preferably an iridium atom, because the light emitting device of the present invention is more excellent in light emission efficiency.

$n^1$ is preferably 2 or 3, more preferably 3 when M is a ruthenium atom, a rhodium atom or an iridium atom.

$n^1$ is preferably 2 when M is a palladium atom or a platinum atom.

It is preferable that $E^1$ and $E^2$ are a carbon atom.

The ring $R^1$ is preferably a pyridine ring, a pyrimidine ring, an imidazole ring or a triazole ring, and these rings each optionally have a substituent.

The ring $R^1$ is preferably a benzene ring, a naphthalene ring, a fluorene ring, a phenanthrene ring, a pyridine ring, a diazabenzene ring or a triazine ring, more preferably a benzene ring, a pyridine ring or a pyrimidine ring, and these rings each optionally have a substituent.

The substituent which the ring $R^1$ and the ring $R^2$ optionally have includes an alkyl group, a cycloalkyl group, an alkoxy group, a cycloalkoxy group, an aryl group, an aryloxy group, a monovalent heterocyclic group, a halogen atom and a substituted amino group, preferably an alkyl group, a cycloalkyl group, an aryl group, a monovalent heterocyclic group or a substituted amino group, more preferably an alkyl group, an aryl group, a monovalent heterocyclic group or a substituted amino group.

It is preferable that the at least one ring selected from the group consisting of the ring $R^1$ and the ring $R^2$ has a group represented by the formula (2), and it is more preferable that the ring $R^2$ has a group represented by the formula (2), because a light emitting device produced by using the composition of the present invention is more excellent in luminance life.

—$R^{100}$ (2)

[wherein, $R^{100}$ represents an aryl group, a monovalent heterocyclic group or a substituted amino group, and these groups each optionally have a substituent.]

When a plurality of the rings $R^1$ and the rings $R^2$ are present, it is preferable that all of the plurality of the rings $R^1$, all of the plurality of the rings $R^2$ or all of the plurality of the rings $R^1$ and the rings $R^2$ have a group represented by the formula (2), and it is more preferable that all of the plurality of the rings $R^2$ have a group represented by the formula (2).

$R^{100}$ is preferably an aryl group or a monovalent heterocyclic group, more preferably an aryl group.

The aryl group, the monovalent heterocyclic group or the substituted amino group represented by $R^{100}$ is preferably a dendron.

The anionic bidentate ligand represented by $A^1$-$G^1$-$A^2$ includes, for example, ligands represented by the following formulae.

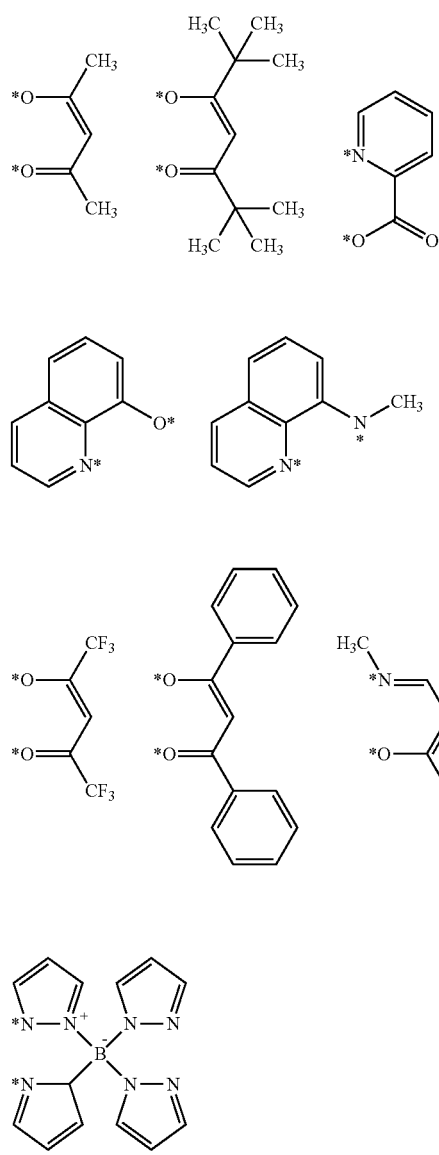

(wherein, * represents a site binding to M.]

The phosphorescent compound represented by the formula (1) is preferably a phosphorescent compound represented by the formula (1-A) or a phosphorescent compound represented by the formula (1-B), because a light emitting device produced by using the composition of the present invention is excellent in light emission efficiency.

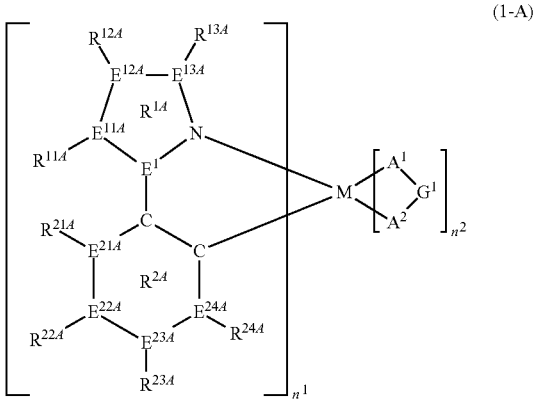

(1-A)

[wherein,

M, $n^1$, $n^2$, $E^1$ and $A^1$-G-$A^2$ represent the same meaning as described above.

$E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. $R^{11A}$, $R^{12A}$, $R^{13A}$ may be either present or not present when $E^{11A}$, $E^{12A}$ and $E^{13A}$ are a nitrogen atom. $R^{21A}$, $R^{22A}$, $R^{23A}$ and $R^{24A}$ are not present when $E^{21A}$, $E^{22A}$, $E^{23A}$ and $E^{24A}$ are a nitrogen atom.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{11A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached.

The ring $R^{1A}$ represents an imidazole ring or a triazole ring constituted of a nitrogen atom, $E^1$, $E^{11A}$, $E^{12A}$ and $E^{13A}$.

The ring $R^{2A}$ represents a benzene ring, a pyridine ring or a pyrimidine ring constituted of two carbon atoms, $E^{21A}$, $E^{22A}$, $E^{23A}$ and $E^{24A}$.]

It is preferable that at least one selected from the group consisting of $R^{11A}$, $R^{12A}$, $R^{13A}$, $R^{21A}$, $R^{22A}$, $R^{23A}$ and $R^{24A}$ is a group represented by the formula (2), because a light emitting device produced by using the composition of the present invention is more excellent in luminance life.

When the ring $R^{1A}$ is an imidazole ring, an imidazole ring in which $E^{11A}$ is a nitrogen atom or an imidazole ring in which $E^{12A}$ is a nitrogen atom is preferable, an imidazole ring in which $E^{11A}$ is a nitrogen atom is more preferable.

When the ring $R^{1A}$ is a triazole ring, a triazole ring in which $E^{11A}$ and $E^{12A}$ are a nitrogen atom or a triazole ring in which $E^{11A}$ and $E^{13A}$ are a nitrogen atom is preferable, a triazole ring in which $E^{11A}$ and $E^{12A}$ are a nitrogen atom is more preferable.

When $E^{11A}$ is a nitrogen atom and $R^{11A}$ is present, it is preferable that $R^{11A}$ is an alkyl group, a cycloalkyl group or a group represented by the formula (2).

When $E^{11A}$ is a carbon atom, $R^{11A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{12A}$ is a nitrogen atom and $R^{12A}$ is present, it is preferable that $R^{12A}$ is an alkyl group, a cycloalkyl group or a group represented by the formula (2).

When $E^{12A}$ is a carbon atom, $R^{12A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{13A}$ is a nitrogen atom and $R^{13A}$ is present, it is preferable that $R^{13A}$ is an alkyl group, a cycloalkyl group or a group represented by the formula (2).

When $E^{13A}$ is a carbon atom, $R^{13A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When the ring $R^{1A}$ has a group represented by the formula (2), it is preferable that $R^{11A}$ or $R^{12A}$ is a group represented by the formula (2), and it is more preferable that $R^{11A}$ is a group represented by the formula (2). The group represented by the formula (2) is preferably a dendron.

When the ring $R^{2A}$ is a pyridine ring, a pyridine ring in which $E^{21A}$ is a nitrogen atom, a pyridine ring in which $E^{22A}$ is a nitrogen atom or a pyridine ring in which $E^{23A}$ is a nitrogen atom is preferable, a pyridine ring in which $E^{22A}$ is a nitrogen atom is more preferable.

When the ring $R^{2A}$ is a pyrimidine ring, a pyrimidine ring in which $E^{21A}$ and $E^{23A}$ are a nitrogen atom or a pyrimidine ring in which $E^{22A}$ and $E^{24A}$ are a nitrogen atom is preferable, a pyrimidine ring in which $E^{22A}$ and $E^{24A}$ are a nitrogen atom is more preferable.

The ring $R^{2A}$ is preferably a benzene ring.

$R^{21A}$, $R^{22A}$, $R^{23A}$ and $R^{24A}$ are preferably a hydrogen atom, an alkyl group, a cycloalkyl group or a group represented by the formula (2), more preferably a hydrogen atom or a group represented by the formula (2).

When the ring $R^{2A}$ has a group represented by the formula (2), it is preferable that $R^{22A}$ or $R^{23A}$ is a group represented by the formula (2), it is more preferable that $R^{22A}$ is a group represented by the formula (2). The group represented by the formula (2) is preferably a dendron.

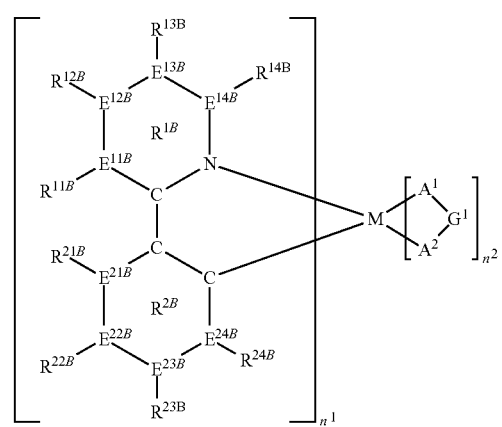

(1-B)

[wherein,

M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. $R^{11B}$, $R^{12B}$, $R^{13B}$, $R^{14B}$, $R^{21B}$, $R^{22B}$, $R^{23B}$ and $R^{24B}$ are not present when $E^{11B}$, $E^{12B}$, $E^{13B}$, $E^{14B}$, $E^{21B}$, $E^{22B}$, $E^{23B}$ and $E^{24B}$ are a nitrogen atom.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with the atoms to which they are attached.

The ring $R^{1B}$ represents a pyridine ring or a pyrimidine ring constituted of a nitrogen atom, a carbon atom, $E^{11B}$, $E^{12B}$, $E^{13B}$ and $E^{14B}$.

The ring $R^{2B}$ represents a benzene ring, a pyridine ring or a pyrimidine ring constituted of two carbon atoms, $E^{21B}$, $E^{22B}$, $E^{23B}$ and $E^{24B}$.]

It is preferable that at least one selected from the group consisting of $R^{11B}$, $R^{12B}$, $R^{13B}$, $R^{14B}$, $R^{21B}$, $R^{22B}$, $R^{23B}$ and $R^{24B}$ is a group represented by the formula (2), because a light emitting device produced by using the composition of the present invention is more excellent in luminance life.

When the ring $R^{1B}$ is a pyrimidine ring, a pyrimidine ring in which $E^{11B}$ is a nitrogen atom or a pyrimidine ring in which $E^{11B}$ is a nitrogen atom is preferable, a pyrimidine ring in which $E^{11B}$ is a nitrogen atom is more preferable.

$R^{11B}$, $R^{12B}$, $R^{13B}$ and $R^{14B}$ are preferably a hydrogen atom, an alkyl group, a cycloalkyl group or a group represented by the formula (2), more preferably a hydrogen atom or a group represented by the formula (2).

When the ring $R^{1B}$ has a group represented by the formula (2), it is preferable that $R^{11B}$, $R^{12B}$ or $R^{13B}$ is a group represented by the formula (2), it is more preferable that $R^{11B}$ or $R^{13B}$ is a group represented by the formula (2), it is further preferable that $R^{11B}$ is a group represented by the formula (2). The group represented by the formula (2) is preferably a dendron.

When the ring $R^{2B}$ is a pyridine ring, a pyridine ring in which $E^{21B}$ is a nitrogen atom, a pyridine ring in which $E^{22B}$ is a nitrogen atom or a pyridine ring in which $E^{23B}$ is a nitrogen atom is preferable, a pyridine ring in which $E^{22B}$ is a nitrogen atom is more preferable.

When the ring $R^{2B}$ is a pyrimidine ring, a pyrimidine ring in which $E^{21B}$ and $E^{23B}$ are a nitrogen atom or a pyrimidine ring in which $E^{22B}$ and $E^{24B}$ are a nitrogen atom is preferable, a pyrimidine ring in which $E^{22B}$ and $E^{24B}$ are a nitrogen atom is more preferable.

The ring $R^{2B}$ is preferably a benzene ring.

$R^{21B}$, $R^{22B}$, $R^{23B}$ and $R^{24B}$ are preferably a hydrogen atom, an alkyl group, a cycloalkyl group or a group represented by the formula (2), more preferably a hydrogen atom or a group represented by the formula (2).

When the ring $R^{2B}$ has a group represented by the formula (2), it is preferable that $R^{22B}$ or $R^{23B}$ is a group represented by the formula (2), it is more preferable that $R^{22B}$ is a group represented by the formula (2). The group represented by the formula (2) is preferably a dendron.

The phosphorescent compound represented by the formula (1-A) is preferably a phosphorescent compound represented by the formula (1-A1), a phosphorescent compound represented by the formula (1-A2), a phosphorescent compound represented by the formula (1-A3) or a phosphorescent compound represented by the formula (1-A4).

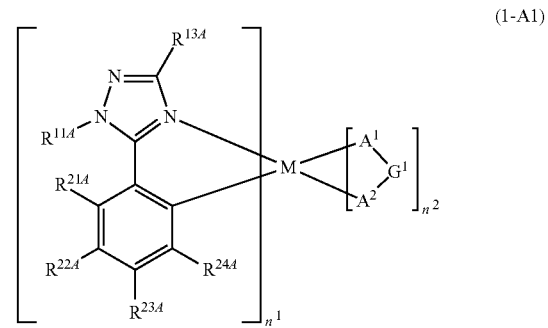

(1-A1)

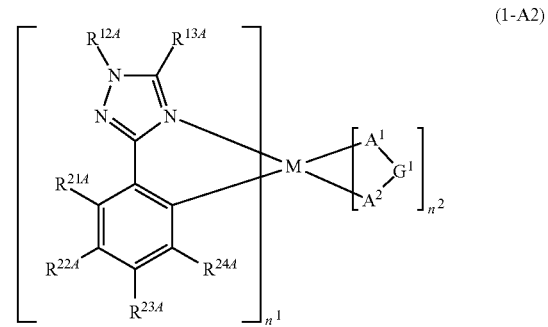

(1-A2)

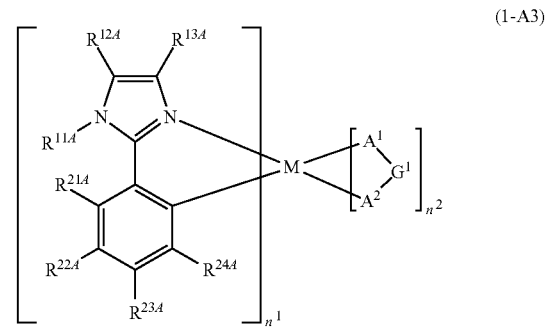

(1-A3)

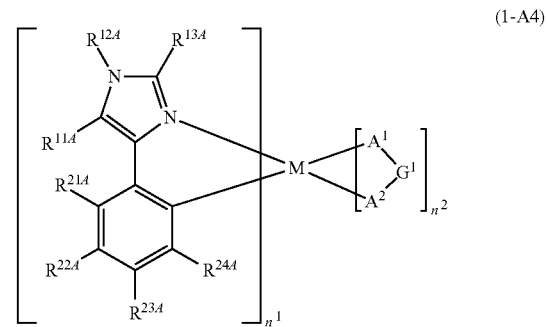

(1-A4)

[wherein,

M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.]

The phosphorescent compound represented by the formula (1-B) is preferably a phosphorescent compound represented by the formula (1-B1), a phosphorescent compound represented by the formula (1-B2) or a phosphorescent compound represented by the formula (1-B3).

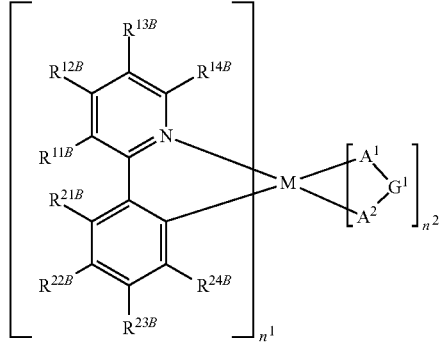

(1-B1)

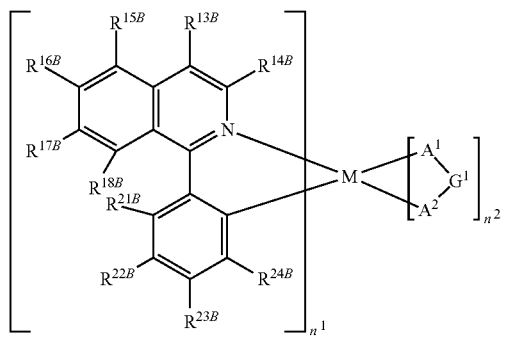

(1-B2)

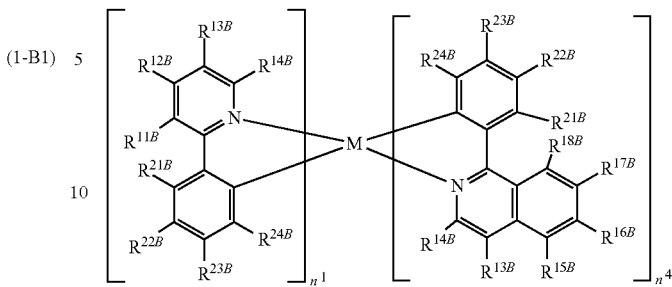

(1-B3)

[wherein,

M, $n^1$, $n^2$, $R^{11B}$, $R^{12B}$, $R^{13B}$, $R^{14B}$, $R^{21B}$, $R^{22B}$, $R^{23B}$ and $R^{24B}$ and $A^1$-$G^1$-$A^2$ represent the same meaning as described above.

$n^3$ and $n^4$ each independently represent an integer of 1 or more, and $n^3+n^4$ is 2 or 3. $n^3+n^4$ is 3 when M is a ruthenium atom, a rhodium atom or an iridium atom, while $n^3+n^4$ is 2 when M is a palladium atom or a platinum atom.

$R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{15B}$, $R^{16B}$, $R^{17B}$ and $R^{18B}$ are present, they may be the same or different at each occurrence. $R^{14B}$ and $R^{15B}$, $R^{15B}$ and $R^{16B}$, $R^{16B}$ and $R^{17B}$, $R^{17B}$ and $R^{18B}$, and $R^{18B}$ and $R^{21B}$ each may be combined together to form a ring together with the atoms to which they are attached.]

The phosphorescent compound represented by the formula (1) includes, for example, phosphorescent compounds represented by the following formulae.

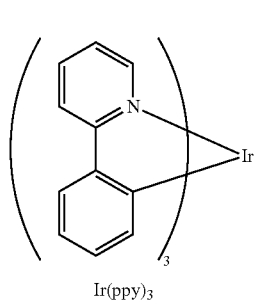

Ir(ppy)$_3$

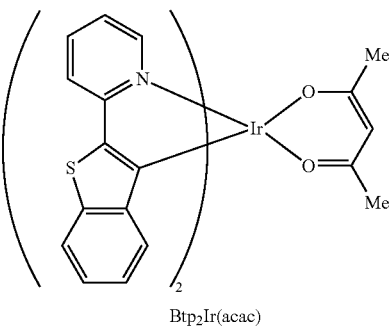

Btp$_2$Ir(acac)

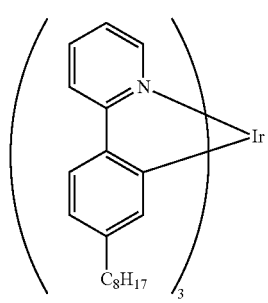

COM-1

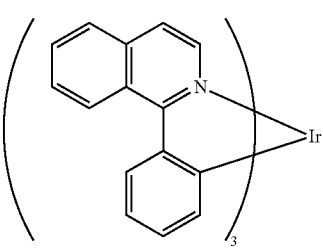

COM-2

-continued
COM-3
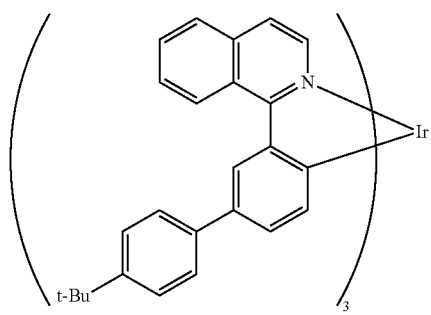
COM-4
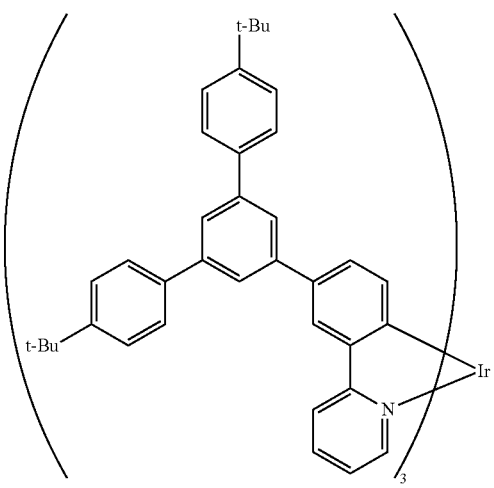
COM-5
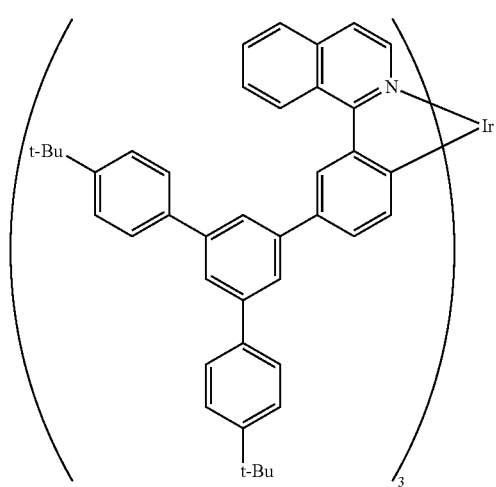
COM-6
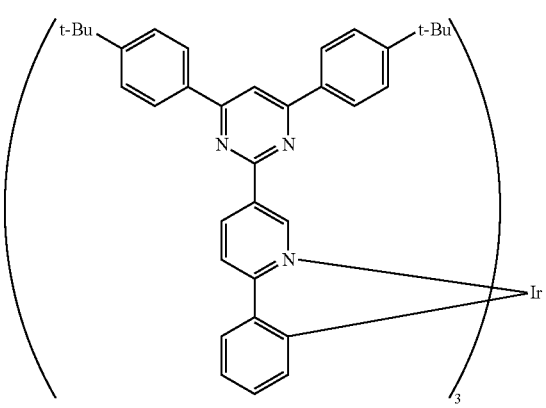
COM-7
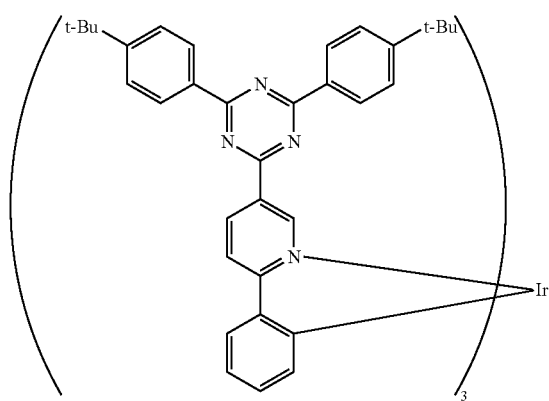

-continued
COM-8
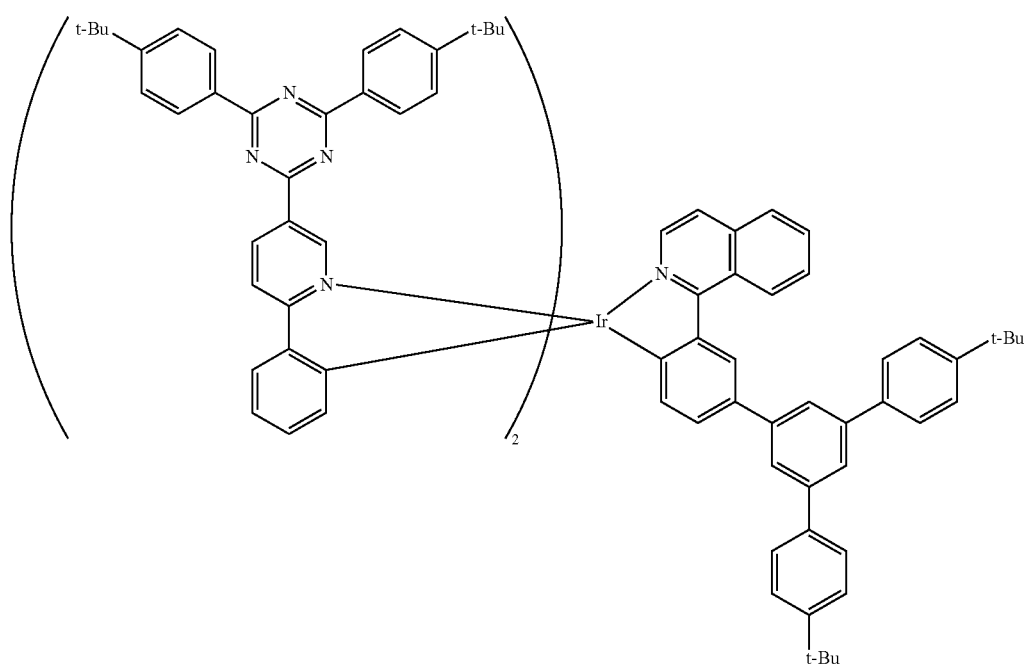
COM-9  COM-10
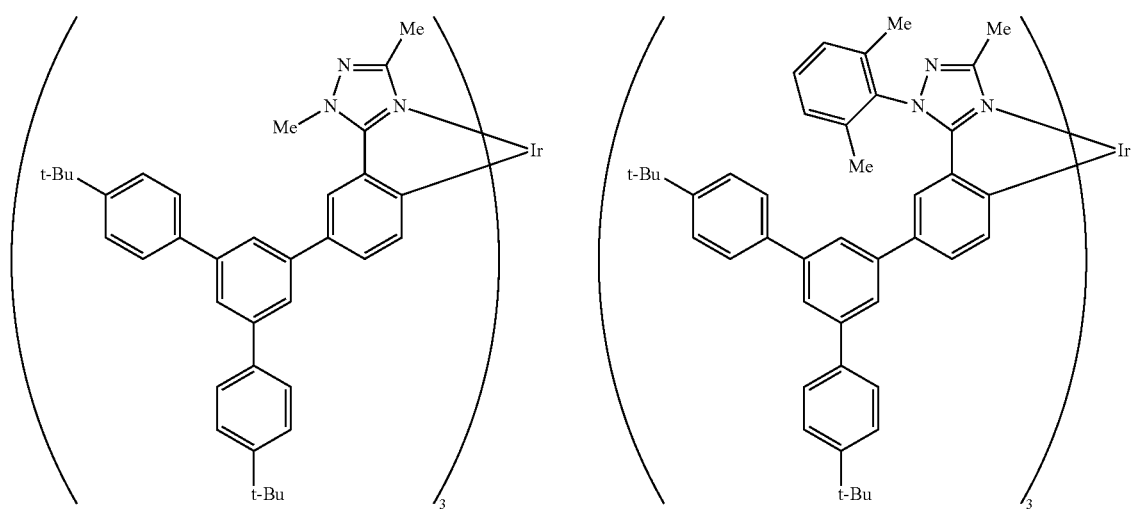
COM-11  COM-12
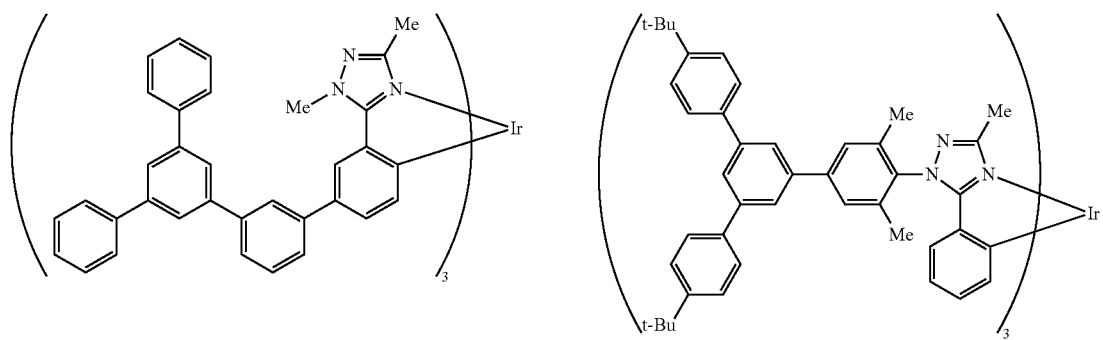

-continued
COM-13
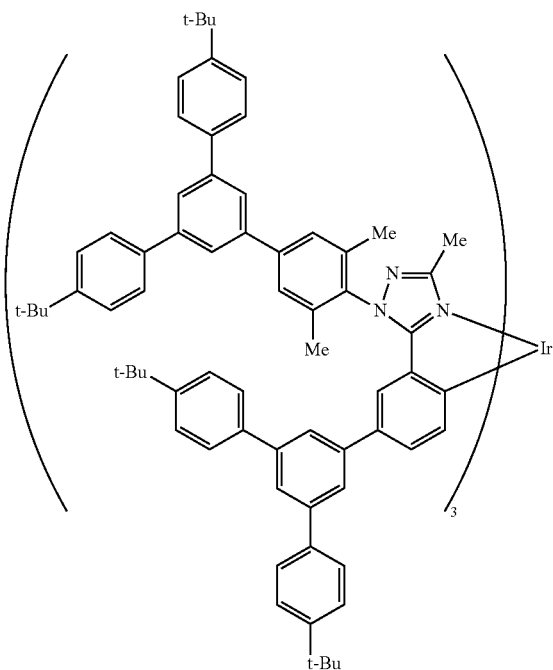
COM-14
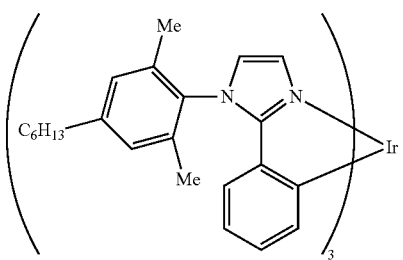
COM-15
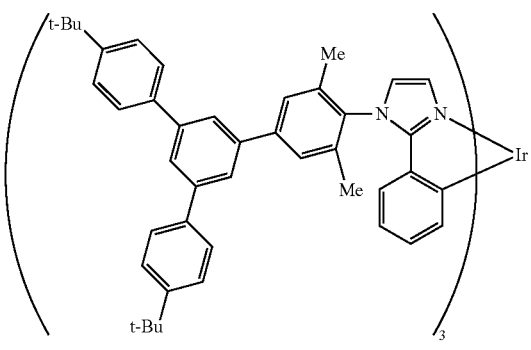
COM-16
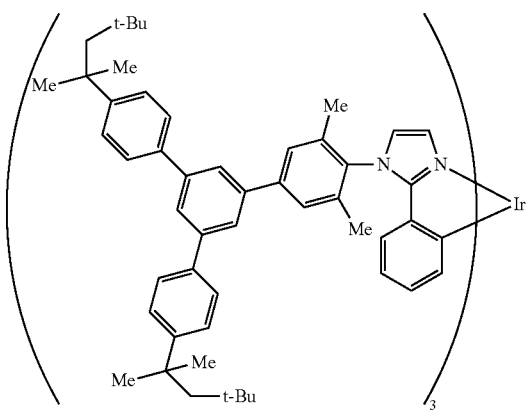
COM-17
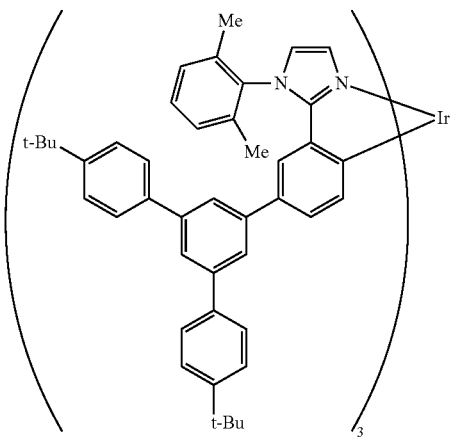
COM-18
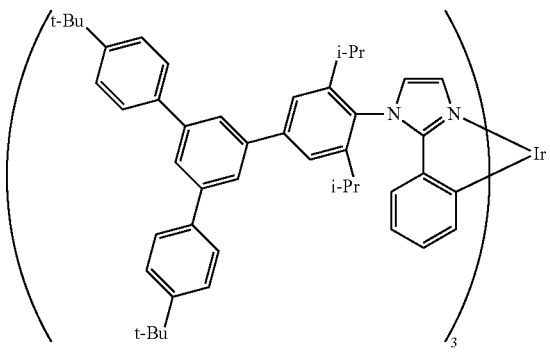

-continued

COM-19

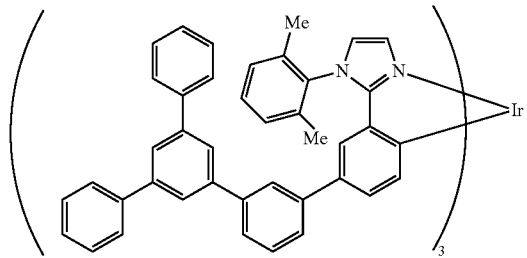

COM-20

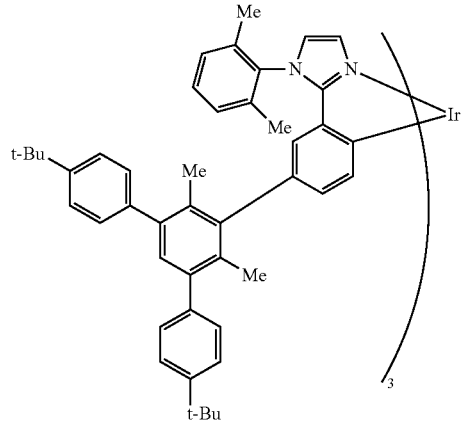

The phosphorescent compound can be synthesized, for example, according to methods described in Japanese Patent Application National Publication No. 2004-530254, JP-A No. 2008-179617, JP-A No. 2011-105701, Japanese Patent Application National Publication No. 2007-504272, JP-A No. 201.3-147449 and JP-A No. 2013-147450.

<Polymer Compound Comprising Phosphorescent Constitutional Unit>

The phosphorescent compound contained in the composition of the present invention may be a polymer compound (hereinafter, referred to also as "the second polymer compound".) comprising a constitutional unit having the structure of a phosphorescent compound (namely, a constitutional unit having a group obtained by removing 1 or more hydrogen atoms bonding directly to carbon atoms or hetero atoms constituting a phosphorescent compound. Hereinafter, referred to also as "phosphorescent constitutional unit".).

The phosphorescent constitutional unit is preferably a constitutional unit having the structure of a phosphorescent compound represented by the formula (1), because a light emitting device produced by using the composition of the present invention is excellent in light emission efficiency. The constitutional unit having the structure of a phosphorescent compound represented by the formula (1) is preferably a constitutional unit having a group obtained by removing from a phosphorescent compound represented by the formula (1) 1 to 3 hydrogen atoms bonding directly to carbon atoms or hetero atoms constituting the compound, more preferably a constitutional unit represented by the formula (1B), (2B), (3B) or (4B), further preferably a constitutional unit represented by the formula (2B) or (3B), particularly preferably a constitutional unit represented by the formula (2B).

[Phosphorescent Constitutional Unit Represented by the Formula (1B)]

(1B)

[wherein, $M^{1B}$ represents a group obtained by removing from a phosphorescent compound represented by the formula (1) one hydrogen atom bonding directly to a carbon atom or a hetero atom constituting the compound.

$L^C$ represents an oxygen atom, a sulfur atom, —N($R^A$)—, —C($R^B$)$_2$—, —C($R^B$)=C($R^B$)—, —C≡C—, an arylene group or a divalent heterocyclic group, and these groups each optionally have a substituent. $R^A$ represents a hydrogen atom, an alkyl group, a cycloalkyl group, an aryl group or a monovalent heterocyclic group, and these groups each optionally have a substituent. $R^B$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^B$ may be the same or different and may be combined together to form a ring together with the carbon atoms to which they are attached. When a plurality of $L^C$ are present, they may be the same or different.

$n^{c1}$ represents an integer of 0 or more.]

$R^A$ is preferably an aryl group or a monovalent heterocyclic group, more preferably an aryl group, and these groups each optionally have a substituent.

$R^B$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom or an alkyl group, particularly preferably a hydrogen atom, and these groups each optionally have a substituent.

$L^C$ is preferably —C($R^B$)$_2$—, an arylene group or a divalent heterocyclic group, more preferably —C($R^B$)$_2$— or an arylene group, further preferably an arylene group, particularly preferably a group represented by the formula (A-1) or (A-2), and these groups each optionally have a substituent.

The definition and examples of the substituent which $R^A$, $R^B$ and $L^C$ optionally have are the same as the definition and examples of the substituent which the ring $R^1$ and the ring $R^2$ described above optionally have.

$n^{c1}$ is usually an integer of 0 to 10, preferably an integer of 0 to 5, more preferably an integer of 0 to 2, further preferably 0 or 1, particularly preferably 0.

When the second polymer compound is a polymer compound comprising a constitutional unit represented by the formula (1B), the constitutional unit represented by the formula (1B) is an end constitutional unit.

"End constitutional unit" denotes a constitutional unit at an end of a polymer compound, and the end constitutional unit is preferably a constitutional unit derived from an end-capping agent in production of a polymer compound.

$M^{1B}$ is more preferably a group represented by the formula (BM-1).

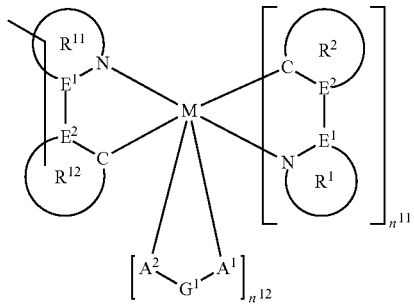

(BM-1)

[wherein,

M, $E^1$, $E^2$, the ring $R^1$, the ring $R^2$ and $A^1$-$G^1$-$A^2$ represent the same meaning as described above.

The ring $R^{11}$ represents a 5-membered or 6-membered aromatic heterocyclic ring, and these rings each optionally have a substituent. When a plurality of the substituents are present, they may be the same or different and may be combined together to form a ring together with the atoms to which they are attached. $E^1$ is a carbon atom when the ring $R^{11}$ is a 6-membered aromatic heterocyclic ring.

The ring $R^{12}$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a ring together with the atoms to which they are attached. $E^2$ is a carbon atom when the ring $R^{12}$ is a 6-membered aromatic heterocyclic ring.

One of the ring $R^{11}$ and the ring $R^{12}$ has one connecting bond.

$n^{11}$ and $n^{12}$ each independently represent an integer of 0 or more. $n^{11}+n^{12}$ is 1 or 2. $n^{11}+n^{12}$ is 2 when M is a ruthenium atom, a rhodium atom or an iridium atom, while $n^{11}+n^{12}$ is 1 when M is a palladium atom or a platinum atom.]

$n^{11}$ is more preferably 2 when M is a ruthenium atom, a rhodium atom or an iridium atom.

$n^{11}$ is preferably 1 when M is a palladium atom or a platinum atom.

When the ring $R^{11}$ has no connecting bond, the definition and examples of the ring $R^{11}$ are the same as the definition and examples of the ring $R^1$ described above.

When the ring $R^{11}$ has a connecting bond, the definition and examples of the ring portion obtained by removing the connecting bond of the ring $R^{11}$ are the same as the definition and examples of the ring $R^1$ described above.

When the ring $R^{12}$ has no connecting bond, the definition and examples of the ring $R^{12}$ are the same as the definition and examples of the ring $R^2$ described above.

When the ring $R^{12}$ has a connecting bond, the definition and examples of the ring portion obtained by removing the connecting bond of the ring $R^{12}$ are the same as the definition and examples of the ring $R^2$ described above.

The definition and examples of the substituent which the ring $R^{11}$ and the ring $R^{12}$ optionally have are the same as the definition and examples of the substituent which the ring $R^1$ and the ring $R^2$ described above optionally have.

[Constitutional Unit Represented by the Formula (2B)]

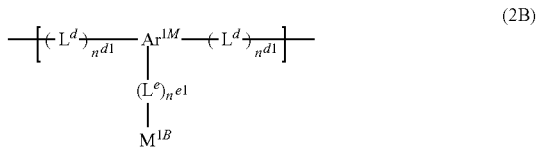

(2B)

[wherein, $M^{1B}$ represents the same meaning as described above.

$L^d$ and $L^e$ each independently represent an oxygen atom, a sulfur atom, —N($R^A$)—, —C($R^B$)$_2$—, —C($R^B$)=C ($R^B$)—, —C≡C—, an arylene group or a divalent heterocyclic group, and these groups each optionally have a substituent. $R^A$ and $R^B$ represent the same meaning as described above. When a plurality of $L^d$ and $L^e$ are present, they may be the same or different at each occurrence.

$n^{d1}$ and $n^{e1}$ each independently represent an integer of 0 or more. The plurality of $n^{d1}$ may be the same or different.

$Ar^{1M}$ represents an aromatic hydrocarbon group or a heterocyclic group, and these groups each optionally have a substituent.]

$L^d$ is preferably —C($R^B$)$_2$—, an azylene group or a divalent heterocyclic group, more preferably an arylene group or a divalent heterocyclic group, further preferably an arylene group, particularly preferably a group represented by the formula (A-1) or (A-2), and these groups each optionally have a substituent.

$L^e$ is preferably —C($R^B$)$_2$—, an arylene group or a divalent heterocyclic group, more preferably —C($R^B$)$_2$— or an arylene group, further preferably an arylene group, particularly preferably a group represented by the formula (A-1) or (A-2), and these groups each optionally have a substituent.

$n^{d1}$ and $n^{e1}$ are usually an integer of 0 to 10, preferably an integer of 0 to 5, more preferably an integer of 0 to 2, further preferably 0 or 1, particularly preferably 0.

$Ar^{1M}$ is preferably a group obtained by removing from a benzene ring, a naphthalene ring, a fluorene ring, a phenanthrene ring, a dihydrophenanthrene ring, a pyridine ring, a diazabenzene ring, a triazine ring, a carbazole ring, a phenoxazine ring or a phenothiazine ring three hydrogen atoms bonding directly to carbon atoms or hetero atoms constituting the ring, more preferably a group obtained by removing from a benzene ring, a naphthalene ring, a fluorene ring, a phenanthrene ring or a dihydrophenanthrene ring three hydrogen atoms bonding directly to carbon atoms constituting the ring, further preferably a group obtained by removing from a benzene ring or a fluorene ring three hydrogen atoms bonding directly to carbon atoms constituting the ring, particularly preferably a group obtained by removing from a benzene ring three hydrogen atoms bonding directly to carbon atoms constituting the ring, and these groups optionally have a substituent.

The definition and examples of the substituent which $L^d$, $L^e$ and $Ar^{1M}$ optionally have are the same as the definition and examples of the substituent which the ring $R^1$ and the ring $R^2$ described above optionally have.

[Constitutional Unit Represented by the Formula (3B)]

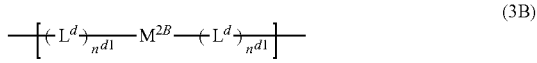

(3B)

[wherein, $L^d$ and $n^{d1}$ represent the same meaning as described above.

$M^{2B}$ represents a group obtained by removing from a phosphorescent compound represented by the formula (1) two hydrogen atoms bonding directly to carbon atoms or hetero atoms constituting the compound.]

$M^{2B}$ is more preferably a group represented by the formula (BM-2) or (BM-3), further preferably a group represented by the formula (BM-2).

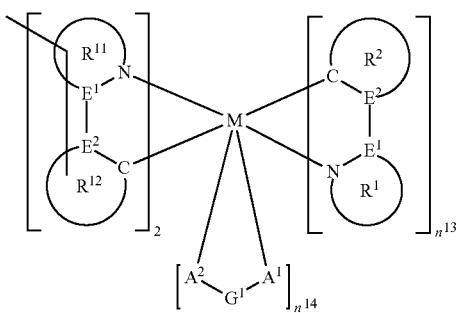

(BM-2)

[wherein,

M, $E^1$, $E^2$, the ring $R^1$, the ring $R^2$, the ring $R^{11}$, the ring $R^{12}$ and $A^1$-$G^1$-$A^2$ represent the same meaning as described above. The plurality of the rings $R^{11}$ may be the same or different. The plurality of the rings $R^{12}$ may be the same or different.

$n^{13}$ and $n^{14}$ each independently represent an integer of 0 or more. $n^{13}+n^{14}$ is 0 or 1. $n^{13}+n^{14}$ is 1 when M is a ruthenium atom, a rhodium atom or an iridium atom, while $n^{13}+n^{14}$ is 0 when M is a palladium atom or a platinum atom.]

$n^{13}$ is preferably 1 when M is a ruthenium atom, a rhodium atom or an iridium atom.

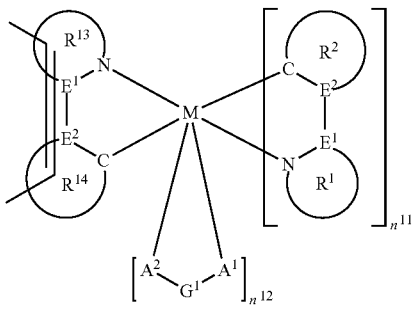

(BM-3)

[wherein,

M, $E^1$, $E^2$, the ring $R^1$, the ring $R^2$, $A^1$-$G^1$-$A^2$, $n^{11}$ and $n^{12}$ represent the same meaning as described above.

The ring $R^{13}$ represents a 5-membered or 6-membered aromatic heterocyclic ring, and these rings each optionally have a substituent. When a plurality of the substituents are present, they may be the same or different and may be combined together to form a ring together with the atoms to which they are attached. $E^1$ is a carbon atom when the ring $R^{13}$ is a 6-membered aromatic heterocyclic ring.

The ring $R^{14}$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a ring together with the atoms to which they are attached. $E^2$ is a carbon atom when the ring $R^{14}$ is a 6-membered aromatic heterocyclic ring.

One of the ring $R^{13}$ and the ring $R^{14}$ has two connecting bonds, or each of the ring $R^{13}$ and the ring $R^{14}$ has one connecting bond.]

When the ring $R^{13}$ has no connecting bond, the definition and examples of the ring $R^{13}$ are the same as the definition and examples of the ring $R^1$ described above.

When the ring $R^{13}$ has a connecting bond, the definition and examples of the ring portion obtained by removing the connecting bond of the ring $R^{13}$ are the same as the definition and examples of the ring $R^1$ described above.

When the ring $R^{14}$ has no connecting bond, the definition and examples of the ring $R^{14}$ are the same as the definition and examples of the ring $R^2$ described above.

When the ring $R^{14}$ has a connecting bond, the definition and examples of the ring portion obtained by removing the connecting bond of the ring $R^{14}$ are the same as the definition and examples of the ring $R^2$ described above.

The definition and examples of the substituent which the ring $R^{13}$ and the ring $R^{14}$ optionally have are the same as the definition and examples of the substituent which the ring $R^1$ and the ring $R^2$ described above optionally have.

It is preferable that each of the ring $R^{13}$ and the ring $R^{14}$ has one connecting bond.

[Constitutional Unit Represented by the Formula (4B)]

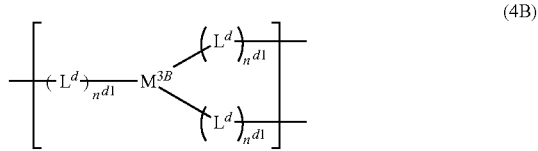

(4B)

[wherein, $L^d$ and $n^{d1}$ represent the same meaning as described above.

$M^{3B}$ represents a group obtained by removing from a phosphorescent compound represented by the formula (1) three hydrogen atoms bonding directly to carbon atoms or hetero atoms constituting the compound.]

$M^{3B}$ is preferably a group represented by the formula (BM-4).

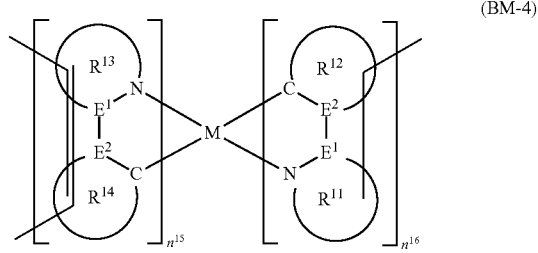

(BM-4)

[wherein,

M, $E^1$, $E^2$, the ring $R^{11}$, the ring $R^{12}$, the ring $R^{13}$, the ring $R^{14}$ and $A^1$-$G^1$-$A^2$ represent the same meaning as described above.

$n^{15}$ represents 0 or 1. $n^{16}$ represents 1 or 3. $n^{15}$ is 0 and $n^{16}$ is 3 when M is a ruthenium atom, a rhodium atom or an iridium atom. $n^{15}$ is 1 and $n^{16}$ is 1 when M is a palladium atom or a platinum atom.]

The phosphorescent constitutional unit includes, for example, constitutional units represented by the formulae (B-1) to (B-25).
(B-1)
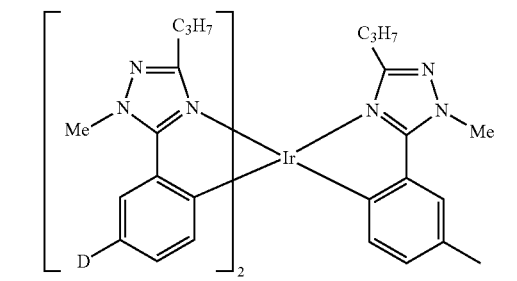
(B-2)
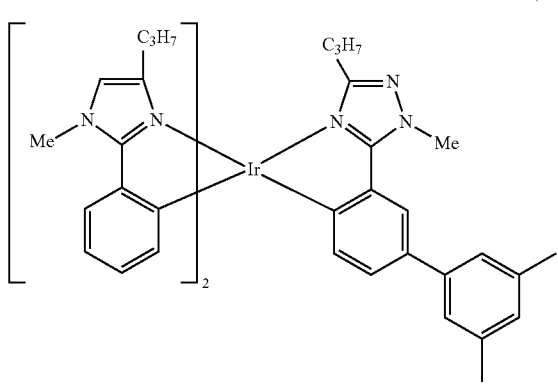
(B-3)
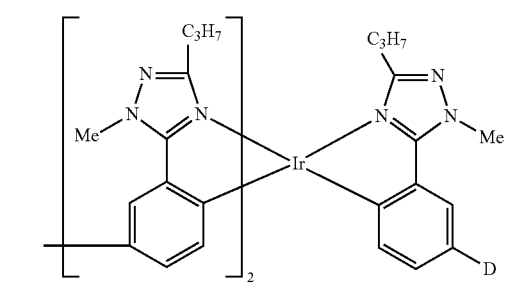
(B-4)
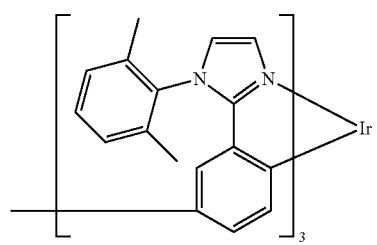
(B-5)
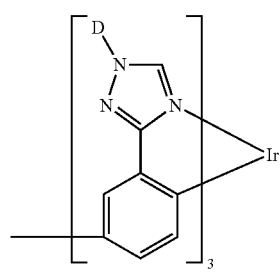
(B-6)
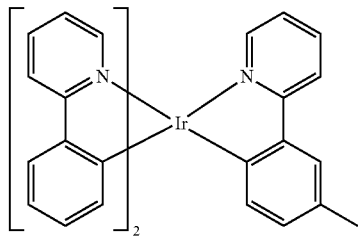
(B-7)
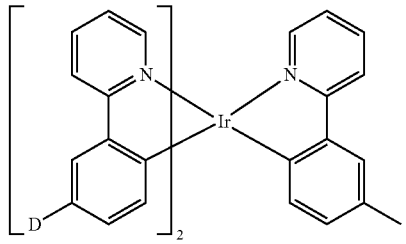
(B-8)
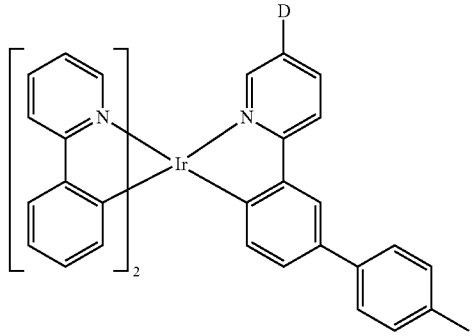
(B-9)
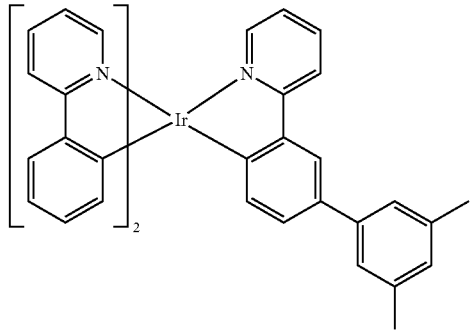
(B-10)
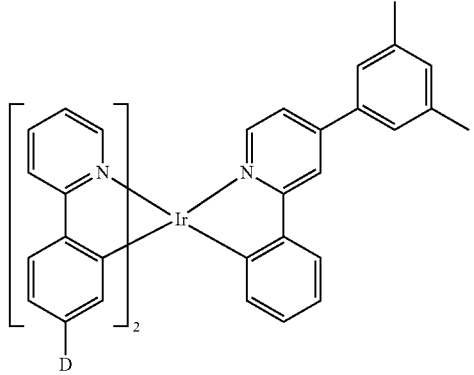

(B-11) 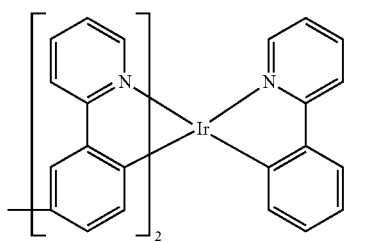
(B-12) 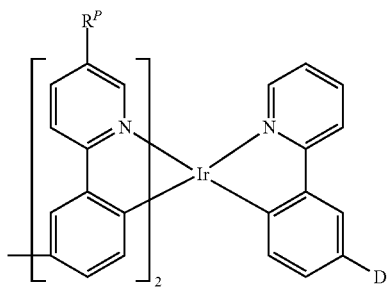
(B-13) 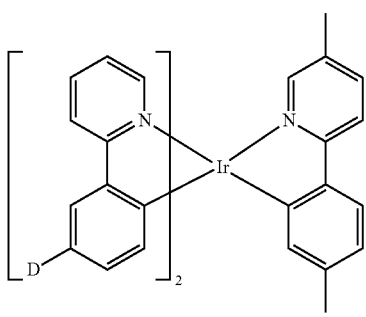
(B-14) 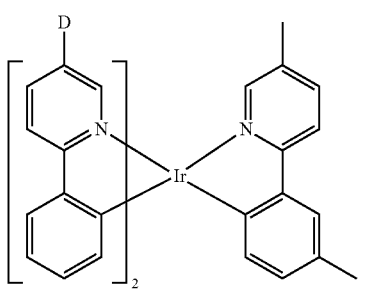
(B-15) 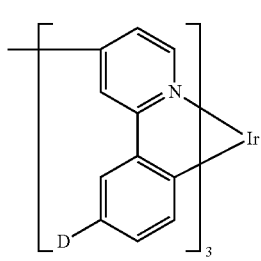
(B-16) 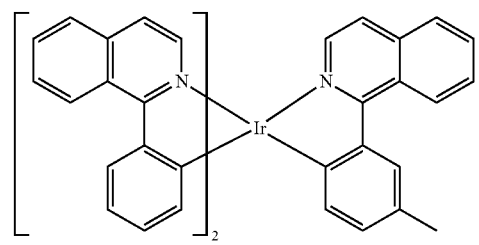
(B-17) 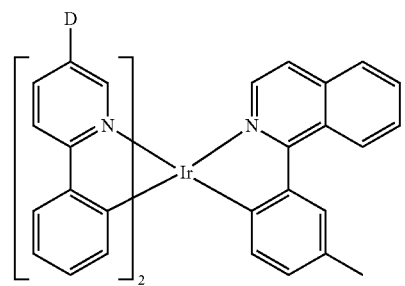
(B-18) 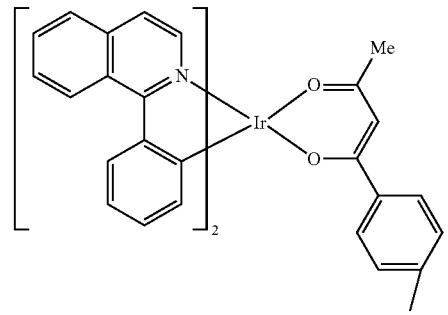
(B-19) 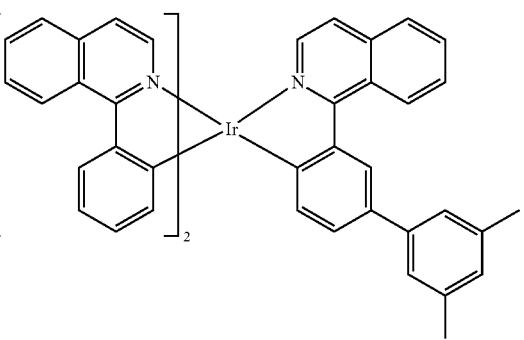
(B-20) 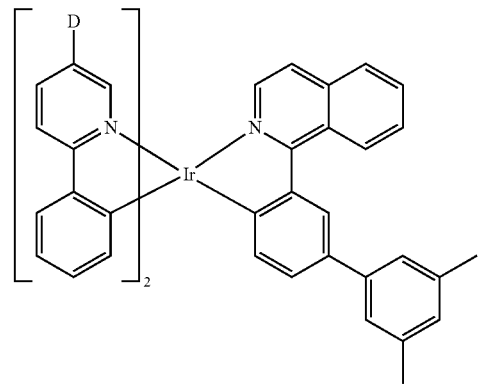

-continued

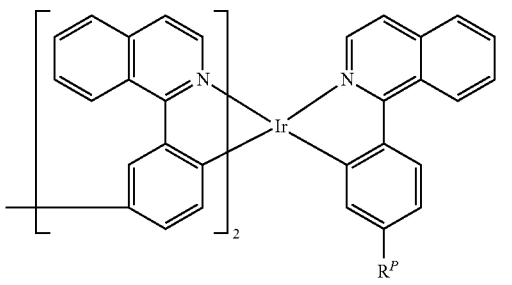
(B-21)

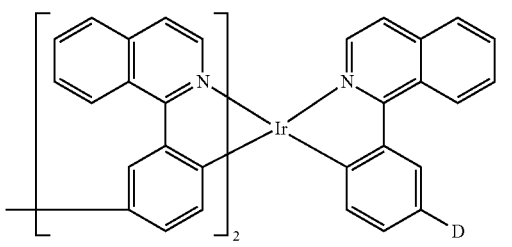
(B-22)

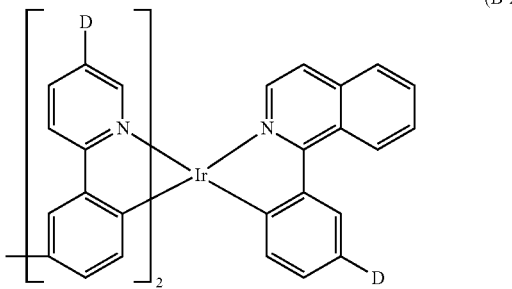
(B-23)

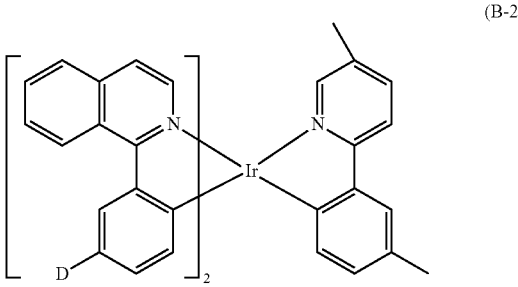
(B-24)

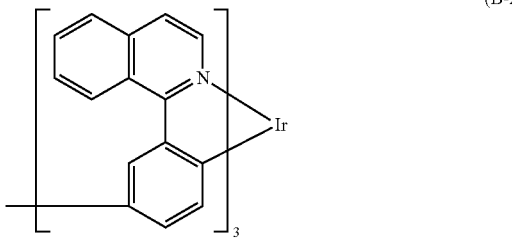
(B-25)

[wherein,

D represents a group represented by the formula (2). When a plurality of D are present, they may be the same or different.

$R^P$ represents a hydrogen atom, an alkyl group, a cycloalkyl group, an alkoxy group or a cycloalkoxy group, and these groups each optionally have a substituent.].

The amount of the phosphorescent constitutional unit is preferably 0.5 to 50 mol %, more preferably 1 to 30 mol %, further preferably 3 to 15 mol %, with respect to the total amount of constitutional units contained in the second polymer compound, because a light emitting device produced by using the composition of the present invention is excellent in light emission efficiency.

The phosphorescent constitutional unit may be contained singly or two or more of the constitutional units may be contained in the second polymer compound.

It is preferable that the second polymer compound further comprises a constitutional unit represented by the formula (Y). The definition and examples of the constitutional unit represented by the formula (Y) are the same as the definition and examples of the constitutional unit represented by the formula (Y) contained in the first polymer compound described above.

The amount of the constitutional unit represented by the formula (Y) in which $Ar^{Y1}$ is an arylene group is preferably 0.5 to 90 mol %, more preferably 30 to 80 mol %, with respect to the total amount of constitutional units contained in the second polymer compound, because a light emitting device produced by using the composition of the present invention is excellent in light emission efficiency.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol %, with respect to the total amount of constitutional units contained in the second polymer compound, because a light emitting device produced by using the composition of the present invention is excellent in charge transportability.

The constitutional unit represented by the formula (Y) may be contained singly or two or more of the constitutional units may be contained in the second polymer compound.

It is preferable that the second polymer compound further comprises a constitutional unit represented by the formula (X), because a light emitting device produced by using the composition of the present invention is excellent in hole transportability. The definition and examples of the constitutional unit represented by the formula (X) are the same as the definition and examples of the constitutional unit represented by the formula (X) contained in the first polymer compound described above.

The amount of the constitutional unit represented by the formula (X) is preferably 0.1 to 50 mol %, more preferably 1 to 40 mol %, further preferably 5 to 30 mol %, with respect to the total amount of constitutional units contained in the second polymer compound, because a light emitting device produced by using the composition of the present invention is excellent in hole transportability.

The constitutional unit represented by the formula (X) may be contained singly or two or more of the constitutional units may be contained in the second polymer compound.

The second polymer compound has a polystyrene-equivalent weight-average molecular weight of preferably $1 \times 10^4$ to $5 \times 10^5$ and a polystyrene-equivalent number-average molecular weight of preferably $2 \times 10^3$ to $4 \times 10^8$.

The second polymer compound includes, for example, polymer compounds (P-8) to (P-14) shown in Table 2. "Other" constitutional unit denotes a constitutional unit other than the constitutional unit represented by the formula (Y) and the constitutional unit represented by the formula (X).

TABLE 2

| | constitutional unit and mole fraction thereof | | | | | |
|---|---|---|---|---|---|---|
| | formula (Y) | | | formula (X) | phosphorescent constitutional | |
| polymer compound | formulae (Y-1) to (Y-3) p' | formulae (Y-4) to (Y-7) q' | formulae (Y-8) to (Y-10) r' | formulae (X-1) to (X-7) s' | unit formulae (1B) to (4B) t' | others u' |
| (P-8) | 0.1 to 99.8 | 0.1 to 99.8 | 0 | 0 | 0.1 to 50.0 | 0 to 30 |
| (P-9) | 0.1 to 99.8 | 0 | 0.1 to 99.8 | 0 | 0.1 to 50.0 | 0 to 30 |
| (P-10) | 0.1 to 99.8 | 0 | 0 | 0.1 to 99.8 | 0.1 to 50.0 | 0 to 30 |
| (P-11) | 0.1 to 99.7 | 0.1 to 99.7 | 0.1 to 99.7 | 0 | 0.1 to 50.0 | 0 to 30 |
| (P-12) | 0.1 to 99.7 | 0.1 to 99.7 | 0 | 0.1 to 99.7 | 0.1 to 50.0 | 0 to 30 |
| (P-13) | 0.1 to 99.7 | 0 | 0.1 to 99.7 | 0.1 to 99.7 | 0.1 to 50.0 | 0 to 30 |
| (P-14) | 0.1 to 99.6 | 0.1 to 99.6 | 0.1 to 99.6 | 0.1 to 99.6 | 0.1 to 50.0 | 0 to 30 |

[in the table, p', q', r', s', t' and u' represent the mole fraction of each constitutional unit. p'+q'+r'+s'+t'+u'=100 and 100≥p'+q'+r'+s'+t'≥70. The other constitutional unit denotes a constitutional unit other than the constitutional unit represented by the formula (Y), the constitutional unit represented by the formula (X) and the phosphorescent constitutional unit.]

<Composition>

The composition of the present invention will be illustrated.

The composition of the present invention is a composition comprising the first polymer compound and a phosphorescent compound (hereinafter, referred to also as "composition A".).

In the composition A, the first polymer compound may be contained singly, or two or more of the polymer compounds may be contained. In the composition A, the phosphorescent compound may be contained singly, or two or more of the phosphorescent compounds may be contained.

In the composition A, the content of the phosphorescent compound is usually 1 to 80 parts by weight when the sum of the first polymer compound and the phosphorescent compound is 100 parts by weight, and the content is preferably 3 to 60 parts by weight, more preferably 5 to 50 parts by weight, further preferably 7 to 40 parts by weight, because a light emitting device produced by using the composition A is excellent in luminance life.

The composition A may further comprise a polymer compound comprising at least one constitutional unit selected from the group consisting of a constitutional unit represented by the formula (Y) and a constitutional unit represented by the formula (X) (hereinafter, referred to also as "fourth polymer compound".). The definition and examples of the constitutional unit represented by the formula (Y) which may be contained in the fourth polymer compound are the same as the definition and examples of the constitutional unit represented by the formula (Y) contained in the first polymer compound described above. The definition and examples of the constitutional unit represented by the formula (X) which may be contained in the fourth polymer compound are the same as the definition and examples of the constitutional unit represented by the formula (X) which may be contained in the first polymer compound described above. The preferable range of the molecular weight of the fourth polymer compound is the same as that of the first polymer compound described above. In the composition A, the fourth polymer compound may be contained singly, or two or more of the polymer compounds may be contained.

When the composition A comprises the fourth polymer compound, the amount thereof is usually 1 to 80 parts by weight with respect to 100 parts by weight the first polymer compound.

The composition of the present invention may be a composition comprising the first polymer compound and the second polymer compound (hereinafter, referred to also as "composition B".).

In the composition B, the first polymer compound may be contained singly, or two or more of the polymer compounds may be contained. In the composition B, the second polymer compound may be contained singly, or two or more of the polymer compounds may be contained.

In the composition B, the content of the second polymer compound is usually 1 to 80 parts by weight when the sum of the first polymer compound and the second polymer compound is 100 parts by weight, and the content is preferably 3 to 60 parts by weight, more preferably 5 to 50 parts by weight, because a light emitting device produced by using the composition B is excellent in luminance life.

<Polymer Compound of Other Embodiment>

A polymer compound comprising a constitutional unit represented by the formula (Y), at least one constitutional unit selected from the group consisting of a constitutional unit represented by the formula (Ia), a constitutional unit represented by the formula (Ib), a constitutional unit represented by the formula (Ic) and a constitutional unit represented by the formula (Id), and a phosphorescent constitutional unit (hereinafter, referred to also as "third polymer compound".) performs the same effect as that of the composition of the present invention.

The definition and examples of the constitutional unit represented by the formula (Y) contained in the third polymer compound are the same as the definition and examples of the constitutional unit represented by the formula (Y) contained in the first polymer compound described above.

The amount of the constitutional unit represented by the formula (Y) in which $Ar^{Y1}$ is an arylene group is preferably 0.5 to 90 mol %, more preferably 30 to 80 mol %, with respect to the total amount of constitutional units contained in the third polymer compound, because a light emitting device produced by using the third polymer compound is excellent in light emission efficiency.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol %, with respect to the total amount of constitutional units contained in the third polymer compound, because a light emitting device produced by using the third polymer compound is excellent in charge transportability.

The constitutional unit represented by the formula (Y) may be contained singly or two or more of the constitutional units may be contained in the third polymer compound.

The definition and examples of the at least one constitutional unit selected from the group consisting of a constitutional unit represented by the formula (Ia), a constitutional unit represented by the formula (Ib), a constitutional unit represented by the formula (Ic) and a constitutional unit represented by the formula (Id) contained in the third polymer compound are the same as the definition and examples of the at least one constitutional unit selected from the group consisting of a constitutional unit represented by the formula (Ia), a constitutional unit represented by the formula (Ib), a constitutional unit represented by the formula (Ic) and a constitutional unit represented by the formula (Id) contained in the first polymer compound described above.

The amounts of a constitutional unit represented by the formula (Ia), a constitutional unit represented by the formula (Ib), a constitutional unit represented by the formula (Ic) and a constitutional unit represented by the formula (Id) are each preferably 0.1 to 10 mol %, more preferably 0.1 to 5 mol %, further preferably 0.1 to 3 mol %, with respect to the total amount of constitutional units contained in the third polymer compound, because a light emitting device produced by using third polymer compound is excellent in electron transportability.

The constitutional unit represented by the formula (Ia), the constitutional unit represented by the formula (Ib), the constitutional unit represented by the formula (Ic) and the constitutional unit represented by the formula (Id) each may be contained singly or two or more of each of the constitutional units may be contained in the third polymer compound.

It is preferable that the third polymer compound further comprises a constitutional unit represented by the formula (X), because a light emitting device produced by using the third polymer compound is excellent in hole transportability. The definition and examples of the constitutional unit represented by the formula (X) are the same as the definition and examples of the constitutional unit represented by the formula (X) which may be contained in the first polymer compound described above.

The amount of the constitutional unit represented by the formula (X) is preferably 0.1 to 50 mol %, more preferably 1 to 40 mol %, further preferably 5 to 30 mol %, with respect to the total amount of constitutional units contained in the third polymer compound, because a light emitting device produced by using the third polymer compound is excellent in hole transportability.

The constitutional unit represented by the formula (X) may be contained singly or two or more of the constitutional units may be contained in the third polymer compound.

The definition and examples of the phosphorescent constitutional unit contained in the third polymer compound are the same as the definition and examples of the phosphorescent constitutional unit contained in the second polymer compound described above.

The amount of the phosphorescent constitutional unit is preferably 0.5 to 50 mol %, more preferably 1 to 30 mol %, further preferably 3 to 15 mol %, with respect to the total amount of constitutional units contained in the third polymer compound, because a light emitting device produced by using the third polymer compound is excellent in light emission efficiency.

The phosphorescent constitutional unit may be contained singly or two or more of the phosphorescent constitutional units may be contained in the third polymer compound.

The third polymer compound has a polystyrene-equivalent weight-average molecular weight of preferably $1 \times 10^4$ to $5 \times 10^5$ and a polystyrene-equivalent number-average molecular weight of preferably $2 \times 10^3$ to $4 \times 10^5$.

The third polymer compound includes, for example, polymer compounds (P-15) to (P-21) shown in Table 3.

TABLE 3

| | constitutional unit and mole fraction thereof | | | | | | |
|---|---|---|---|---|---|---|---|
| | formula (Y) | | | formula (X) | phosphorescent | | |
| polymer compound | formulae (Y-1) to (Y-3) p" | formulae (Y-4) to (Y-7) q" | formulae (Y-8) to (Y-10) r" | formulae (X-1) to (X-7) s" | constitutional unit formulae (1B) to (4B) t" | formulae (Ia) to (Id) u" | others v" |
| (P-15) | 0.1 to 99.7 | 0.1 to 99.7 | 0 | 0 | 0.1 to 50.0 | 0.1 to 10.0 | 0 to 30 |
| (P-16) | 0.1 to 99.7 | 0 | 0.1 to 99.7 | 0 | 0.1 to 50.0 | 0.1 to 10.0 | 0 to 30 |
| (P-17) | 0.1 to 99.7 | 0 | 0 | 0.1 to 99.7 | 0.1 to 50.0 | 0.1 to 10.0 | 0 to 30 |
| (P-18) | 0.1 to 99.6 | 0.1 to 99.6 | 0.1 to 99.6 | 0 | 0.1 to 50.0 | 0.1 to 10.0 | 0 to 30 |
| (P-19) | 0.1 to 99.6 | 0.1 to 99.6 | 0 | 0.1 to 99.6 | 0.1 to 50.0 | 0.1 to 10.0 | 0 to 30 |
| (P-20) | 0.1 to 99.6 | 0 | 0.1 to 99.6 | 0.1 to 99.6 | 0.1 to 50.0 | 0.1 to 10.0 | 0 to 30 |
| (P-21) | 0.1 to 99.5 | 0.1 to 99.5 | 0.1 to 99.5 | 0.1 to 99.5 | 0.1 to 50.0 | 0.1 to 10.0 | 0 to 30 |

[in the table, p", q", r", s", t", u" and v" represent the mole fraction of each constitutional unit. p"+q"+r"+s"+t"+u"+v"=100 and 100≥p"+q"+r"+s"+t"+u"≥70. The other constitutional unit denotes a constitutional unit other than the constitutional unit represented by the formula (Y), the constitutional unit represented by the formula (X), the phosphorescent constitutional unit and the constitutional unit represented by the formula (Ia) to the formula (Id).]

<Production Method of Polymer Compound>

The first to third polymer compounds may be any of a block copolymer, a random copolymer, an alternative copolymer and a graft copolymer or may be a polymer compound of the other embodiment, and are preferably a copolymer produced by copolymerizing several raw material monomers.

The first polymer compound can be produced, for example, by condensation-polymerizing a compound represented by the formula (M-Y1), at least one compound selected from the group consisting of a compound represented by the formula (M-Y2) and a compound represented by the formula (M-X), and at least one compound selected from the group consisting of a compound represented by the formula (M-Ia), a compound represented by the formula (M-Ib), a compound represented by the formula (M-Ic) and a compound represented by the formula (M-Id).

When a compound represented by the formula (M-Ic) and a compound represented by the formula (M-Id) are used, these compounds are used as an end-capping agent.

The second polymer compound can be produced, for example, by condensation-polymerizing a compound represented by the formula (M-Y1), at least one compound selected from the group consisting of a compound represented by the formula (M-Y2) and a compound represented by the formula (M-X), and at least one compound selected from the group consisting of a compound represented by the formula (M-1B), a compound represented by the formula (M-2B), a compound represented by the formula (M-3B) and a compound represented by the formula (M-4B).

When a compound represented by the formula (M-1B) is used, this compound is used as an end-capping agent.

Third polymer compound can be produced, for example, by condensation-polymerizing a compound represented by the formula (M-Y1), at least one compound selected from the group consisting of a compound represented by the formula (M-Y2) and a compound represented by the formula (M-X), at least one compound selected from the group consisting of a compound represented by the formula (M-Ia), a compound represented by the formula (M-Ib), a compound represented by the formula (M-Ic) and a compound represented by the formula (M-Id), and at least one compound selected from the group consisting of a compound represented by the formula (M-1B), a compound represented by the formula (M-2B), a compound represented by the formula (M-3B) and a compound represented by the formula (M-4B).

When a compound represented by the formula (M-Ic), a compound represented by the formula (M-Id) and a compound represented by the formula (M-1B) are used, these compounds are used as an end-capping agent.

In the present specification, compounds used in production of the first to third polymer compounds are collectively called "raw material monomer" in some cases.

 (M-Y1)

 (M-Y2)

 (M-X)

 (M-Ia)

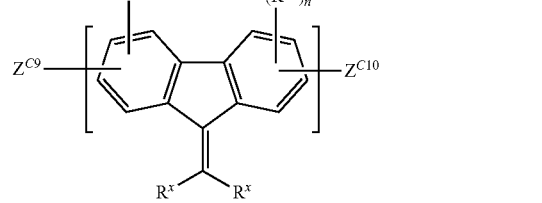 (M-Ib)

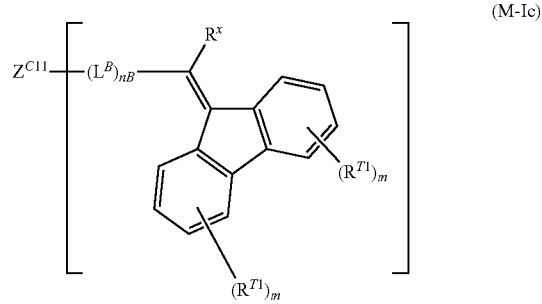 (M-Ic)

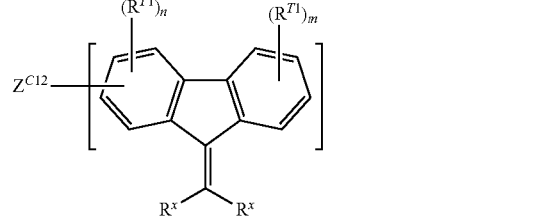 (M-Id)

 (M-1B)

 (M-2B)

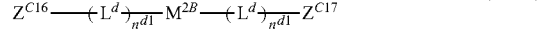 (M-3B)

-continued (M-4B)

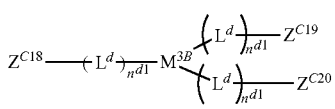

[wherein,

Ar$^{Y1}$, Ar$^{X1}$ to Ar$^{X4}$, R$^{X1}$, R$^{X2}$, R$^{X3}$, a$^{X1}$, a$^{X2}$, m, n, R$^{Y1}$, R$^x$, Ar, nA, L$^A$, nB, L$^B$, L$^c$ to L$^e$, M$^{1B}$ to M$^{3B}$, n$^{c1}$, n$^{d1}$ and n$^{e1}$ represent the same meaning as described above.

Z$^{C1}$ to Z$^{C20}$ each independently represent a group selected from the group consisting of Group A of substituent and Group B of substituent.]

For example, when Z$^{C1}$ and Z$^{C2}$ are a group selected from Group A of substituent, a group selected from Group B of substituent is selected for Z$^{C3}$ to Z$^{C20}$.

For example, when Z$^{C1}$ and Z$^{C2}$ are a group selected from Group B of substituent, a group selected from Group A of substituent is selected for Z$^{C3}$ to Z$^{C20}$.

<Group A of Substituent>

A chlorine atom, a bromine atom, an iodine atom and a group represented by —O—S(=O)$_2$R$^{C1}$ (wherein, R$^{C1}$ represents an alkyl group, a cycloalkyl group or an aryl group, and these groups each optionally have a substituent.).

<Group B of Substituent>

A group represented by —B(OR$^{C2}$)$_2$ (wherein, R$^{C2}$ represents a hydrogen atom, an alkyl group, a cycloalkyl group or an aryl group, and these groups each optionally have a substituent. The plurality of R$^{C2}$ may be the same or different and may be combined together to form a cyclic structure together with the oxygen atoms to which they are attached.);

a group represented by —BF$_3$Q' (wherein, Q' represents Li, Na, K, Rb or Cs.);

a group represented by —MgY$^1$ (wherein, Y' represents a chlorine atom, a bromine atom or an iodine atom.);

a group represented by —ZnY'' (wherein, Y'' represents a chlorine atom, a bromine atom or an iodine atom.); and a group represented by —Sn(R$^{C3}$)$_3$ (wherein, R$^{C3}$ represents a hydrogen atom, an alkyl group, a cycloalkyl group or an aryl group, and these groups each optionally have a substituent. The plurality of R$^{C3}$ may be the sane or different and may be combined together to form a cyclic structure together with the tin atom to which they are attached.).

As the group represented by —B(OR$^{C2}$)$_2$, groups represented by the following formulae are exemplified.

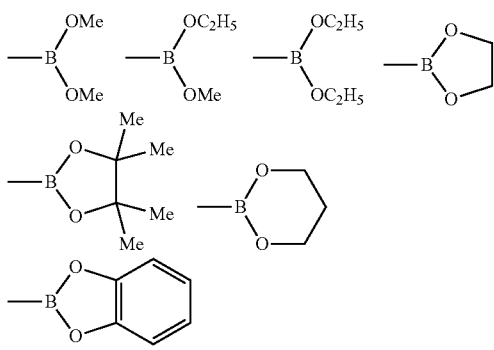

The compound having a group selected from Group A of substituent and the compound having a group selected from Group B of substituent undergo condensation polymerization by a known coupling reaction, thereby giving mutual bonding of carbon atoms linking the group selected from Group A of substituent and the group selected from Group B of substituent. Therefore, when a compound having one or more groups selected from Group A of substituent and a compound having one or more groups selected from Group B of substituent are subjected to a known coupling reaction, a condensed polymer of these compounds can be produced by condensation polymerization.

The condensation polymerization is carried out usually in the presence of a catalyst, a base and a solvent, and if necessary, a phase transfer catalyst may coexist.

The catalyst includes, for example, transition metal complexes such as palladium complexes such as dichlorobis(triphenylphosphine)palladium, dichlorobis(tris-o-methoxyphenylphosphine)palladium, palladium[tetrakis(triphenylphosphine)], [tris(dibenzylideneacetone)]dipalladium and palladium acetate, nickel complexes such as nickel[tetrakis(triphenylphosphine)], [1,3-bis(diphenylphosphino)propane]dichloronickel and [bis(1,4-cyclooctadiene)]nickel; these transition metal complexes further having a ligand such as triphenylphosphine, tri-o-tolylphosphine, tri(tert-butylphosphine), tricyclohexylphosphine, diphenylphosphinopropane and bipyridyl. The catalysts may be used singly or in combination.

The use amount of the catalyst is usually 0.00001 to 3 molar equivalents in terms of the amount of a transition metal with respect to the sum of the molar numbers of raw material monomers.

The base includes, for example, inorganic bases such as sodium carbonate, potassium carbonate, cesium carbonate, potassium fluoride, cesium fluoride and tripotassium phosphate; organic bases such as tetrabutylammonium fluoride and tetrabutylammonium hydroxide. The bases each may be used singly or in combination.

The phase transfer catalyst include, for example, tetrabutylammonium chloride, tetrabutylammonium bromide and the like. The phase transfer catalysts each may be used singly or in combination.

The use amount of the base is each usually 0.001 to 100 molar equivalents with respect to the total molar number of raw material monomers.

The use amount of the phase transfer catalyst is each usually 0.001 to 100 molar equivalents with respect to the total molar number of raw material monomers.

The solvent includes, for example, organic solvents such as toluene, xylene, mesitylene, tetrahydrofuran, 1,4-dioxane, dimethoxyethane, N,N-dimethylacetamide and N,N-dimethylformamide; and water. The solvent may be used singly, or two or more solvents may be used in combination.

The use amount of the solvent is usually 10 to 100000 parts by weight with respect to 100 parts by weight of the total amount of raw material monomers.

The reaction temperature of condensation polymerization is usually –100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the polymer compound has a low purity, the polymer host can be purified by a usual method, such as recrystallization, reprecipitation, continuous extraction by a Soxhlet extractor and column chromatography.

<Other Component>

The composition of the present invention may further comprise at least one material selected from the group consisting of a hole transporting material, a hole injection material, an electron transporting material, an electron injection material, a light emitting material (the light emitting material is different from the phosphorescent compound.), an antioxidant and a solvent.

The composition of the present invention may be a composition comprising the third polymer compound and at least one material selected from the group consisting of a hole transporting material, a hole injection material, an electron transporting material, an electron injection material, a light emitting material (the light emitting material is different from a phosphorescent compound.), an antioxidant and a solvent.

The composition comprising a solvent (hereinafter, referred to as "ink".) is suitable for fabrication of a light emitting device by using an application method such as an inkjet printing method and a nozzle printing method.

The viscosity of the ink may be adjusted depending on the kind of the application method, and when a solution goes through a discharge apparatus such as in an inkjet printing method, the viscosity is preferably in the range of 1 to 20 mPa·s at 25° C. because logging in discharging and curved aviation are unlikely.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as THF, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; polyhydric alcohol solvents such as ethylene glycol, glycerin and 1,2-hexanediol; alcohol solvents such as isopropylalcohol and cyclohexanol; sulfoxide solvents such as dimethyl sulfoxide; and amide solvents such as N-methyl-2-pyrrolidone and N,N-dimethylformamide. These solvents may be used singly, or two or more of them may be used in combination.

In the ink, the compounding amount of the solvent is usually 1000 to 100000 parts by weight, preferably 2000 to 20000 parts by weight when the sum of the first polymer compound, and the phosphorescent compound or the second polymer compound is 100 parts by weight (or when the third polymer compound is 100 parts by weight).

[Hole Transporting Material]

The hole transporting material is classified into low molecular weight compounds and polymer compounds, and polymer compounds are preferable, and polymer compounds having a crosslinkable group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone, preferably fullerene.

In the composition of the present invention, the compounding amount of the hole transporting material is usually 1 to 400 parts by weight, preferably 5 to 150 parts by weight when the sum of the first polymer compound, and the phosphorescent compound or the second polymer compound is 100 parts by weight (or when the third polymer compound is 100 parts by weight).

The hole transporting material may be used singly, or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight when the sum of the first polymer compound, and the phosphorescent compound or the second polymer compound is 100 parts by weight (or when the third polymer compound is 100 parts by weight).

The electron transporting material may be used singly, or two or more electron transporting materials may be used in combination.

[Hole Injection Material and Electron Injection Material]

The hole injection material and the electron injection material are each classified into low molecular weight compounds and polymer compounds. The hole injection material and the electron injection material optionally have a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the side chain or main chain.

In the composition of the present invention, the compounding amounts of the hole injection material and the electron injection material are each usually 1 to 400 parts by weight, preferably 5 to 150 parts by weight when the sum of the first polymer compound, and the phosphorescent compound or the second polymer compound is 100 parts by weight (or when the third polymer compound is 100 parts by weight).

The hole injection material and the electron injection material may each be used singly, or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly, or two or more ions to be doped may be used.

[Light Emitting Material]

The light emitting material (the light emitting material is different form the phosphorescent compound.) is classified into low molecular weight compounds and polymer compounds. The light emitting material optionally has a crosslinkable group.

The low molecular weight compound includes, for example, naphthalene and derivatives thereof, anthracene and derivatives thereof, and perylene and derivatives thereof.

The polymer compound includes, for example, polymer compounds comprising a phenylene group, a naphthalenediyl group, a fluorenediyl group, a phenanthrenediyl group, dihydrophenanthrenediyl group, a group represented by the formula (X), a carbazolediyl group, a phenoxazinediyl group, a phenothiazinediyl group, an anthracenediyl group, a pyrenediyl group and the like.

In the composition of the present invention, the compounding amount of the light emitting material is usually 0.1 to 400 parts by weight when the sum of the first polymer compound, and the phosphorescent compound or the second polymer compound is 100 parts by weight (or when the third polymer compound is 100 parts by weight).

[Antioxidant]

The antioxidant may advantageously be one which is soluble in the same solvent as for the first polymer compound, and the phosphorescent compound or the second polymer compound (or soluble in the same solvent as for the third polymer compound), and does not disturb light emission and charge transportation, and the examples thereof include phenol-based antioxidants and phosphorus-based antioxidants.

In the composition of the present invention, the compounding amount of the antioxidant is usually 0.001 to 10 parts by weight when the sum of the first polymer compound, and the phosphorescent compound or the second polymer compound is 100 parts by weight (or when the third polymer compound is 100 parts by weight).

The antioxidant may be used singly, or two or more antioxidants may be used in combination.

<Film>

The film comprises the first polymer compound, and the phosphorescent compound or the second polymer compound. The film may be one comprising the third polymer compound.

The film also includes an insolubilized film produced by insolubilizing the first polymer compound or the phosphorescent compound or the second polymer compound (or the third polymer compound) in a solvent by crosslinking. The insolubilized film is a film produced by crosslinking the first polymer compound or the phosphorescent compound or the second polymer compound (or the third polymer compound) by an external stimulus such as heating and light irradiation. The insolubilized film can be suitably used for lamination of a light emitting device because the insolubilized film is substantially insoluble in a solvent.

The heating temperature for crosslinking the film is usually 25 to 300° C., and because the light emission efficiency is improved, preferably 50 to 250° C., more preferably 150 to 200° C.

The kind of light used in light irradiation for crosslinking the film includes, for example, ultraviolet light, near-ultraviolet light and visible light.

The film is suitable as a light emitting layer, a hole transporting layer or a hole injection layer in a light emitting device.

The film can be fabricated, for example, by a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method or a nozzle coating method, using the ink.

The thickness of the film is usually 1 nm to 10 μm.

<Light Emitting Device>

The light emitting device of the present invention is a light emitting device produced by using the composition of the present invention, and may be one in which the first polymer compounds or the phosphorescent compounds or the second polymer compounds (or the third polymer compounds) are intramolecularly or intermolecularly cross-linked, or one in which the first polymer compounds or the phosphorescent compounds or the second polymer compounds (or the third polymer compounds) are intramolecularly and intermolecularly cross-linked.

The constitution of the light emitting device of the present invention comprises, for example, electrodes consisting of an anode and a cathode, and a layer produced by using the metal complex of the present invention disposed between the electrodes.

[Layer Constitution]

The layer obtained by using the composition of the present invention (or the third polymer compound) is usually at least one selected from a light emitting layer, a hole transporting layer, a hole injection layer, an electron transporting layer and an electron injection layer, preferably a light emitting layer. These layers comprise a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the composition of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer are controlled in view of external quantum efficiency and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium•tin•oxide (ITO) and indium•zinc•oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For producing planar light emission by using a light emitting device, a planar anode and a planar cathode are disposed so as to overlap with each other. Patterned light emission can be produced by a method of placing a mask with a patterned window on the surface of a planer light emitting device, a method of forming an extremely thick layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in tetrahydrofuran at a concentration of about 0.05 wt %, and 10 µL of the solution was injected into SEC. As the mobile phase of SEC, tetrahydrofuran was used and allowed to flow at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

Measurement of NMR was carried out according to the following method.

5 to 10 mg of a measurement sample was dissolved in about 0.5 mL of deuterated chloroform ($CDCl_3$), deuterated tetrahydrofuran (THF-$d_8$) or deuterated methylene chloride ($CD_2Cl_2$), and measurement was performed using an NMR apparatus (manufactured by Agilent, Inc., trade name: INOVA 300 or MERCURY 400VX).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise stated. In this operation, the compound to be measured was dissolved in tetrahydrofuran or chloroform so as to give a concentration of 0.01 to 0.2 wt %, and depending on the concentration, 1 to 10 μL of the solution was injected into HPLC. As the mobile phase of HPLC, acetonitrile and tetrahydrofuran were used and allowed to flow at a flow rate of 1 mL/min as gradient analysis of acetonitrile/tetrahydrofuran 100/0 to 0/100 (volume ratio). As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

<Synthesis Example 1> Synthesis of Compound G1

A compound G1 was synthesized according to a method described in International Publication WO2009/131255.

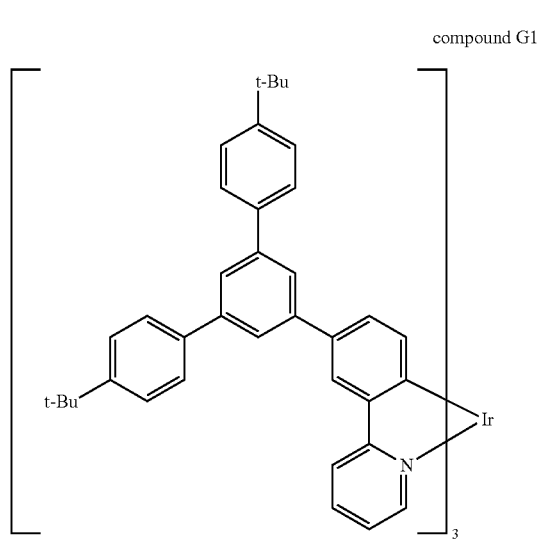

compound G1

<Synthesis Example 2> Synthesis of Compound R1

A compound R1 was synthesized according to a method described in JP-A No. 2006-188673.

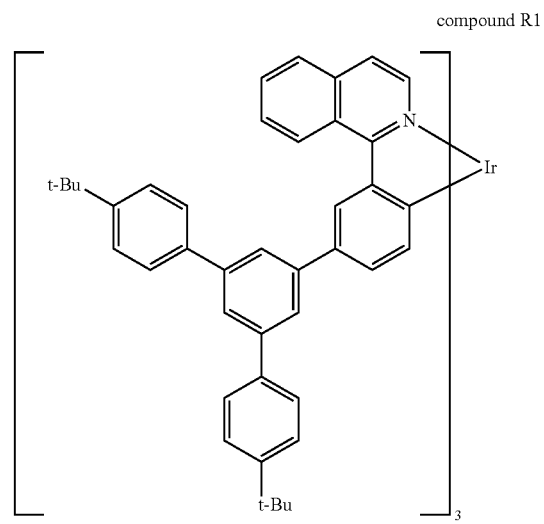

compound R1

<Synthesis Example 3> Synthesis of Compound R2

A compound R2 was synthesized according to a method described in JP-A No. 2008-179617.

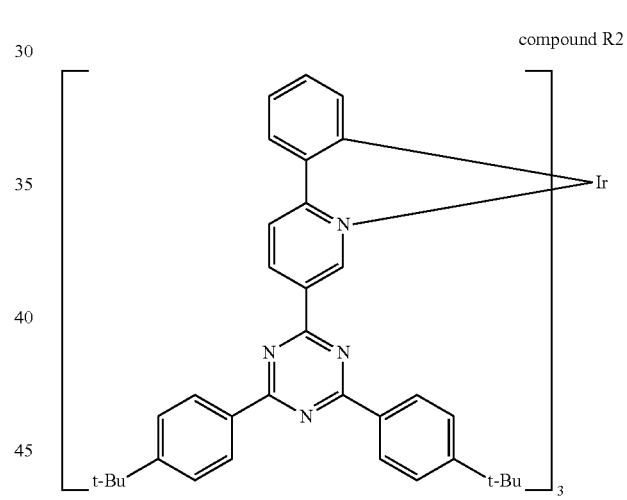

compound R2

The structures of monomers CM1 to CM11 used in synthesis of a polymer compound HP-1 and syntheses of polymer compounds EP-1 to EP-4 are shown below.

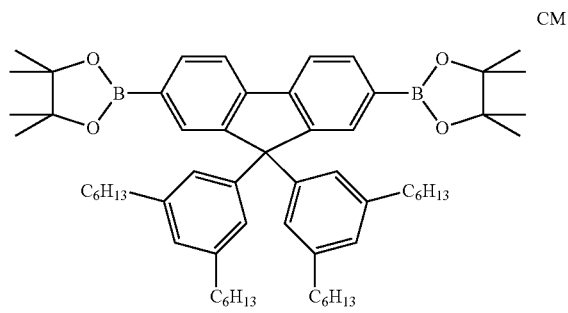

CM1

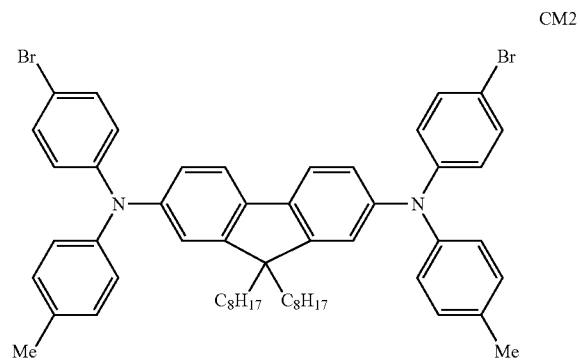

CM2

-continued
CM3
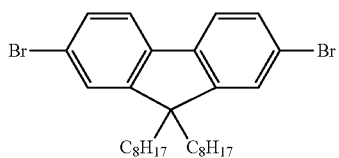
CM4
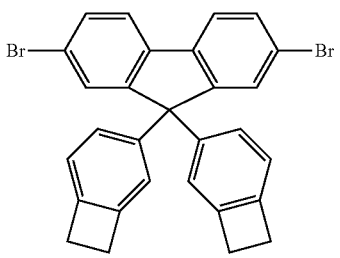
CM5
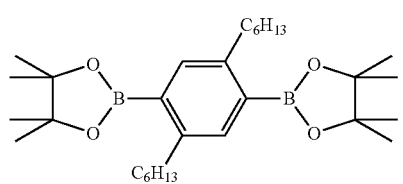
CM6
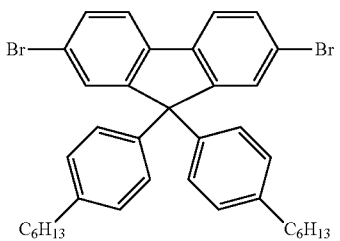
CM7
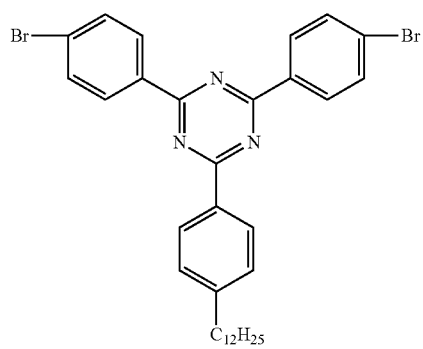
CM8
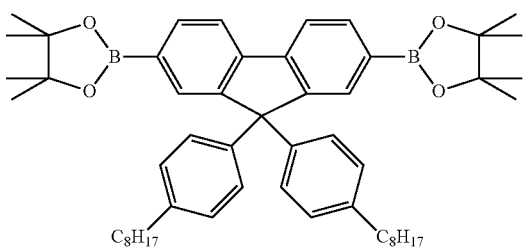
CM9
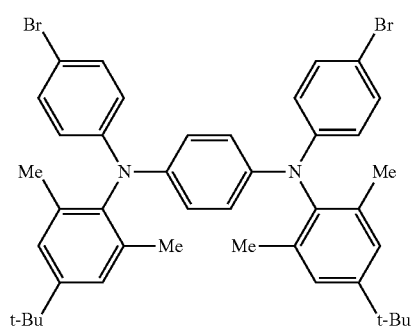
CM10
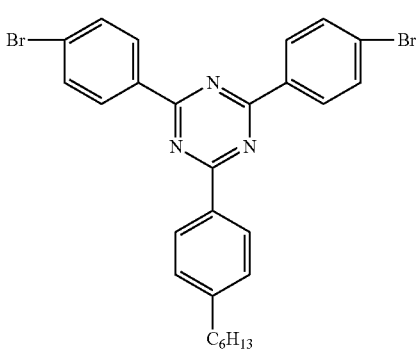
CM11
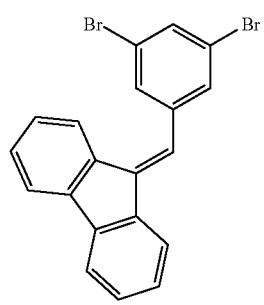
CM12
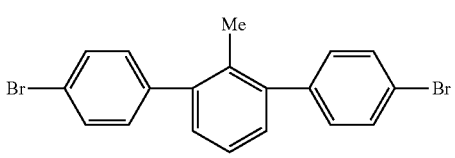

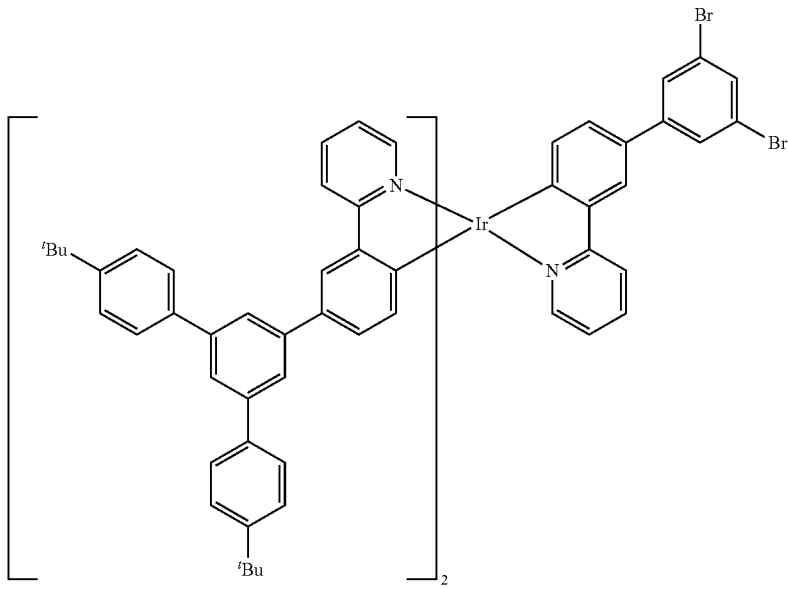

CM13

A monomer CM1 was synthesized according to a synthesis method described in JP-A No. 2011-174062.

A monomer CM2 was synthesized according to a method described in International Publication WO2005/049546.

As a monomer CM3, a commercially available compound was used.

A monomer CM4 was synthesized according to a synthesis method described in JP-A No. 2008-106241.

A monomer CM5 was synthesized according to a synthesis method described in JP-A No. 2010-189630.

A monomer CM6 was synthesized according to a synthesis method described in International Publication WO2012/86671.

A monomer CM7 was synthesized according to a synthesis method described in JP-A No. 2010-189630.

A monomer CM8 was synthesized according to a method described below.

A monomer CM9 was synthesized according to a synthesis method described in JP-A No. 2004-143419.

A monomer CM10 was synthesized according to a method described in International Publication WO2009/131255.

A monomer CM11 was synthesized according to a method described below.

A monomer CM12 was synthesized according to a synthesis method described in JP-A No. 2012-131993.

A monomer CM13 was synthesized according to a method described in International Publication WO2013/021180.

<Synthesis Example 4> Synthesis of Monomer CM8

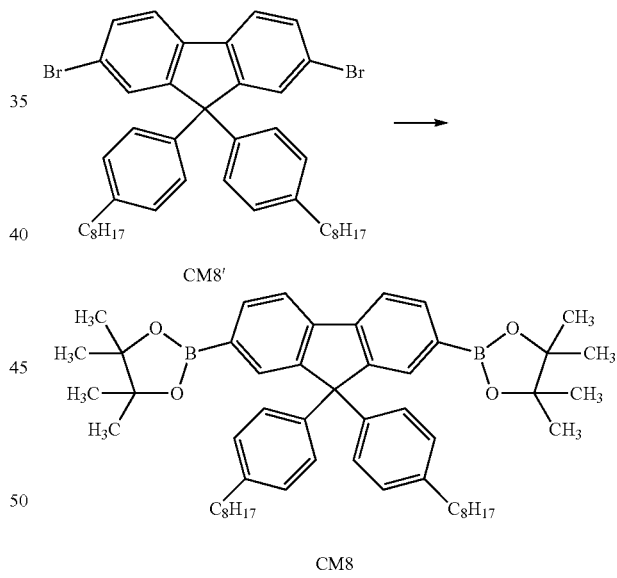

A compound CM8' was synthesized according to the synthesis method of the monomer CM6.

A nitrogen gas atmosphere was prepared in a reaction vessel, then, a compound CM8' (100 g) and tetrahydrofuran (dehydrated product, 1000 ml) were added, and the mixture was cooled to −70° C. or lower by using a dry ice/acetone bath. Thereafter, a 2.5 mol/L n-butyllithium-hexane solution (126 ml) was dropped into this over a period of 45 minutes while keeping a temperature of −70° C. or lower, and the mixture was stirred for 5 hours. Thereafter, 2-isopropoxy-4,4,5,5-tetramethyl-1,3,2-dioxaborolane (81 ml) was dropped into this over a period of 30 minutes while keeping a temperature of −70° C. or lower. Thereafter, the dry ice/acetone bath was removed, and the mixture was stirred overnight at room temperature. The resultant reaction mixture was cooled down to −30° C., and a 2M hydrochloric acid-diethyl ether solution was dropped to adjust pH to 6 to 7, then, the mixture was concentrated under reduced pressure, thereby obtaining a solid. To the resultant solid was added toluene, and the mixture was stirred at room temperature for 1 hour, then, the solution was allowed to pass through a filter paved with silica gel, thereby obtaining a filtrate. The resultant filtrate was concentrated under reduced pressure, thereby obtaining a solid. To the resultant solid was added methanol and the mixture was stirred, then, filtrated, thereby obtaining a solid. The resultant solid was purified by repeating recrystallization using isopropyl alcohol 4 times, then, dried under reduced pressure at 50° C. overnight, thereby obtaining a monomer CM8 (72 g) as a white solid. The resultant monomer CM8 showed a HPLC area percentage value (detection wavelength: UV 280 nm) of 99.0%.

$^1$H-NMR (400 MHz, CDCl$_3$) δ (ppm)=7.82 (d, 2H), 7.81 (s, 2H), 7.76 (d, 2H), 7.11 (d, 4H), 7.00 (d, 4H), 2.52 (t, 4H), 1.59 to 1.54 (m, 4H), 1.36 to 1.26 (m, 20H), 1.31 (s, 24H), 0.87 (t, 6H).

<Synthesis Example 5> Synthesis of Monomer CM11

(Step 1) Synthesis of Compound A

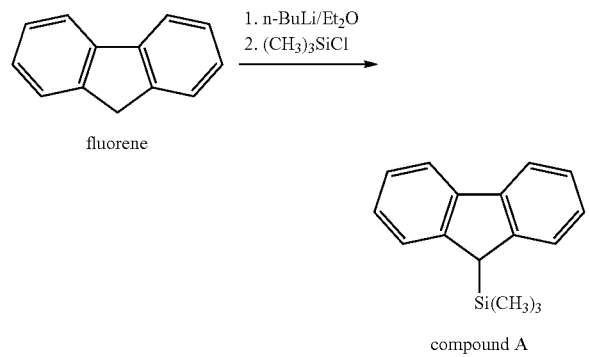

A nitrogen gas atmosphere was prepared in a reaction vessel, then, fluorene (50 g) and dehydrated diethyl ether (500 ml) were added, and the mixture was cooled to 10° C. or lower. Thereafter, into this, a n-butyllithium hexane solution (2.5 M, 138 ml) was dropped. The resultant reaction solution was heated up to room temperature, then, dropped into a mixed solution of chlorotrimethylsilane (46 ml) and dehydrated diethyl ether (700 ml) which had been cooled to 20° C. or lower in a separate reaction vessel. The resultant reaction solution was heated up to room temperature, and stirred overnight. The resultant reaction mixture was cooled to room temperature or lower, and water (10 ml) was dropped. The resultant reaction mixture was washed with water (250 ml) three times, then, separated into an aqueous layer and an organic layer. To the resultant organic layer was added anhydrous magnesium sulfate, and the mixture was stirred, then, filtrated, and the resultant filtrate was concentrated, thereby obtaining a solid. The resultant solid was recrystallized using n-hexane three times, thereby obtaining a compound A (25.8 g) as an orange solid. The yield was 36%.

$^1$H-NMR (300 MHz, CDCl$_3$) δ (ppm)=7.86 (d, 2H), 7.50 (d, 2H), 7.37-7.26 (m, 4H), 3.87 (s, 1H), −0.07 (s, 9H).

(Step 2) Synthesis of Monomer CM11

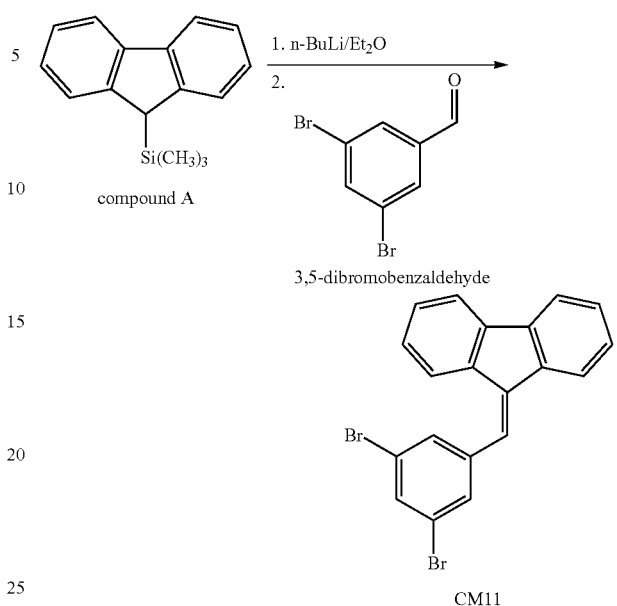

A nitrogen gas atmosphere was prepared in a reaction vessel, then, a compound A (25.8 g) and dehydrated diethyl ether (500 ml) were added, and the mixture was cooled to 10° C. or lower. Thereafter, in to this, a n-butyllithium hexane solution (2.5 M, 40 ml) was dropped, and the mixture was stirred for 15 minutes while cooling to 10° C. or lower. The resultant reaction solution was heated up to 25° C., then, 3,5-dibromobenzaldehyde (28.8 g) was added, and the mixture was stirred for 1.5 hours at 25° C. The resultant reaction mixture was cooled to 0° C., then, water (2 ml) was dropped, and the mixture was stirred. The resultant reaction mixture was washed with water (100 ml) three times, then, separated into an aqueous layer and an organic layer. To the resultant organic layer was added anhydrous magnesium sulfate, and the mixture was stirred, then, filtrated, and the resultant filtrate was concentrated, thereby obtaining a solid. The resultant solid was recrystallized using n-hexane three times, thereby obtaining a solid. The resultant solid was dissolved in a mixed solvent of toluene (50 ml) and n-hexane (500 ml) at 50° C., then, filtrated, and the resultant filtrate was concentrated down to about 200 mL. The resultant concentrated solution was cooled to room temperature or lower to obtain a solid which was then filtrated and dried, thereby obtaining a monomer CM11 (19.7 g) as a yellow solid. The yield was 49%. The resultant monomer CM11 showed a HPLC area percentage value of 99.5% or more.

$^1$H-NMR (300 MHz, CDCl$_3$) δ (ppm)=7.76 to 7.63 (m, 6H), 7.50 to 7.28 (m, 5H), 7.12 (dt, 1H).

<Synthesis Example 6> Synthesis of Polymer Compound HP-1

A polymer compound HP-1 was synthesized according to a synthesis method described in JP-A No. 2012-144722 by using monomers shown in Table 4 described below. The polymer compound HP-1 had a Mn of $1.0 \times 10^5$ and a Mw of $2.4 \times 10^5$. The polymer compound HP-1 is a copolymer constituted of constitutional units derived from respective monomers at a molar ratio shown in Table 4 described below according to the theoretical values calculated from the charged raw materials.

TABLE 4

| monomer | | CM1 | CM2 | CM3 | CM4 |
|---|---|---|---|---|---|
| HP-1 | molar ratio [mol %] | 50 | 30 | 12.5 | 7.5 |

<Synthesis Example 7> Synthesis of Polymer Compound EP-1

A polymer compound EP-1 was synthesized according to a synthesis method described in JP-A No. 2012-36388 by using monomers shown in Table 5 described below. The polymer compound EP-1 had a Mn of $5.8 \times 10^4$ and a Mw of $1.2 \times 10^5$. The polymer compound EP-1 is a copolymer constituted of constitutional units derived from respective monomers at a molar ratio shown in Table 5 described below according to the theoretical values calculated from the charged raw materials.

TABLE 5

| monomer | | CM5 | CM6 | CM7 |
|---|---|---|---|---|
| EP-1 | molar ratio [mol %] | 50 | 40 | 10 |

<Synthesis Example 8> Synthesis of Polymer Compound EP-2

(Step 1) An inert gas atmosphere was prepared in a reaction vessel, then, a monomer CM5 (3.94 g), a monomer CM6 (4.18 g), a monomer CM7 (1.06 g), a monomer CM11 (0.07 g), dichlorobis(tris-o-methoxyphenylphosphine)palladium (2.2 mg) and toluene (109 g) were added, and the mixture was heated at 100° C.

(Step 2) Into the reaction liquid, a 20 wt % tetraethylammonium hydroxide aqueous solution (30 g) was dropped, and the mixture was refluxed for 8.0 hours.

(Step 3) Thereafter, to this were added phenylboronic acid (105 mg) and dichlorobis(tris-o-methoxyphenylphosphine) palladium (7.3 mg), and the mixture was refluxed for 14.0 hours.

(Step 4) Thereafter, to this was added a sodium diethyldithiacarbamate aqueous solution, and the mixture was stirred at 40° C. for 3 hours. The reaction liquid was washed with water once, then, water was removed by performing distillation under reduced pressure, and the deposited solid was separated by filtration. The resultant solution was washed with a 10 wt % hydrochloric acid aqueous solution twice, with a 3 wt % ammonia aqueous solution twice and with water twice, then, purified by allowing it to pass through a column filled with a mixture of alumina and silica gel. The resultant solution was dropped into methanol, and the mixture was stirred, then, the resultant precipitate was isolated by filtration, and dried, thereby obtaining 4.9 g of a polymer compound EP-2. The polymer compound EP-2 had a Mn of $5.9 \times 10^4$ and a Mw of $1.3 \times 10^5$.

The polymer compound EP-2 is a copolymer constituted of constitutional units derived from respective monomers at a molar ratio shown in Table 6 described below according to the theoretical values calculated from the charged raw materials.

TABLE 6

| monomer | | CM5 | CM6 | CM7 | CM11 |
|---|---|---|---|---|---|
| EP-2 | molar ratio [mol %] | 50 | 39 | 10 | 1 |

<Synthesis Example 9> Synthesis of Polymer Compound EP-3

(Step 1) An inert gas atmosphere was prepared in a reaction vessel, then, a monomer CM8 (4.7686 g), a monomer CM3 (1.9744 g), a monomer CM6 (0.7734 g), a monomer CM9 (0.4432 g), a monomer CM10 (0.3308 g) and toluene (67 ml) were added, and the mixture was heated at 105° C.

(Step 2) To the reaction liquid was added bistriphenylphosphinepalladium dichloride (4.2 mg), then, a 20 wt % tetraethylammonium hydroxide aqueous solution (20 ml) was dropped, then, the mixture was refluxed for 3 hours.

(Step 3) Thereafter, to this were added phenylboronic acid (0.077 g), bistriphenylphosphinepalladium dichloride (4.2 mg), toluene (60 ml) and a 20 wt % tetraethylammonium hydroxide aqueous solution (20 ml), and the mixture was refluxed for 24 hours.

(Step 4) Thereafter, an organic layer was separated from an aqueous layer. To the resultant organic layer were added sodium N,N-diethyldithiocarbamate trihydrate (3.33 g) and ion exchanged water (67 ml), and the mixture was stirred at 85° C. for 2 hours. An organic layer was separated from an aqueous layer, then, the resultant organic layer was washed with ion exchanged water (78 ml) twice, with a 3 wt % acetic acid aqueous solution (78 ml) twice and with ion exchanged water (78 ml) twice in this order. An organic layer was separated from an aqueous layer, then, the resultant organic layer was dropped into methanol to cause precipitation of a solid which was then isolated by filtration, and dried, thereby obtaining a solid. The resultant solid was dissolved in toluene, and the solution was allowed to pass through a silica gel column and an alumina column through which toluene had previously passed. The resultant solution was dropped into methanol to cause precipitation of a solid which was then isolated by filtration, and dried, thereby obtaining a polymer compound EP-3 (4.95 g). The polymer compound EP-3 had a Mn of $1.4 \times 10^5$ and a Mw of $4.1 \times 10^5$.

The polymer compound EP-3 is a copolymer constituted of constitutional units derived from respective monomers at a molar ratio shown in Table 7 described below according to the theoretical values calculated from the charged raw materials.

TABLE 7

| monomer | | CM8 | CM3 | CM6 | CM9 | CM10 |
|---|---|---|---|---|---|---|
| EP-3 | molar ratio [mol %] | 50 | 30 | 10 | 5 | 5 |

<Synthesis Example 10> Synthesis of Polymer Compound EP-4

(Step 1) An inert gas atmosphere was prepared in a reaction vessel, then, a monomer CM8 (4.70 g), a monomer CM3 (2.05 g), a monomer CM6 (0.80 g), a monomer CM9 (0.34 g), a monomer CM10 (0.46 g), a monomer CM11 (0.05 g), dichlorobis(tris-o-methoxyphenylphosphine)palladium (1.6 mg) and toluene (117 g) were added, and the mixture was heated at 100° C.

(Step 2) Into the reaction liquid, a 20 wt % tetraethylammonium hydroxide aqueous solution (22 g) was dropped, and the mixture was refluxed for 6.4 hours.

(Step 3) Thereafter, to this were added phenylboronic acid (80 mg) and dichlorobis(tris-o-methoxyphenylphosphine) palladium (5.5 mg), and the mixture was refluxed for 15.0 hours.

(Step 4) Thereafter, to this was added a sodium diethyldithiacarbamate aqueous solution, and the mixture was stirred at 40° C. for 3 hours. The reaction liquid was washed with water once, then, water was removed by performing distillation under reduced pressure, and the deposited solid was separated by filtration. The resultant solution was washed with a 10 wt % hydrochloric acid aqueous solution twice, with a 3 wt % ammonia aqueous solution twice and with water twice, then, purified by allowing it to pass through a column filled with a mixture of alumina and silica gel. The resultant solution was dropped into methanol, and the mixture was stirred, then, the resultant precipitate was isolated by filtration, and dried, thereby obtaining 5.1 g of a polymer compound EP-4. The polymer compound EP-4 had a Mn of $4.7 \times 10^4$ and a Mw of $1.1 \times 10^5$.

The polymer compound EP-4 is a copolymer constituted of constitutional units derived from respective monomers at a molar ratio shown in Table 8 described below according to the theoretical values calculated from the charged raw materials.

TABLE 8

| monomer | CM8 | CM3 | CM6 | CM9 | CM10 | CM11 |
|---|---|---|---|---|---|---|
| EP-4 molar ratio [mol %] | 50 | 29 | 10 | 5 | 5 | 1 |

<Synthesis Example 11> Synthesis of Polymer Compound EP-5

(Step 1) An inert gas atmosphere was prepared in a reaction vessel, then, a monomer CM5 (0.99 q), a monomer CM6 (0.50 g), a monomer CM12 (0.16 g), a monomer CM7 (0.31 g), a monomer CM13 (0.51 g), a monomer CM11 (0.0083 g) and toluene (33 ml) were added, and the mixture was heated at 105° C.

(Step 2) Into the reaction liquid, a mixed liquid of a 40 wt % tetrabutylammonium hydroxide aqueous solution (14 g) and ion exchanged water (41 g) was dropped, then, dichlorobis(tris-o-methoxyphenylphosphine)palladium (3.6 mg) was added, then, the mixture was refluxed for 8 hours.

(Step 3) After the reaction, to this were added phenylboronic acid (98 mg) and dichlorobis(tris-o-methoxyphenylphosphine)palladium (1.8 mg), and the mixture was refluxed for 16 hours.

(Step 4) The resultant reaction mixture was cooled, then, washed with 10 wt % hydrochloric acid twice, with a 3 wt % ammonia aqueous solution twice and with water twice. The resultant solution was dropped into methanol, thereby causing precipitation. The resultant precipitate was dissolved in toluene, then, purified by passing through an alumina column and a silica gel column in this order. The resultant solution was dropped into methanol, and the mixture was stirred, thereby causing precipitation. The resultant precipitate was isolated by filtration, and dried, thereby obtaining 1.3 g of a polymer compound EP-5. The polymer compound EP-5 had a Mn of $5.21 \times 10^4$ and a Mw of $1.23 \times 10^5$.

The polymer compound EP-5 is a copolymer constituted of constitutional units derived from respective monomers at a molar ratio shown in Table 9 described below according to the theoretical values calculated from the charged raw materials.

TABLE 9

| monomer | CM5 | CM6 | CM12 | CM7 | CM13 | CM11 |
|---|---|---|---|---|---|---|
| EP-5 molar ratio [mol %] | 50 | 19.5 | 10 | 12 | 8 | 0.5 |

<Synthesis Example 12> Synthesis of Polymer Compound EP-6

(Step 1) An inert gas atmosphere was prepared in a reaction vessel, then, a monomer CH5 (0.25 q), a monomer CM6 (0.13 g), a monomer CM12 (0.040 g), a monomer CM7 (0.076 g), a monomer CM13 (0.13 g) and toluene (10 ml) were added, and the mixture was heated at 105° C.

(Step 2) To the reaction liquid were added palladium acetate (0.2 mg) and tris(2-methoxyphenyl)phosphine (1.4 mg), then, a 20 wt % tetraethylammonium hydroxide aqueous solution (2.5 ml) was added, then, the mixture was refluxed for 4.5 hours.

(Step 3) After the reaction, to this were added phenylboric acid (12.2 mg), palladium acetate (0.2 mg), tris(2-methoxyphenyl)phosphine (1.4 mg) and a 20 wt % tetraethylammonium hydroxide aqueous solution (2.5 ml), and the mixture was refluxed for 14 hours.

(Step 4) The resultant reaction mixture was cooled, then, an aqueous layer was removed. To the resultant organic layer were added sodium N,N-diethyldithiocarbamate trihydrate (0.14 g) and ion exchanged water (2.7 ml), then, the mixture was stirred at 85° C. for 2 hours. The resultant solution was separated into an organic layer and an aqueous layer, then, the resultant organic layer was washed with 3.6 wt % hydrochloric acid twice, with 2.5 wt % ammonia water twice and with ion exchanged water four times. The resultant solution was dropped into methanol, thereby causing precipitation. The resultant precipitate was dissolved in toluene, then, purified by passing through an alumina column and a silica gel column in this order. The resultant solution was dropped into methanol, and the mixture was stirred, thereby causing precipitation. The resultant precipitate was isolated by filtration, and dried, thereby obtaining 0.35 g of a polymer compound EP-6. The polymer compound EP-6 had a Mn of $6.60 \times 10^4$ and a Mw of $2.01 \times 10^5$.

The polymer compound EP-6 is a copolymer constituted of constitutional units derived from respective monomers at a molar ratio shown in Table 10 described below according to the theoretical values calculated from the charged raw materials.

TABLE 10

| monomer | CM5 | CM6 | CM12 | CM7 | CM13 |
|---|---|---|---|---|---|
| EP-6 molar ratio [mol %] | 50 | 20 | 10 | 12 | 8 |

<Example D1> Fabrication and Evaluation of Light Emitting Device D1

(Formation of Anode and Hole Injection Layer)

A glass substrate was attached with an ITO film with a thickness of 45 nm by a sputtering method, thereby forming an anode. On the anode, a polythiophene•sulfonic acid type hole injection agent AQ-1200 (manufactured by Plextronics) was spin-coated to form a film with a thickness of 50 nm, and the film was heated on a hot plate at 170° C. for 15 minutes under an air atmosphere, thereby forming a hole injection layer.

(Formation of Hole Transporting Layer)

A polymer compound HP-1 was dissolved at a concentration of 0.6 wt % in xylene. The resultant xylene solution was spin-coated on the hole injection layer to form a film with a thickness of 20 nm, and the film was heated on a hot plate at 180° C. for 60 minutes under a nitrogen gas atmosphere, thereby forming a hole transporting layer.

(Formation of Light Emitting Layer)

Next, a xylene solution (2.2 wt %) of a polymer compound EP-2 and a xylene solution (2.2 wt %) of a compound G1 were prepared. Then, the xylene solutions were mixed so that the solid content ratio of the polymer compound EP-2 to the compound G1 was 60:40 (by weight). This xylene solution was spin-coated on the hole transporting layer to form a film with a thickness of 80 nm, and this was heated on a hot plate at 150° C. for 10 minutes in a nitrogen gas atmosphere, thereby forming a light emitting layer.

(Formation of Cathode)

The substrate carrying the light emitting layer formed thereon was placed in a vapor deposition machine, and the pressure was reduced to $1.0 \times 10^{-4}$ Pa or less, then, as a cathode, sodium fluoride was vapor-deposited with a thickness of about 7 nm on the light emitting layer, then, aluminum was vapor-deposited with a thickness of about 100 nm on the sodium fluoride layer. After vapor deposition, encapsulating was performed by using a glass substrate, thereby fabricating a light emitting device D1.

(Evaluation of Light Emitting Device)

Voltage was applied to the light emitting device D1, to observe green EL emission. The electric current value was set so that the initial luminance was 24000 cd/m$^2$, then, the device was driven at constant current, and the required time until when the light emission luminance reached 70% of the initial luminance (hereinafter, referred to as LT70) was measured, to find a time of 65 hours.

<Example D4> Fabrication and Evaluation of Light Emitting Device D4

A light emitting device D4 was fabricated in the same manner as in Example D1, excepting that a xylene solution (1.8 wt %) of a polymer compound EP-5 was used instead of the xylene solution obtained by mixing a xylene solution (2.2 wt %) of a polymer compound EP-2 and a xylene solution (2.2 wt %) of a compound G1 (solid content ratio of polymer compound EP-2 to compound G1 is 60:40 (by weight)) in Example D1.

Voltage was applied to the light emitting device D4, to observe green EL emission. The electric current value was set so that the initial luminance was 24000 cd/m$^2$, then, the device was driven at constant current, and LT70 was measured, to find a time of 90 hours.

<Example D5> Fabrication and Evaluation of Light Emitting Device D5

A light emitting device D5 was fabricated in the same manner as in Example D1, excepting that a xylene solution obtained by mixing a xylene solution (1.8 wt %) of a polymer compound EP-6 and a xylene solution (1.8 wt %) of a polymer compound EP-2 (solid content ratio of polymer compound EP-6 to polymer compound EP-2 is 80:20 (by weight)) was used instead of the xylene solution obtained by mixing a xylene solution (2.2 wt %) of a polymer compound EP-2 and a xylene solution (2.2 wt %) of a compound G1 (solid content ratio of polymer compound EP-2 to compound G1 is 60:40 (by weight)) in Example D1.

Voltage was applied to the light emitting device D5, to observe green EL emission. The electric current value was set so that the initial luminance was 24000 cd/m$^2$, then, the device was driven at constant current, and LT70 was measured, to find a time of 52 hours.

<Comparative Example CD1> Fabrication and Evaluation of Light Emitting Device CD1

A light emitting device CD1 was fabricated in the same manner as in Example D1, excepting that a polymer compound EP-1 was used instead of the polymer compound EP-2 in Example D1.

Voltage was applied to the light emitting device CD1, to observe green EL emission. The electric current value was set so that the initial luminance was 24000 cd/m$^2$, then, the device was driven at constant current, and LT70 was measured, to find a time of 32 hours.

<Example D2> Fabrication and Evaluation of Light Emitting Device D2

A light emitting device D2 was fabricated in the same manner as in Example D1, excepting that a xylene solution obtained by mixing a xylene solution (1.8 wt %) of a polymer compound EP-4 and a xylene solution (1.8 wt %) of a compound R2 (solid content ratio of polymer compound EP-4 to compound R2 is 92.5:7.5 (by weight)) was used instead of the xylene solution obtained by mixing a xylene solution (2.2 wt %) of a polymer compound EP-2 and a xylene solution (2.2 wt %) of a compound G1 (solid content ratio of polymer compound EP-2 to compound G1 is 60:40 (by weight)) in Example D1.

Voltage was applied to the light emitting device D2, to observe red EL emission. The electric current value was set so that the initial luminance was 24000 cd/m$^2$, then, the device was driven at constant current, and LT70 was measured, to find a time of 109 hours.

<Comparative Example CD2> Fabrication and Evaluation of Light Emitting Device CD2

A light emitting device CD2 was fabricated in the same manner as in Example D2, excepting that a polymer compound EP-3 was used instead of the polymer compound EP-4 in Example D2.

Voltage was applied to the light emitting device CD2, to observe red EL emission. The electric current value was set so that the initial luminance was 24000 cd/m$^2$, then, the device was driven at constant current, and LT70 was measured, to find a time of 89 hours.

<Example D3> Fabrication and Evaluation of Light Emitting Device D3

A light emitting device D3 was fabricated in the same manner as in Example D2, excepting that a compound R1 was used instead of the compound R2 in Example D2.

Voltage was applied to the light emitting device D3, to observe red EL emission. The electric current value was set so that the initial luminance was 12000 cd/m², then, the device was driven at constant current, and LT70 was measured, to find a time of 107 hours.

<Comparative Example CD3> Fabrication and Evaluation of Light Emitting Device CD3

A light emitting device CD3 was fabricated in the same manner as in Example D3, excepting that a polymer compound EP-3 was used instead of the polymer compound EP-4 in Example D3.

Voltage was applied to the light emitting device CD2, to observe red EL emission. The electric current value was set so that the initial luminance was 12000 cd/m², then, the device was driven at constant current, and LT70 was measured, to find a time of 89 hours.

INDUSTRIAL APPLICABILITY

The composition and the polymer compound of the present invention are useful for production of a light emitting device excellent in luminance life.

The invention claimed is:

1. A light emitting device produced from a composition comprising a polymer compound comprising a constitutional unit represented by the following formula (Y),

   (Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent, and a constitutional unit represented by the following formula (Ie),

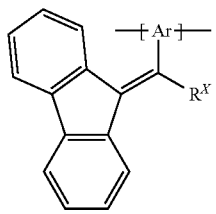   (Ie)

wherein $R^{X'}$ represents a hydrogen atom, and Ar represents an aromatic hydrocarbon group or a heterocyclic group and these groups each optionally have a substituent, and a phosphorescent compound.

2. The light emitting device according to claim 1, wherein the constitutional unit represented by the formula (Y) is a constitutional unit represented by the following formula (Y-1), (Y-2), (Y-3) or (Y-4):

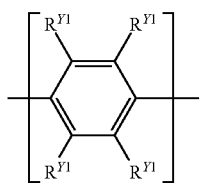   (Y-1)

wherein $R^{Y1}$ represents a hydrogen atom, an alkyl group, a cycloalkyl group, an alkoxyl group, a cycloalkoxy group, an aryl group or a monovalent heterocyclic group and these groups each optionally have a substituent, and the plurality of $R^{Y1}$ may be the same or different, and groups $R^{Y1}$ may be combined together to form a ring together with the carbon atoms to which they are attached:

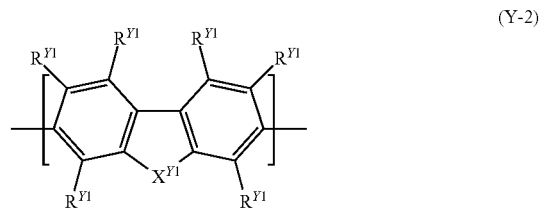   (Y-2)

wherein
$R^{Y1}$ represents the same meaning as described above, and
$X^{Y1}$ represents a group represented by $-C(R^{Y2})_2-$, $-C(R^{Y2})=C(R^{Y2})-$ or $-C(R^{Y2})_2-C(R^{Y2})_2-$, $R^{Y2}$ represents a hydrogen atom, an alkyl group, a cycloalkyl group, an alkoxyl group, a cycloalkoxy group, an aryl group or a monovalent heterocyclic group and these groups each optionally have a substituent, and the plurality of $R^{Y2}$ may be the same or different and $R^{Y2}$ s may be combined together to form a ring together with the carbon atoms to which they are attached:

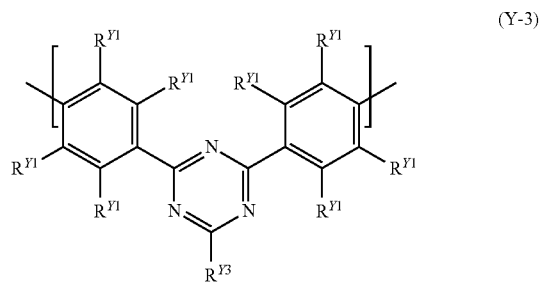   (Y-3)

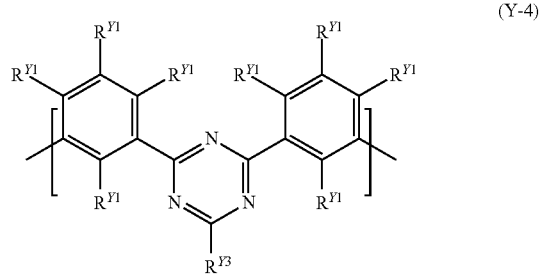   (Y-4)

wherein
$R^{Y1}$ represents the same meaning as described above, and
$R^{Y3}$ represents a hydrogen atom, an alkyl group, a cycloalkyl group, an alkoxy group, a cycloalkoxy group, an aryl group or a monovalent heterocyclic group and these groups each optionally have a substituent.

3. The light emitting device according to claim 1, wherein the phosphorescent compound is a phosphorescent compound represented by the following formula (1):

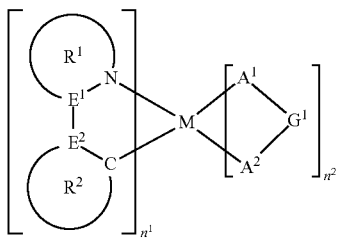

(1)

wherein

M represents a ruthenium atom, a rhodium atom, a palladium atom, an iridium atom or a platinum atom, $n^1$ represents an integer of 1 or more, $n^2$ represents an integer of 0 or more, and $n^1+n^2$ is 2 or 3, and $n^1+n^2$ is 3 when M is a ruthenium atom, a rhodium atom or an iridium atom, while $n^1+n^2$ is 2 when M is a palladium atom or a platinum atom, $E^1$ and $E^2$ each independently represent a carbon atom or a nitrogen atom, and at least one of $E^1$ and $E^2$ is a carbon atom, the ring $R^1$ represents a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^1$ are present, they may be the same or different, and $E^1$ is a carbon atom when the ring $R^1$ is a 6-membered aromatic heterocyclic ring, the ring $R^2$ represents a 5-membered or 6-membered aromatic hydrocarbon ring or a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^2$ are present, they may be the same or different, and $E^2$ is a carbon atom when the ring $R^2$ is a 6-membered aromatic heterocyclic ring, and $A^1$-$G^1$-$A^2$ represents an anionic bidentate ligand, $A^1$ and $A^2$ each independently represent a carbon atom, an oxygen atom or a nitrogen atom and these atoms may be an atom constituting a ring, $G^1$ represents a single bond or an atomic group constituting the bidentate ligand together with $A^1$ and $A^2$, and when a plurality of $A^1$-$G^1$-$A^2$ are present, they may be the same or different.

4. The light emitting device according to claim 1, wherein the phosphorescent compound is a polymer compound comprising a phosphorescent constitutional unit having a group obtained by removing one or more hydrogen atoms bonding directly to carbon atoms or hetero atoms constituting a phosphorescent compound represented by the following formula (1):

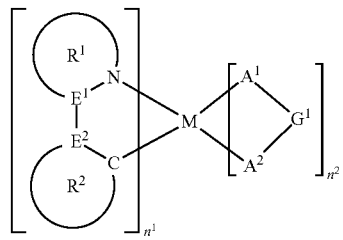

(1)

wherein

M represents a ruthenium atom, a rhodium atom, a palladium atom, an iridium atom or a platinum atom, $n^1$ represents an integer of 1 or more, $n^2$ represents an integer of 0 or more, and $n^1+n^2$ is 2 or 3, and $n^1+n^2$ is 3 when M is a ruthenium atom, a rhodium atom or an iridium atom, while $n^1+n^2$ is 2 when M is a palladium atom or a platinum atom, $E^1$ and $E^2$ each independently represent a carbon atom or a nitrogen atom, and at least one of $E^1$ and $E^2$ is a carbon atom, the ring $R^1$ represents a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^1$ are present, they may be the same or different, and $E^1$ is a carbon atom when the ring $R^1$ is a 6-membered aromatic heterocyclic ring, the ring $R^2$ represents a 5-membered or 6-membered aromatic hydrocarbon ring or a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^2$ are present, they may be the same or different, and $E^2$ is a carbon atom when the ring $R^2$ is a 6-membered aromatic heterocyclic ring, and $A^1$-$G^1$-$A^2$ represents an anionic bidentate ligand, $A^1$ and $A^2$ each independently represent a carbon atom, an oxygen atom or a nitrogen atom and these atoms may be an atom constituting a ring, $G^1$ represents a single bond or an atomic group constituting the bidentate ligand together with $A^1$ and $A^2$, and when a plurality of $A^1$-$G^1$-$A^2$ are present, they may be the same or different.

5. A light emitting device produced from a polymer compound comprising a constitutional unit represented by the following formula (Y),

(Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent, at least one constitutional unit selected from the group consisting of a constitutional unit represented by the following formula (Ia) and a constitutional unit represented by the following formula (Ic)

(Ia)

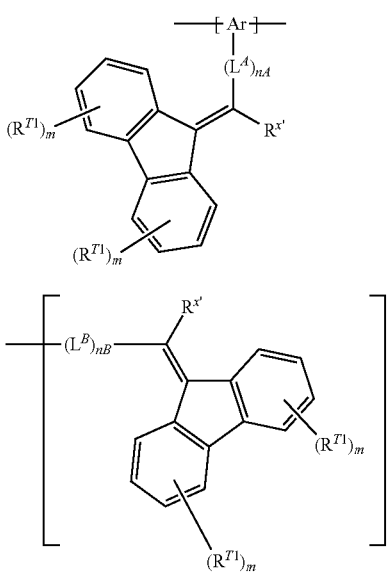

(Ic)

wherein
m represents an integer of 0 to 4, and the plurality of m may be the same or different,
$R^{T1}$ represents an alkyl group, a cycloalkyl group, an alkoxy group, a cycloalkoxy group, an aryl group or a monovalent heterocyclic group and these groups each optionally have a substituent, and when a plurality of $R^{T1}$ are present, they may be the same or different,
$R^{x'}$ represents a hydrogen atom,
Ar represents an aromatic hydrocarbon group or a heterocyclic group and these groups each optionally have a substituent,
nA represents an integer of 0 to 3,
$L^A$ represents an alkylene group, a cycloalkylene group, an arylene group or a divalent heterocyclic group and these groups each optionally have a substituent, and when a plurality of $L^A$ are present, they may be the same or different,
nB represents an integer of 0 to 3, and
$L^B$ represents an alkylene group, a cycloalkylene group, an arylene group or a divalent heterocyclic group and these groups each optionally have a substituent, and when a plurality of $L^A$ are present, they may be the same or different; and
a phosphorescent constitutional unit having a group obtained by removing one or more hydrogen atoms bonding directly to carbon atoms or hetero atoms constituting a phosphorescent compound represented by the following formula (1), (1)

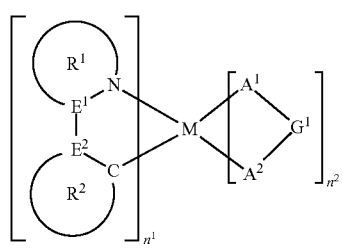

wherein
M represents a ruthenium atom, a rhodium atom, a palladium atom, an iridium atom or a platinum atom,
$n^1$ represents an integer of 1 or more, $n^2$ represents an integer of 0 or more, and $n^1+n^2$ is 2 or 3, and $n^1+n^2$ is 3 when M is a ruthenium atom, a rhodium atom or an iridium atom, while $n^1+n^2$ is 2 when M is a palladium atom or a platinum atom,
$E^1$ and $E^2$ each independently represent a carbon atom or a nitrogen atom, and at least one of $E^1$ and $E^2$ is a carbon atom,
the ring $R^1$ represents a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^1$ are present, they may be the same or different, and $E^1$ is a carbon atom when the ring $R^1$ is a 6-membered aromatic heterocyclic ring,
the ring $R^2$ represents a 5-membered or 6-membered aromatic hydrocarbon ring or a 5-membered or 6-membered aromatic heterocyclic ring and these rings optionally have a substituent, and when a plurality of the substituents are present, they may be the same or different and may be combined together to form a ring together with the atoms to which they are attached, and when a plurality of the rings $R^2$ are present, they may be the same or different, and $E^2$ is a carbon atom when the ring $R^2$ is a 6-membered aromatic heterocyclic ring, and
$A^1$-$G^1$-$A^2$ represents an anionic bidentate ligand, $A^1$ and $A^2$ each independently represent a carbon atom, an oxygen atom or a nitrogen atom and these atoms may be an atom constituting a ring, $G^1$ represents a single bond or an atomic group constituting the bidentate ligand together with $A^1$ and $A^2$, and when a plurality of $A^1$-$G^1$-$A^2$ are present, they may be the same or different.

6. The light emitting device according to claim 1, further comprising at least one material selected from the group consisting of a hole transporting material, a hole injection material, an electron transporting material, an electron injection material, a light emitting material, an antioxidant and a solvent.

7. The light emitting device according to claim 5, further comprising at least one material selected from the group consisting of a hole transporting material, a hole injection material, an electron transporting material, an electron injection material, a light emitting material, an antioxidant and a solvent.

8. The light emitting device according to claim 3, wherein at least one ring selected from the group consisting of the ring $R^1$ and the ring $R^2$ has a dendron represented by the formula (D-A) or (D-B):

(D-A)

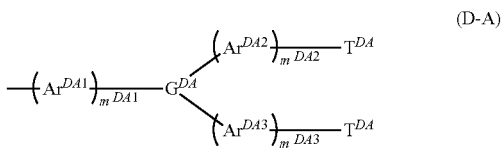

wherein
   $m^{DA1}$, $m^{DA2}$ and $m^{DA3}$ each independently represent an integer of 0 or more,
   $G^{DA}$ represents a nitrogen atom, an aromatic hydrocarbon group or a heterocyclic group and these groups each optionally have a substituent,
   $Ar^{DA1}$, $Ar^{DA2}$ and $Ar^{DA3}$ each independently represent an arylene group or a divalent heterocyclic group and these groups each optionally have a substituent, and when a plurality of $Ar^{DA1}$, $Ar^{DA2}$ and $Ar^{DA3}$ are present, they may be the same or different at each occurrence, and
   $T^{DA}$ represents an aryl group or a monovalent heterocyclic group and these groups each optionally have a substituent, and the plurality of $T^{DA}$ may be the same or different,

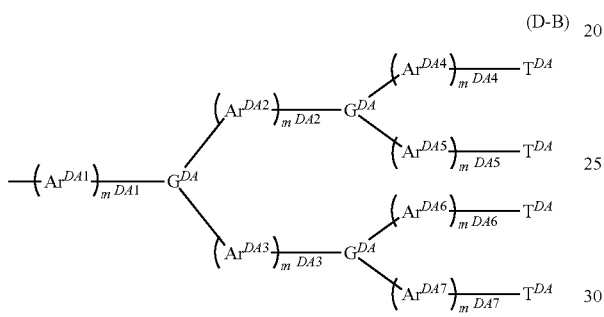

(D-B)

wherein
   $m^{DA1}$, $m^{DA2}$, $m^{DA3}$, $m^{DA4}$, $m^{DA5}$, $m^{DA6}$ and $m^{DA7}$ each independently represent an integer of 0 or more,
   $G^{DA}$ represents a nitrogen atom, an aromatic hydrocarbon group or a heterocyclic group and these groups each optionally have a substituent, and the plurality of $G^{DA}$ may be the same or different,
   $Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group and these groups each optionally have a substituent, and when a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence, and
   $T^{DA}$ represents an aryl group or a monovalent heterocyclic group and these groups each optionally have a substituent, and the plurality of $T^{DA}$ may be the same or different.

9. The light emitting device according to claim 4, wherein at least one ring selected from the group consisting of the ring $R^1$ and the ring $R^2$ has a dendron represented by the formula (D-A) or (D-B):

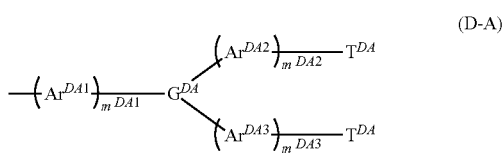

(D-A)

wherein
   $m^{DA1}$, $m^{DA2}$ and $m^{DA3}$ each independently represent an integer of 0 or more,
   $G^{DA}$ represents a nitrogen atom, an aromatic hydrocarbon group or a heterocyclic group and these groups each optionally have a substituent,
   $Ar^{DA1}$, $Ar^{DA2}$ and $Ar^{DA3}$ each independently represent an arylene group or a divalent heterocyclic group and these groups each optionally have a substituent, and when a plurality of $Ar^{DA1}$, $Ar^{DA2}$ and $Ar^{DA3}$ are present, they may be the same or different at each occurrence, and
   $T^{DA}$ represents an aryl group or a monovalent heterocyclic group and these groups each optionally have a substituent, and the plurality of $T^{DA}$ may be the same or different,

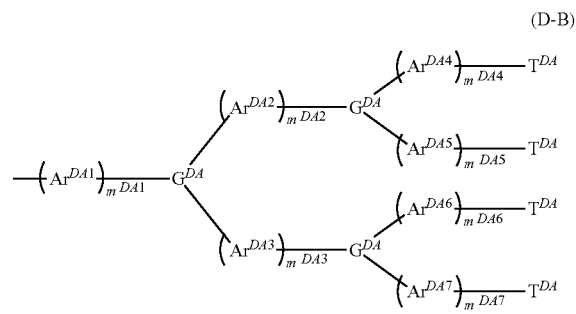

(D-B)

wherein
   $m^{DA1}$, $m^{DA2}$, $m^{DA3}$, $m^{DA4}$, $m^{DA5}$, $m^{DA6}$ and $m^{DA7}$ each independently represent an integer of 0 or more,
   $G^{DA}$ represents a nitrogen atom, an aromatic hydrocarbon group or a heterocyclic group and these groups each optionally have a substituent, and the plurality of $G^{DA}$ may be the same or different,
   $Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group and these groups each optionally have a substituent, and when a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence, and
   $T^{DA}$ represents an aryl group or a monovalent heterocyclic group and these groups each optionally have a substituent, and the plurality of $T^{DA}$ may be the same or different.

10. The light emitting device according to claim 5, wherein at least one ring selected from the group consisting of the ring $R^1$ and the ring $R^2$ has a dendron represented by the formula (D-A) or (D-B):

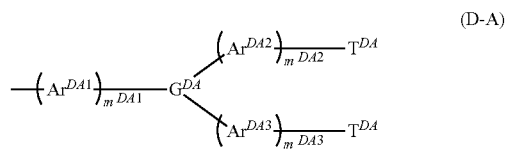

(D-A)

wherein
   $m^{DA1}$, $m^{DA2}$ and $m^{DA3}$ each independently represent an integer of 0 or more,
   $G^{DA}$ represents a nitrogen atom, an aromatic hydrocarbon group or a heterocyclic group and these groups each optionally have a substituent,
   $Ar^{DA1}$, $Ar^{DA2}$ and $Ar^{DA3}$ each independently represent an arylene group or a divalent heterocyclic group and these groups each optionally have a substituent, and when a plurality of $Ar^{DA1}$, $Ar^{DA2}$ and $Ar^{DA3}$ are present, they may be the same or different at each occurrence, and $T^{DA}$ represents an aryl group or a monovalent heterocyclic group and these groups each optionally have a substituent, and the plurality of $T^{DA}$ may be the same or different,

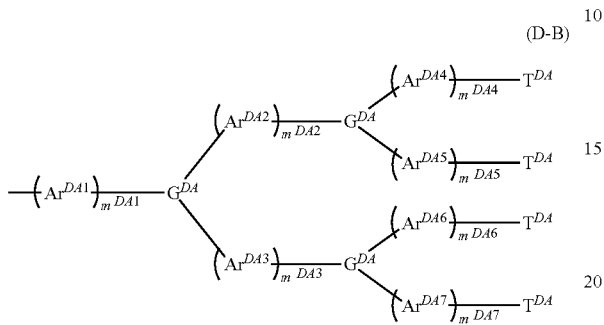

(D-B)

wherein $m^{DA1}$, $m^{DA2}$, $m^{DA3}$, $m^{DA4}$, $m^{DA5}$, $m^{DA6}$ and $m^{DA7}$ each independently represent an integer of 0 or more, $G^{DA}$ represents a nitrogen atom, an aromatic hydrocarbon group or a heterocyclic group and these groups each optionally have a substituent, and the plurality of $G^{DA}$ may be the same or different, $Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group and these groups each optionally have a substituent, and when a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence, and $T^{DA}$ represents an aryl group or a monovalent heterocyclic group and these groups each optionally have a substituent, and the plurality of $T^{DA}$ may be the same or different.

* * * * *